(12) United States Patent
Suk et al.

(10) Patent No.: US 10,403,754 B2
(45) Date of Patent: Sep. 3, 2019

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Sung-Dae Suk, Seoul (KR); Sunhom Steve Paak, Seoul (KR); Yeon-Ho Park, Seoul (KR); Dong-Ho Cha, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/970,450

(22) Filed: May 3, 2018

(65) Prior Publication Data

US 2018/0254341 A1 Sep. 6, 2018

Related U.S. Application Data

(63) Continuation of application No. 15/172,851, filed on Jun. 3, 2016, now Pat. No. 9,991,387.

(30) Foreign Application Priority Data

Jun. 10, 2015 (KR) .................. 10-2015-0081701

(51) Int. Cl.
*H01L 29/78* (2006.01)
*H01L 29/786* (2006.01)
*H01L 29/06* (2006.01)
*H01L 29/423* (2006.01)
*H01L 29/417* (2006.01)
*H01L 29/66* (2006.01)

(52) U.S. Cl.
CPC ........ *H01L 29/785* (2013.01); *H01L 29/0673* (2013.01); *H01L 29/41733* (2013.01); *H01L 29/41775* (2013.01); *H01L 29/4236* (2013.01); *H01L 29/42392* (2013.01); *H01L 29/66545* (2013.01); *H01L 29/66795* (2013.01); *H01L 29/78603* (2013.01); *H01L 29/78696* (2013.01); *H01L 29/7856* (2013.01); *H01L 2029/7858* (2013.01)

(58) Field of Classification Search
None
See application file for complete search history.

(56) References Cited

U.S. PATENT DOCUMENTS

| 8,124,961 | B2 | 2/2012 | Suk et al. |
| 8,129,777 | B2 | 3/2012 | Kim et al. |
| 8,900,959 | B2 | 12/2014 | Chang et al. |
| 9,064,943 | B1 | 6/2015 | Anderson et al. |
| 2006/0226492 | A1 | 10/2006 | Nguyen et al. |
| 2012/0007051 | A1 | 1/2012 | Bangsaruntip et al. |

(Continued)

FOREIGN PATENT DOCUMENTS

| JP | 2011-029503 | 2/2011 |
| KR | 10-2007-0068736 | 7/2007 |

*Primary Examiner* — Whitney Moore
(74) *Attorney, Agent, or Firm* — Myers Bigel, P.A.

(57) ABSTRACT

Semiconductor devices are provided. A semiconductor device includes a channel. The semiconductor device includes a gate structure having first and second portions. The channel is between the first and second portions of the gate structure. A contact structure is adjacent a portion of a side surface of the channel. Related methods of forming semiconductor devices are also provided.

20 Claims, 42 Drawing Sheets

(56) References Cited

U.S. PATENT DOCUMENTS

| | | |
|---|---|---|
| 2012/0223288 A1* | 9/2012 | Kim .................. B82Y 10/00 257/9 |
| 2014/0001441 A1 | 1/2014 | Kim et al. |
| 2014/0151639 A1 | 6/2014 | Chang et al. |
| 2014/0175374 A1 | 6/2014 | Chang et al. |
| 2014/0197377 A1 | 7/2014 | Kim et al. |
| 2014/0203327 A1 | 7/2014 | Pillarisetty et al. |
| 2014/0225065 A1 | 8/2014 | Rachmady et al. |
| 2014/0225169 A1 | 8/2014 | Suk et al. |
| 2015/0008530 A1 | 1/2015 | Park et al. |

* cited by examiner

SEMICONDUCTOR DEVICES AND METHODS OF MANUFACTURING THE SAME

CROSS-REFERENCE TO RELATED APPLICATION

The present application is a continuation application of and claims priority from U.S. patent application Ser. No. 15/172,851, filed on Jun. 3, 2016, which claims priority under 35 U.S.C § 119 to Korean Patent Application No. 10-2015-0081701, filed on Jun. 10, 2015 in the Korean Intellectual Property Office, and the entire content of each of the above applications is incorporated by reference herein.

BACKGROUND

The present disclosure relates to semiconductor devices. As recent memory devices have been highly integrated and downsized, the size of active regions has been also reduced in a semiconductor substrate. Thus, the gate resistance and the threshold voltage may increase due to the decrease of the gate width and the channel length in cell transistors. Particularly, the decrease of the channel length in a metal oxide semiconductor field effect transistor (MOSFET) may cause the deterioration of gate channel characteristics, which is a phenomenon known as a short channel effect.

In addition, the size reduction of the active region may increase proximity between the gate electrode and the source junction and between the gate electrode and the drain junction, thus generating an excessive electric field between the gate electrode and the source/drain junctions that may cause a gate-induced drain leakage (GIDL). Further, the gate current may pass toward the source/drain junctions, which is a phenomenon known as current leakage.

Accordingly, the size reduction of semiconductor devices has brought about various technologies for addressing the short channel effect and current leakage. For example, it has been suggested to provide a fin gate structure in which the gate electrode protrudes into a fin shape and to expand the channel, or to provide a gate-all-around (GAA) structure in which the channel is enclosed by the gate electrode, or to provide a multichannel structure in which a single gate electrode contacts a plurality of the channels, or to provide various vertical transistors including one of the above fin gate structures, GAA structures, or multichannel structures. Moreover, a nano wire channel transistor has been suggested for high performance with a low power. In a nano wire channel transistor, the channel of the GAA structure is replaced with a nano wire channel.

However, the size reduction of semiconductor devices may increase parasitic capacitance and electrical resistance as well as the short channel effect and current leakage, so that a vertical transistor may benefit from decreasing the parasitic capacitance and the electrical resistance for a stable operation. Particularly, when the line width of the gate electrode is decreased to a few/several nanometers, the width of the gate spacer also decreases and as a result, the parasitic capacitance may become very high between the gate electrode and the adjacent contact. In addition, the width reduction of the gate electrode and the contact may increase the electrical resistance of the gate electrode and the contact.

SUMMARY

Various example embodiments of present inventive concepts may provide semiconductor devices in which the gate electrode is positioned in an insulation layer under an active fin and has a beneficially/sufficiently low capacitance between the gate electrode and the contact. Moreover, some example embodiments of present inventive concepts provide methods of manufacturing the semiconductor devices.

According to some embodiments of present inventive concepts, a semiconductor device may include a semiconductor substrate including a base body and a body insulator on the base body. The body insulator may extend in a first direction and may include a channel trench that extends in a second direction. The semiconductor device may include a semiconductor region on the body insulator around the channel trench. The semiconductor device may include a channel connected with the semiconductor region across the channel trench in the first direction. The semiconductor device may include a gate structure enclosing the channel and filling the channel trench along the second direction. The gate structure may include a first portion, including a first thickness, on the channel and a second portion, including a second thickness thicker than the first thickness, that fills the channel trench.

In some embodiments, the semiconductor substrate may be a silicon-on-insulator (SOI) substrate that includes the base body, the body insulator, and a semiconductor layer on the body insulator such that the channel trench extends between the semiconductor layer and the base body. Moreover, the channel may include a single nanowire contacting the semiconductor region across the channel trench in the first direction such that end portions of the channel are on the body insulator at respective sides of the channel trench.

According to some embodiments, the semiconductor device may include a gate spacer between the first portion of the gate structure and the semiconductor region and extending upward from one of the end portions of the channel. The semiconductor device may include an insulating region on the gate structure such that an upper surface of the insulating region is coplanar with an upper surface of the gate spacer. Moreover, the semiconductor device may include a contact structure contacting the semiconductor region adjacent the gate spacer.

In some embodiments, an upper surface of the first portion of the gate structure may be lower than the upper surface of the gate spacer. Moreover, a lower surface of contact structure may be lower than a lower surface of the first portion of the gate structure and higher than an upper surface of the second portion of the gate structure.

According to some embodiments, the semiconductor device may include an insulation interlayer on the semiconductor region such that an upper surface of the contact structure, the upper surface of the gate spacer, and the upper surface of the insulating region are coplanar with an upper surface of the insulation interlayer.

In some embodiments, the contact structure may include a lower contact region including a first width in the semiconductor region. Moreover, the contact structure may include an upper contact region connected to the lower contact region in one body and including a second width that is wider than the first width such that the upper contact region extends to contact the gate spacer.

According to some embodiments, the gate structure may include a third portion that is connected to the second portion of the gate structure and extends in the first direction, so that a third width of the third portion of the gate structure is wider than a fourth width of the second portion of the gate structure.

In some embodiments, the channel may include a plurality of unit channels vertically spaced apart by a same gap distance and contacting the semiconductor region in the first direction such that opposite end portions of a lowermost unit channel are on the body insulator, the second portion of the gate structure is between the lowermost unit channel and the base body, and the first portion of the gate structure is on an uppermost unit channel.

According to some embodiments, the semiconductor device may include a gate spacer between the first portion of the gate structure and the semiconductor region and extending upward from an end portion of the uppermost unit channel. The semiconductor device may include a channel spacer between a pair of neighboring unit channels and between the gate structure and the semiconductor region. The semiconductor device may include an insulating region on the gate structure such that an upper surface of the insulating region is coplanar with an upper surface of the gate spacer. Moreover, the semiconductor device may include a contact structure that contacts the semiconductor region adjacent the gate spacer.

In some embodiments, the channel spacer may have a same width as the gate spacer such that the gate spacer vertically overlaps the channel spacer and a side surface of the channel spacer is vertically aligned with a side surface of the gate spacer.

According to some embodiments, the contact structure may include a first contact region including a first width in the semiconductor region. The contact structure may include a second contact region connected to the first contact region in one body and including a second width that is wider than the first width such that the second contact region extends to contact the gate spacer. Moreover, the gate structure may include a third portion between the second portion and the base body. The third portion of the gate structure may extend in the first direction such that a third width of the third portion of the gate structure is wider than a fourth width of the second portion of the gate structure.

A method of manufacturing a semiconductor device, according to some embodiments, may include forming a dummy gate line on a fin-shaped active region that protrudes from a body insulator of a semiconductor substrate. The method may include forming a semiconductor region on the fin-shaped active region adjacent the dummy gate line such that the dummy gate line is separated from the semiconductor region by a gate spacer and such that source and drain regions are on opposite sides of the dummy gate line, respectively. The method may include removing the dummy gate line to expose the fin-shaped active region and to form a gate trench and a channel that contacts the semiconductor region through the gate trench. The method may include forming a channel trench under the channel by partially removing the body insulator in the gate trench such that the channel trench is connected with the gate trench and a bottom of the channel trench is spaced apart from the channel. The method may include forming a preliminary gate structure that fills the channel trench and the gate trench and encloses the channel. Moreover, the method may include forming a gate structure including an upper surface lower than an upper surface of the gate spacer. The gate structure may include a first portion in the channel trench and including a first thickness and a second portion overlapping the channel and including a second thickness that is thinner than the first thickness of the first portion of the gate structure.

In some embodiments, the fin-shaped active region may include a semiconductor material, and forming the semiconductor region may include epitaxially growing single crystalline silicon from the fin-shaped active region. Moreover, forming the channel may include forming an insulation interlayer pattern on the semiconductor region such that the gate spacer and the dummy gate line are exposed through the insulation interlayer pattern. Forming the channel may include removing the dummy gate line from the substrate by an etching process using the insulation interlayer pattern and the gate spacer as an etching mask, thereby forming the gate trench through which the fin-shaped active region is exposed. Forming the channel may include forming the fin-shaped active region in the gate trench into the channel connected to the semiconductor region.

According to some embodiments, forming the preliminary gate structure may include planarizing a gate insulation layer and a gate conductive layer, to form a gate insulation pattern on a surface of the channel and on a side surface of the gate spacer in the gate trench, and to provide a preliminary gate conductive pattern that fills the channel trench and the gate trench. Moreover, forming the gate structure may include removing an upper portion of the preliminary gate conductive pattern until the preliminary gate conductive pattern remains on the channel to a thickness smaller than a depth of the channel trench, so that the second thickness is thinner than the first thickness and an upper portion of the gate trench is formed into a recess.

In some embodiments, the method may include forming an insulating region in the recess such that an upper surface of the insulating region is coplanar with an upper surface of the insulation interlayer pattern. Moreover, the method may include forming a contact structure penetrating through the insulation interlayer pattern and contacting the semiconductor region.

According to some embodiments, forming the contact structure may include forming a lower contact region including a first width in the semiconductor region. Moreover, forming the contact structure may include forming an upper contact region connected to the lower contact region in one body and including a second width that is wider than the first width such that the upper contact region extends to contact the gate spacer.

A semiconductor device, according to some embodiments, may include a substrate including a semiconductor base and an insulator on the semiconductor base. The semiconductor device may include a source/drain region on the substrate. The semiconductor device may include a semiconductor channel adjacent the source/drain region. The semiconductor device may include a gate structure including a first portion on the channel and a second portion in the insulator of the substrate, such that the channel is between the first and second portions of the gate structure. Moreover, the semiconductor device may include a contact structure in the source/drain region. The contact structure may have an end portion adjacent a side surface of the channel.

In some embodiments, the source/drain region may be a source region, and the semiconductor device may include a drain region on the substrate. Moreover, the channel and the first portion of the gate structure may be between the source region and the drain region.

According to some embodiments, a first thickness of the first portion of the gate structure may be thinner than a second thickness of the second portion of the gate structure. The semiconductor device may include an insulating region on the first portion of the gate structure. Moreover, a third thickness of the insulating region may be thicker than the first thickness of the first portion of the gate structure.

In some embodiments, the substrate may be a Silicon-on-Insulator (SOI) substrate, and the semiconductor channel may be provided by a fin-shaped semiconductor layer that protrudes from the insulator of the SOI substrate. Moreover, the semiconductor device may include a gate spacer including an uppermost surface that is coplanar with an uppermost surface of the insulating region.

A semiconductor device, according to some embodiments, may include a fin-shaped semiconductor layer providing a channel of the semiconductor device. The semiconductor device may include a gate structure including a first portion including a first thickness above the channel and a second portion including a second thickness below the channel and thicker than the first thickness. The semiconductor device may include an insulating region on the first portion of the gate structure. The insulating region may include a third thickness thicker than the first thickness. Moreover, the semiconductor device may include a contact structure that extends adjacent a portion of a side surface of the channel.

In some embodiments, the second portion of the gate structure may include different first and second widths. One of the first and second widths of the second portion of the gate structure may be wider than a third width of the first portion of the gate structure. The semiconductor device may include a source/drain region that contacts the channel. Moreover, a fourth width of the contact structure may be outside of the source/drain region and may be wider than a fifth width of the contact structure that is in the source/drain region.

According to some embodiments, the channel may be a gate-all-around (GAA) channel or a nanowire channel. Moreover, the semiconductor device may include a gate spacer including an uppermost surface that is coplanar with an uppermost surface of the insulating region.

Therefore, according to various embodiments, the overlap area of the contact structure and the gate structure may decrease while increasing the overlap area of the contact structure and the supplementary insulating member, thus the overlap area between the contact structure and the gate structure may be limited to being between the contact structure and the covering portion, and parasitic capacitance may be sufficiently reduced/minimized between the contact structure and the gate structure. Particularly, parasitic capacitance between the contact structure and the gate structure may be sufficiently reduced/prevented even when the gate spacer may become narrow due to the size reduction of the semiconductor device.

In addition, the upper portion of the contact structure and the lower portion of the gate structure may be horizontally expanded and thus the surface area of the contact structure and the gate structure may increase. Thus, the electrical resistance of the contact structure and the gate structure may be stable and reliable in spite of the size reduction of the semiconductor device

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1A:
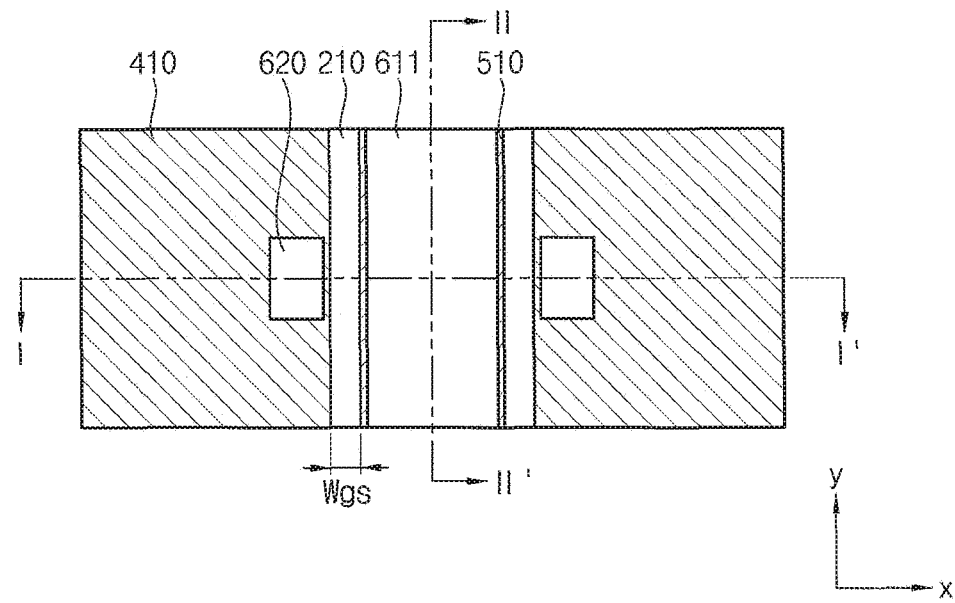
FIG. 1A is a plan view illustrating a semiconductor device in accordance with some example embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
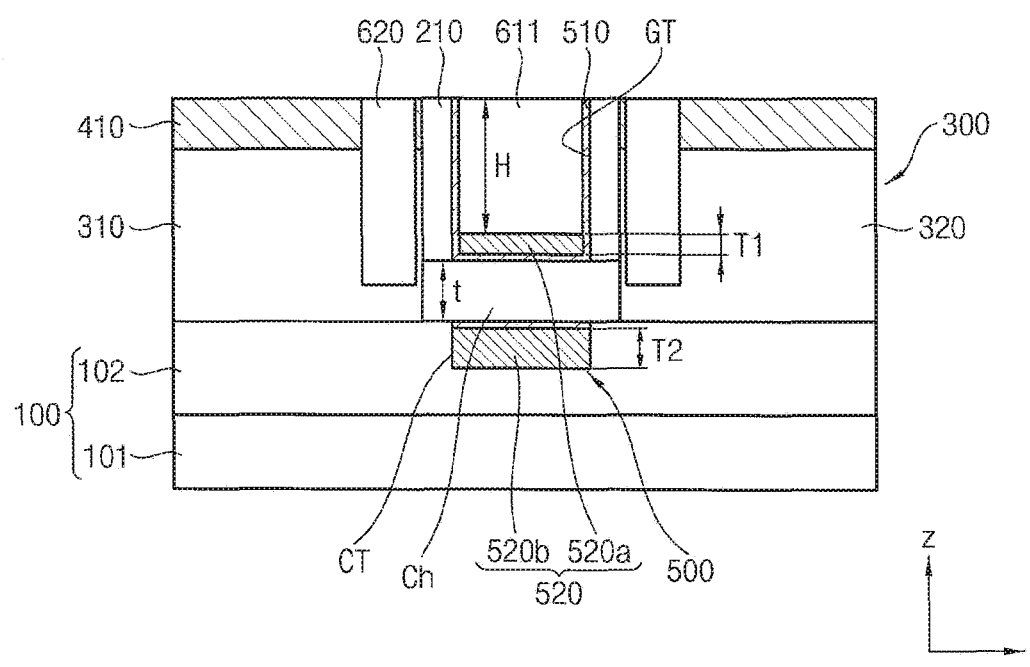
FIG. 1B is a cross-sectional view cut along a line I-I' of FIG. 1A.
Figure 1C:
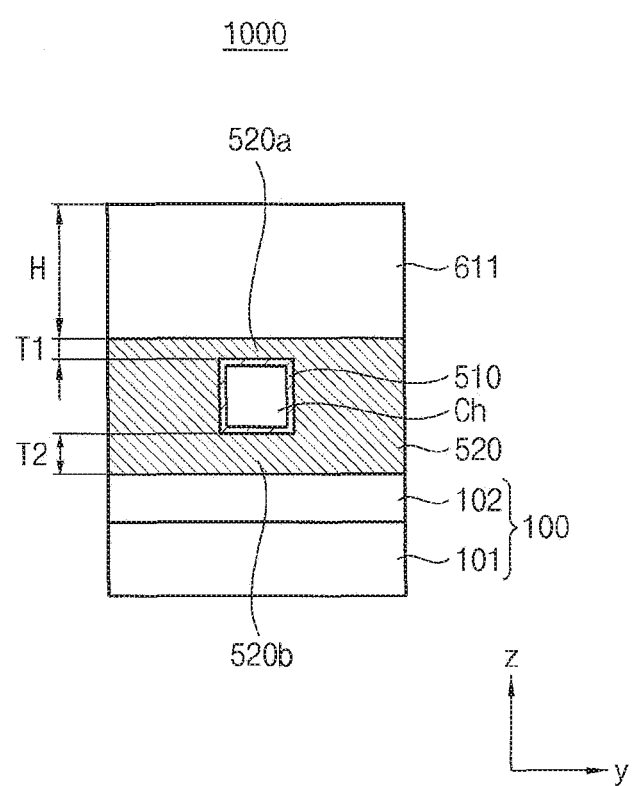
FIG. 1C is a cross-sectional view cut along a line II-II' of FIG. 1A.

FIG. 1A is a plan view illustrating a semiconductor device in accordance with some example embodiments of present inventive concepts. FIGS. 1B and 1C are cross-sectional views cut along a line I-I' and a line II-II' of FIG. 1A, respectively. In FIGS. 1A to 1C, the line I-I' extends along a fin shaped active region of the semiconductor device and the line II-II' extends along a gate line of the semiconductor device.

Referring to FIGS. 1A to 1C, the semiconductor device 1000 may include a semiconductor substrate 100 having a base body 101 and a body insulator 102 covering the base body 101 and having a channel trench CT that may extend in a second direction y, a semiconductor junction 300 arranged on the body insulator 102 around the channel trench CT, a channel Ch connected with the semiconductor junction 300 across the channel trench CT, and a gate structure 500 enclosing the channel Ch and filling the channel trench CT in the second direction y. The gate structure 500 may include a covering portion 520a covering the channel Ch and having a covering thickness T1 and a filling portion 520b filling up the channel trench CT and having a filling thickness T2 greater than the covering thickness T1.

For example, the semiconductor substrate 100 may include any substrates as long as the substrate may include an insulator by which upper and lower portions of the substrate may be electrically separated, together with semiconductor characteristics. In some example embodiments, the substrate 100 may include a silicon-on-insulator (SOI) substrate in which a pair of silicon layers may be separated by an insulation layer. Thus, the substrate 100 may include a semiconductor base body 101, a body insulator 102 covering the base body 101 and a semiconductor substrate layer that may cover the body insulator 102 and may be formed into the channel Ch of the semiconductor device 1000.

The semiconductor device 1000 may include a logic device, an image sensor device such as a CMOS image sensor and a memory device such as a flash memory device and DRAM device. Thus, the substrate 100 may be varied in accordance with characteristics and requirements of the semiconductor devices 1000.

The base body 101 may include single crystalline silicon and the body insulator 102 may include silicon oxide. The semiconductor substrate layer may include single crystalline silicon that may be formed into the channel Ch of the semiconductor device 1000.

The channel trench CT may be recessed to a sufficient depth from the surface of the body insulator 102 and may extend in the second direction y along which a gate line may extend. The gate structure 500 may be partially inserted into the channel trench CT and a plurality of the gate structures 500 may be connected in a line in the second direction y as the gate line of the semiconductor device 1000. Therefore, since the height of the gate structure at each cell may be reduced, the contact area between the gate structure and the gate spacer 210 may be reduced and thus the parasitic capacitance may be sufficiently reduced between the contact structure 620 and the gate conductive pattern 520.

An active region may be defined on the semiconductor substrate layer and may be isolated from surroundings by the underlying body insulator 102. In some example embodiments, the semiconductor substrate layer may protrude into a plurality of line-shaped fins on the body insulator 102 along the first direction x, so the nearest/neighboring line-shaped fin may be isolated by the body insulator 102. That is, the line-shaped fin may function as the active region and the body insulator 102 may function as a device isolation layer. Hereinafter, the line-shaped fin type active region defined by the body insulator 102 is referred to as an active fin.

The semiconductor junction (e.g., a semiconductor region) 300 may be provided on the active fin and may include source junctions 310 and drain junctions 320 opposite to each other with respect to the gate structure 500. Thus, the active fin may be connected to the semiconductor junction 300 and the active fin interposed between the source and drain junctions 310 and 320 may function as a channel for moving charges from the source junction 310 to the drain junction 320. The semiconductor junction 300 may be referred to herein as a semiconductor region. Moreover, the source junctions 310 and drain junctions 320 may be referred to herein as source and drain regions, respectively.

The semiconductor junction 300 may, in one example, include semiconductor materials that may be grown from the active fin and may comprise p type or n type dopants.

In some example embodiments, an epitaxial layer may be formed on the active fin and p-type or n-type dopants may be implanted into the epitaxial layer, thereby forming the source and drain junctions 310 and 320. Thus, the semiconductor junction 300 may be formed into an elevated source and drain (ESD) structure in such a configuration that an upper surface of the semiconductor junction 300 may be higher than an upper surface of the channel Ch.

The semiconductor junction 300 may comprise any material selected from the group consisting of silicon germanium (SiGe), germanium (Ge), silicon carbide (SiC), indium gallium arsenide (InGaAs) and combinations thereof. The dopants of the semiconductor junction 300 may be implanted as deep as depths/levels of the channel Ch.

The source junction 310 and the drain junction 320 may be connected with each other by the channel Ch and the channel Ch may be enclosed by the gate structure 500. Thus, the channel Ch may be operated by the gate structure 500 and may function as a switch element for selectively moving the charges.

The channel Ch may include a nano wire structure that may be arranged on the body insulator 102 and may be connected with the source and drain junctions 310 and 320. Particularly, a single nano wire extending in the first direction x may be provided as the channel Ch and may make contact with the semiconductor junction 300 across the channel trench CT in such a configuration that both end portions of the channel Ch may be positioned on the body insulator 102 at both sides of the channel trench CT, respectively.

Since some of the semiconductor substrate layer on the body insulator 102 may be formed into the channel Ch, the compositions of the channel Ch may be varied according to those of the semiconductor layer. For example, the channel Ch may comprise any materials selected from the group consisting of silicon (Si), germanium (Ge), silicon germanium (SiGe), indium gallium arsenide (InGaAs), indium arsenide (InAs), gallium antimonide (GaSb), indium antimonide (InSb) and combinations thereof. In some example embodiments, the channel Ch may include silicon (Si) since the active fin may be formed of silicon (Si).

Particularly, the channel Ch may be enclosed by the gate structure 500 and thus the charge flow through the channel Ch may be controlled by a gate current that may be applied to the gate structure 500.

For example, the gate structure 500 may include a gate insulation pattern 510 enclosing the channel Ch and a gate conductive pattern 520 on the gate insulation pattern 510 in such a way that the channel trench CT and a lower portion of the gate trench GT may be filled with the gate conductive pattern 520. A supplementary insulating member 611 may be further arranged on the gate conductive pattern 520 and an upper portion of the gate trench GT may be filled with the supplementary insulating member 611. Therefore, the gate structure 500 may be isolated from surroundings and protected from subsequent processes. The supplementary insulating member 611 may be referred to herein as an insulating region.

Since the upper portion of the gate trench GT may be defined by the gate spacer 210 and the gate structure 500 and may be filled with the supplementary insulating member 611, the overlap area of the contact structure 620 and the gate structure 500 that may be opposite to each other with respect to the gate spacer 210 (hereinafter, referred to as capacitance area) may be reduced and thus the parasitic capacitance between the contact structure 620 and the gate structure 500 may be reduced when the semiconductor device 1000 may be sufficiently downsized. For example, the supplementary insulating member 611 may comprise any material of silicon oxide, silicon nitride and silicon oxynitride.

The gate structure 500 may be shaped in a line extending in the second direction y, so that the supplementary insulating member 611 may also be shaped in a line extending in the second direction y.

The gate spacer 210 may also extend in the second direction y and may cover both sides of the gate structure 500 and the supplementary insulating member 611. Particularly, an upper surface of the gate spacer 210 may be coplanar with an upper surface of the supplementary insulating member 611.

A lower portion of the gate conductive pattern 520 may be inserted into the channel trench CT and thus the gate conductive pattern 520 may be partially arranged in the body insulator 102. In contrast, an upper portion of the gate conductive pattern 520 may be arranged adjacent to the channel Ch in such a way that an upper surface of the gate conductive pattern 520 may be lower than an upper surface of the semiconductor junction 300. Therefore, the gate conductive pattern 520 may include the covering portion 520a that may be protruded over the channel Ch and may overlap (e.g., cover) an upper portion of the channel Ch and the filling portion 520b that may fill up the channel trench CT and may extend under (e.g., cover) a lower portion of the channel Ch. Thus, the channel Ch may be enclosed by the covering portion 520a and the filling portion 520b.

Particularly, the covering portion 520a may have a covering thickness T1 on the channel Ch and the filling portion 520b may have a filling thickness T2 below the channel Ch in such a configuration that the covering thickness T1 may be smaller than the filling thickness T2. The covering portion 520a may have the covering thickness T1 as small as possible on the condition that the channel Ch is sufficiently covered with gate conductive materials and the filling portion 520b may have a sufficient thickness for compensating for the deterioration of the electric characteristics caused by the height reduction of the gate structure 500. Thus, the filling thickness T2 may be sufficiently greater than the covering thickness T1 and thus the gate structure 500 may be arranged in a reverse structure such that a larger portion thereof may be arranged below the channel Ch and a smaller portion thereof may be arranged on the channel Ch.

As a result, the contact area between the gate spacer 210 and the supplementary insulating member 611 may increase and the contact area between the gate spacer 210 and the gate conductive pattern 520 may be reduced/minimized in the semiconductor device 1000, which may reduce the parasitic capacitance between the contact structure 620 and the gate structure 500. For example, the filling thickness T2 may be about 1.5 to about 2.5 times of the covering thickness T1.

In some example embodiments, the channel trench CT may be formed by an over-etch process against the body insulator 102 to a depth of about 1.0 to about 1.5 times of the thickness t of the channel Ch and an upper portion of the gate conductive pattern 520 may be partially removed from the substrate 100 until the covering thickness T1 may be smaller than the depth/thickness of the channel trench CT.

The gate insulation pattern 510 may comprise dielectric materials such as silicon oxide, silicon oxynitride, high-k materials having a dielectric constant greater than silicon oxide and combinations thereof. Examples of the dielectric materials for the gate insulation pattern 510 may include hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), zirconium oxide (ZrO), aluminum oxide ($Al_2O_3$) and combinations thereof. The gate conductive pattern 520 may comprise conductive materials such as doped polysilicon, metal and combinations thereof. Examples of the conductive materials for the gate conductive pattern 520 may include aluminum (Al), copper (Cu), titanium (Ti), tantalum (Ta), tungsten (W), tantalum nitride (TaN), nickel silicide (NiSi), cobalt silicide (CoSi), titanium nitride (TiN), tungsten nitride (WN), titanium aluminide (TiAl), titanium aluminum nitride (TiAlN), tantalum carbon nitride (TaCN), tantalum carbide (TaC), tantalum silicon nitride (TaSiN) and combinations thereof.

The gate structure 500 may be spaced apart from the semiconductor junction 300 and the gate spacer 210 may be interposed between the gate structure 500 and the semiconductor junction 300, so that a side surface of the gate spacer 210 may make contact with the gate insulation pattern 510 and an opposite side surface of the gate spacer 210 may make contact with the semiconductor junction 300. Thus, the gate structure 500 and the semiconductor junction 300 may be electrically separated from each other by the gate spacer 210. For example, the gate spacer 210 may include silicon nitride and an upper surface of the gate spacer 210 may be coplanar with upper surfaces of the gate insulation pattern 510 and the supplementary insulating member 611.

An insulation interlayer pattern 410 may be arranged on the substrate 100 in such a way that the semiconductor junction 300 may be covered by the insulation interlayer pattern 410 and the gate spacer 210 and the supplementary insulating member 611 may be exposed through the insulation interlayer pattern 410. The contact structure 620 may penetrate into the semiconductor junction 300 through the insulation interlayer pattern 410. For example, the contact structure 620 may include a single plug that may be inserted into the semiconductor junction 300 through the insulation interlayer pattern 410, preferably to a position close to the channel Ch.

Particularly, an upper surface of the insulation interlayer pattern 410 may be coplanar with the upper surfaces of the gate spacer 210 and the supplementary insulating member 611. The contact structure 620 may make contact with a wiring structure or a capacitor that may be arranged on the insulation interlayer pattern 410.

Since the supplementary insulating member 611 may be coplanar with the upper surfaces of the insulation interlayer pattern 410 and the gate spacer 210 and may be arranged on the gate conductive pattern 520, the gate spacer 210 may make contact with the insulation materials across a larger contact area than the gate spacer 210 may contact the conductive materials.

In conventional semiconductor devices, the gate conductive pattern is positioned substantially at the same height, the contact structure and the gate structure may be opposite to each other in the first direction with respect to the gate spacer. Thus, a size reduction may reduce the thickness of the gate spacer, which may increase the parasitic capacitance between the contact structure and the gate structure in the conventional semiconductor device.

In contrast, in some example embodiments of the semiconductor devices, a larger portion of the gate conductive pattern 520 may be arranged under the channel Ch rather than on the channel Ch and the supplementary insulating member 611 may be arranged on the gate conductive pattern 520 in such a configuration that the upper surface of the supplementary insulating member 611 may be coplanar with the upper surface of the gate spacer 210. Therefore, the capacitance area between the contact structure 620 and the gate conductive pattern 520, which may be opposite to each other with respect to the gate spacer 210, may be sufficiently reduced.

In some example embodiments, the supplementary insulating member 611 may have a height H of about 20 nm to about 40 nm from the upper surface of the gate conductive pattern 520.

Accordingly, the capacitance area between the contact structure 620 and the gate structure 500 may be reduced to an area just between the contact structure 620 and the covering portion 520a, so that the parasitic capacitance may be reduced/minimized between the contact structure 620 and the gate structure 500 in spite of the reduction of the width Wgs of the gate spacer 210.

Further, the contact resistance of the contact structure 620 and the gate resistance of the gate structure 500 may also decrease just by increasing the width of the contact structure 620 and the gate conductive pattern 520.

Since the supplementary insulating member 611 may be arranged on the gate conductive pattern 520 and may comprise insulation materials instead of conductive materials and the contact structure 620 may face the supplementary insulating member 611, with the gate spacer 210 therebetween, the contact structure 620 may be expanded over the gate spacer 210 and thus the surface area of the contact structure 620 may increase without any increase of the parasitic capacitance. In addition, the process margin may also increase in forming the contact structure 620.

In the same way, the channel trench CT may also be expanded in the first direction x to thereby form an expansion trench and as a result, the lower portion of the gate conductive pattern 520 may also be expanded in the first direction x. Therefore, the surface area of the gate conductive pattern 520 may increase and the electrical resistance of the gate structure 500 may decrease. That is, the gate driving voltage may decrease just by expanding the channel trench CT in the body insulator 102.

Figure 2A:
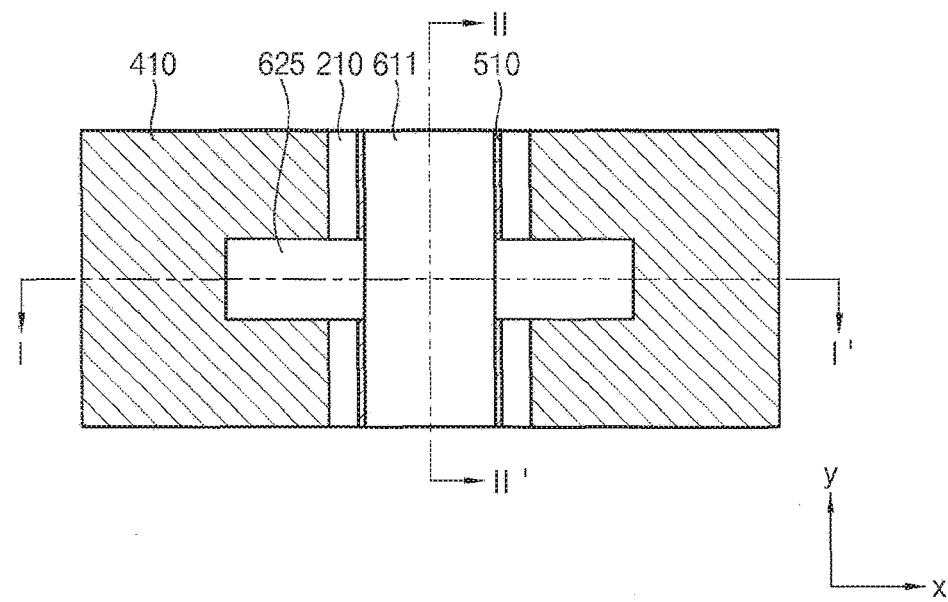
FIG. 2A is a plan view illustrating a modification of the semiconductor device shown in FIG. 1A.
Figure 2B:
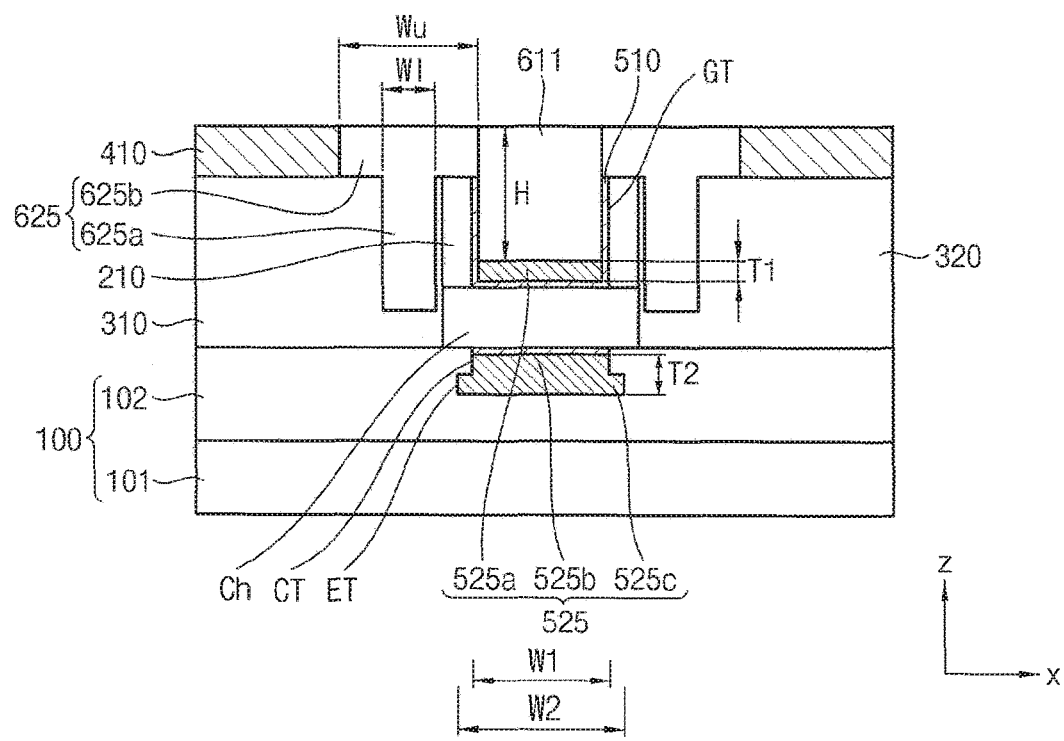
FIG. 2B is a cross-sectional view cut along a line I-I' of FIG. 2A.
Figure 2C:
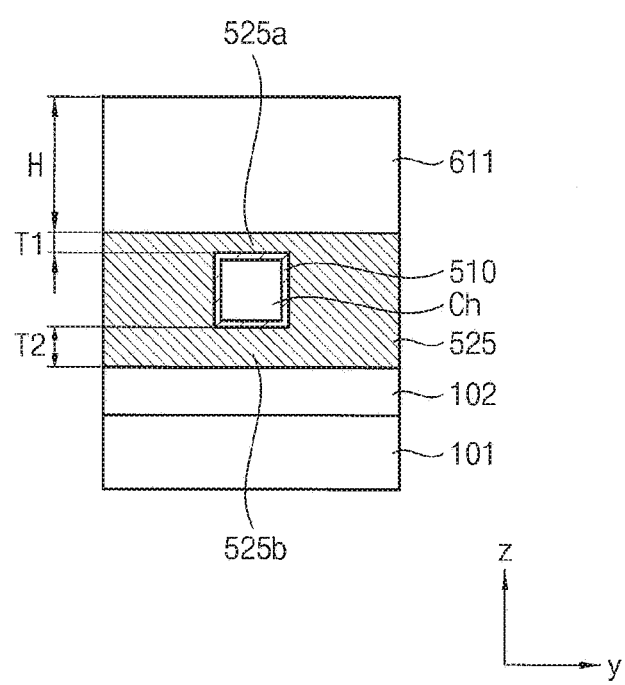
FIG. 2C is a cross-sectional view cut along a line II-II' of FIG. 2A.

FIG. 2A is a plan view illustrating a modification of the semiconductor device shown in FIG. 1A. FIGS. 2B and 2C are cross-sectional views cut along a line I-I' and a line II-II' of FIG. 2A, respectively. In FIGS. 2A to 2C, the modified semiconductor device has substantially the same structures as the semiconductor device shown in FIGS. 1A to 1C, except that the contact structure and the gate conductive pattern are expanded, so the same reference numerals denote the same elements in FIGS. 1A to 1C. Further detailed descriptions on the same elements may be omitted hereinafter.

Referring to FIGS. 2A to 2C, the gate structure 500 may include an expanded gate conductive pattern 525 having a covering portion 525a, a filling portion 525b and an expanding portion 525c. The covering portion 525a may cover the upper portion of the channel Ch and the filling portion 525b may cover the lower portion of the channel Ch and fill up the channel trench CT. The expanding portion 525c may be provided under the filling portion 525b and may fill an expanded trench ET that may be communicated/connected with the channel trench CT. The expanded trench ET may be arranged under the channel trench CT and may have a second width W2 larger than a first width W1 of the channel trench CT. The covering portion 525a and the filling portion 525b may have substantially the same structures as the covering portion 520a and the filling portion 520b of the semiconductor devices 1000 shown FIGS. 1B and 1C, thus any further descriptions on the covering portion 525a and the filling portion 525b may be omitted.

An etching process for forming the channel trench CT may be further performed against the body insulator 102 and an additional trench may be formed contiguously/consecutively to the channel trench CT in such a way that the additional trench may be expanded in the first direction x, so that the expanded trench ET may be formed under the channel trench CT to the second width W2 greater than the first width W1 of the channel trench CT. In some example embodiments, the expanded trench ET may have a depth of about 2 nm to about 3 nm.

Gate conductive materials may be filled into the gate trench GT, the channel trench CT and the expanded trench ET, and the expanding portion 525c may be formed in the expanded trench ET as well as the covering portion 525a in the gate trench GT and the filling portion 525b in the channel trench CT, thereby forming the expanded gate conductive pattern 525. Since the surface area of the gate structure 500 may increase due to the expanded portion 525c, the electrical resistance of the gate structure 500 may decrease and as a result, the driving voltage applied to the gate structure 500 may also be decreased. Particularly, when the widths of the gate trench GT and the channel trench CT may decrease unexpectedly and thus the widths of the covering portion 525a and the filling portion 525b may be over reduced, the expanding portion 525c may compensate for the reduction of the covering portion 525a and the filling portion 525b, thereby reducing/preventing the increase of the overall resistance of the gate structure 500.

Further, an upper portion of the contact structure 620 may be expanded in the first direction x, thereby forming an expanded contact structure 625 to cover the gate spacer 210. That is, the expanded contact structure 625 may include a lower contact 625a (e.g., a lower contact region) inserted into the semiconductor junction 300 and having a lower width $W_l$ and an upper contact 625b (e.g., an upper contact region) making contact with both of the semiconductor junction 300 and the gate spacer 210 in one body with the lower contact 625a. The upper contact 625b may have an upper width $W_u$ greater than the lower width $W_l$ of the lower contact 625a. The lower contact 625a and the upper contact 625b may be referred to herein as respective contact regions.

The lower contact 625a may include a contact plug that may be inserted into the semiconductor junction 300 and the upper contact 625b may be combined with the lower contact 625a in one body and be extended in the first direction x to cover the gate spacer 210. As a result, the upper width $W_u$ of the upper contact 625b may be greater than the lower width $W_l$ of the lower contact 625a, thereby decreasing the contact resistance and increasing the process margin for forming the expanded contact structure 625.

While some example embodiments disclose that the upper contact 625b may expand in the first direction x until the gate spacer 210 may be covered with the upper contact 625b and the supplementary insulating member 611 (e.g., an insulating/insulation region) may make contact with the upper contact 625b, the upper contact 625b may, in some embodiments, extend/expand over the supplementary insulting member 611 such that the supplementary insulation member 611 may be partially overlapped by the upper contact 625b as long as a pair of the neighboring upper contacts 625b may be electrically separated from each other by the supplementary insulting member 611.

In addition, while some example embodiments disclose the lower contact 625a may penetrate a single insulation interlayer pattern 410 and may make contact with the semiconductor junction 300, a multilayer structure may be provided as the insulation interlayer pattern 410 and the lower contact 625a may penetrate at least one of the layers in the multilayer structure.

According to the above example embodiments of the semiconductor device 1000, the gate structure may fill up the channel trench in the body insulator and may enclose the channel in such a configuration that the filling portion of the gate structure filling in the channel trench has a greater width than the covering portion of the gate structure on the channel and the covering portion may be lower than the gate spacer. The supplementary insulating member may be positioned on the gate structure in such a way that the upper surface of the supplementary insulating member may be coplanar with the upper surface of the gate spacer.

Therefore, the overlap area of the contact structure and the gate structure may decrease and the overlap area of the contact structure and the supplementary insulating member may increase, thereby sufficiently reducing/minimizing the parasitic capacitance between the contact structure and the gate structure. Particularly, the parasitic capacitance between the contact structure and the gate structure may be sufficiently reduced/prevented even when the gate spacer may become narrow due to a size reduction of the semiconductor device.

In addition, the upper portion of the contact structure and the lower portion of the gate structure may be horizontally expanded and thus the surface area of the contact structure and the gate structure may increase. Thus, the electrical resistance of the contact structure and the gate structure may be stable and reliable in spite of a size reduction of the semiconductor device.

FIGS. 3A to 14B are views illustrating the processing steps for a method of manufacturing the semiconductor devices shown in FIGS. 1A to 1C. In FIGS. 3A to 14B, the alphabetic letter A in each figure number denotes a plan view of each processing step and the alphabetic letter B in each figure number denotes a cross-sectional view cut along the line I-I' in FIG. 1A.

Figure 3A:
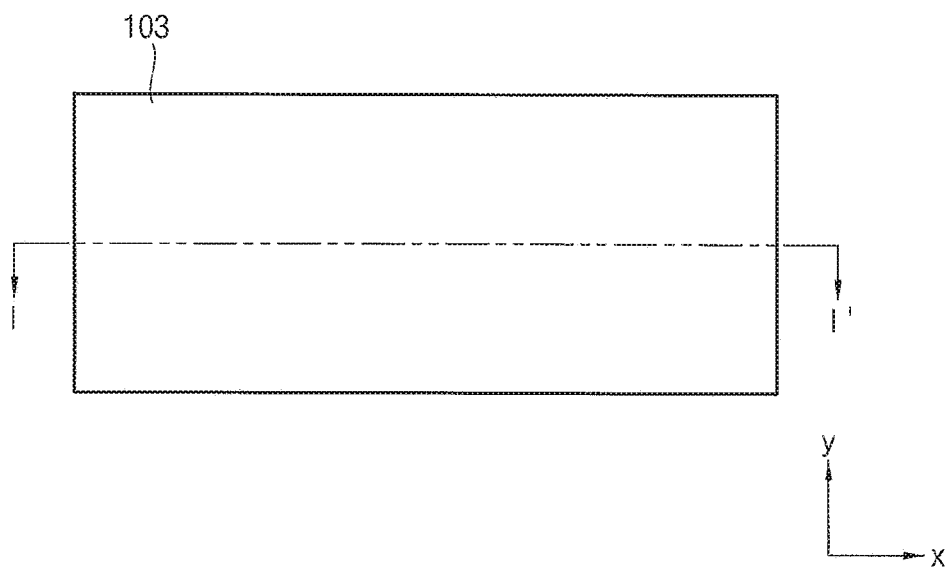
FIGS. 3A to 15B are views illustrating processing operations/steps for a method of manufacturing the semiconductor devices shown in FIGS. 1A to 1C.
Figure 3B:
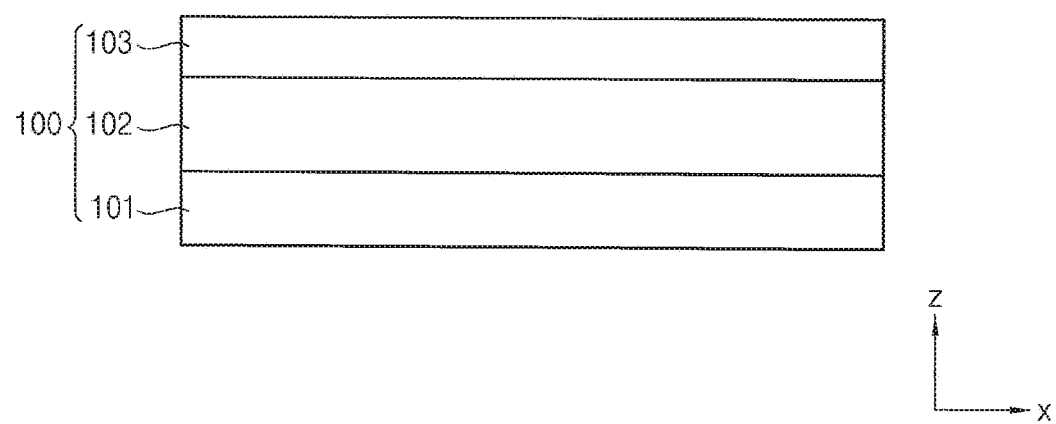

Referring to FIGS. 3A and 3B, the semiconductor substrate 100 having the body insulator 102 may be provided for manufacturing the semiconductor device 1000.

For example, a silicon-on-insulator (SOI) substrate may be provided as the semiconductor substrate 100 in which the body insulator 102 may be formed on the base body 101 comprising silicon (Si) and the semiconductor substrate layer 103 may be formed on the body insulator 102.

The base body 101 may include a semiconductor plate comprising single crystalline silicon and a silicon oxide layer may be formed on the base body 101 by an oxidation process. The oxide layer on the base body 101 may be provided as the body insulator 102. Any other insulation layer, as an alternative to the silicon oxide layer, may be utilized as the body insulator 102 as long as a pair of the neighboring active fins may be electrically insulated by the insulation layer and the insulation layer may have a sufficient etching selectivity with respect to the gate spacer 210 and the channel Ch in a subsequent etching process.

The semiconductor substrate layer 103 may be formed to a sufficient thickness on the body insulator 102 and may comprise semiconductor materials such as silicon (Si). Various semiconductor materials may be utilized for the substrate layer 103 as long as the substrate layer 103 may function as an active region for manufacturing the semiconductor device 1000.

In some example embodiments, the substrate layer 103 may include single crystalline silicon (Si) and may be formed into the channel Ch in a subsequent process.

Figure 4A:
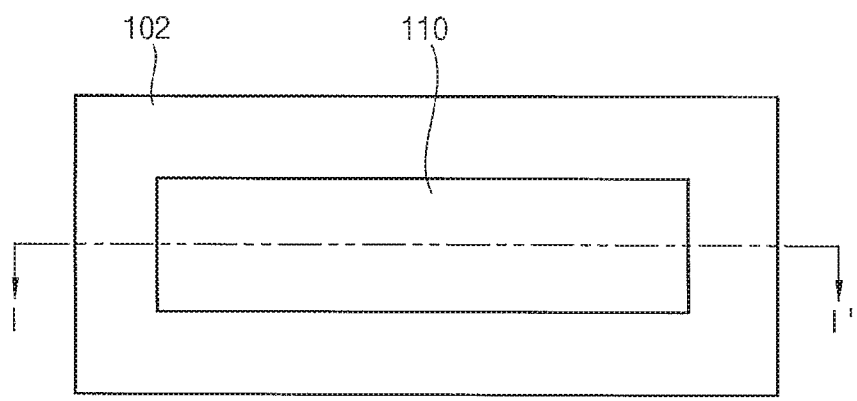
Figure 4B:
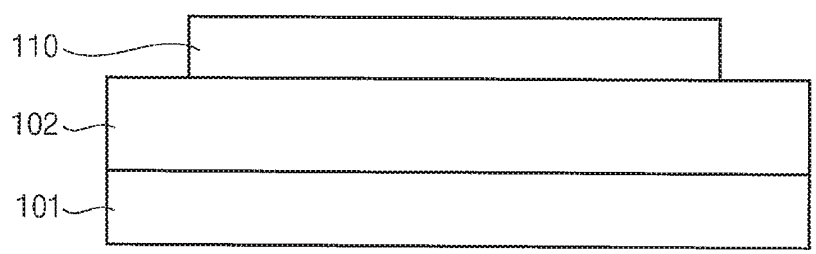

Referring to FIGS. 4A and 4B, the active fin 110 may be formed on the body insulator 102 in such a way that the active fin 110 may protrude from the body insulator 102 and may be shaped into a line extending in the first direction x For example, a mask pattern may be formed on the substrate layer 103 and the substrate layer 103 may be partially removed from the body insulator 102 by an etching process using the mask pattern an etching mask. A dry etching process such as a reactive ion etching (ME) process may be used for removing the substrate layer 103.

Thus, the residuals of the substrate layer 103 on the body insulator 102 may be formed into the active fin 110 that may protrude from the body insulator 102 and may function as an active region on which conductive structures of the semiconductor device 1000 may be arranged. In such a case, the body insulator 102 may function as a device isolation layer and neighboring ones of the active fins 110 may be isolated from each other by the body insulator 102.

Figure 5A:
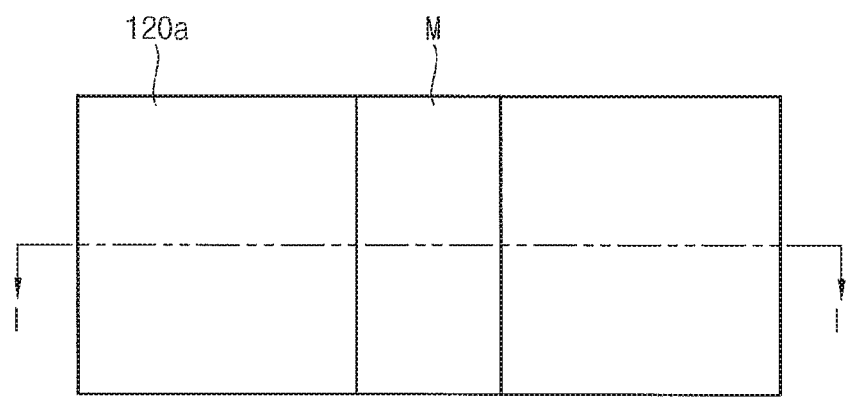
Figure 5B:
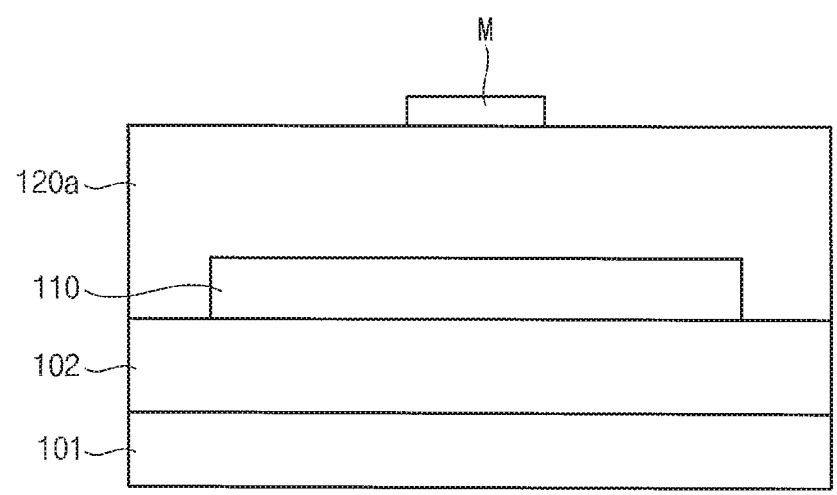

Referring to FIGS. 5A and 5B, a dummy gate layer 120a may be formed on the substrate 100 to a sufficient thickness to cover the active fin 110 and a dummy mask pattern M may be formed on the dummy gate layer 120a in a shape of a line extending in the second direction y.

For example, the dummy gate layer 120a may include polysilicon having an etching rate larger than that of the active fin 110 in a subsequent etching process and the dummy mask pattern M may include silicon nitride having an etching selectivity with respect to polysilicon.

Particularly, the active fin 110 may extend in the first direction x and the dummy mask pattern M may extend in the second direction y substantially perpendicular to the first direction x. Therefore, the active fin 110 and the dummy mask pattern M may be perpendicular to each other.

Figure 6A:
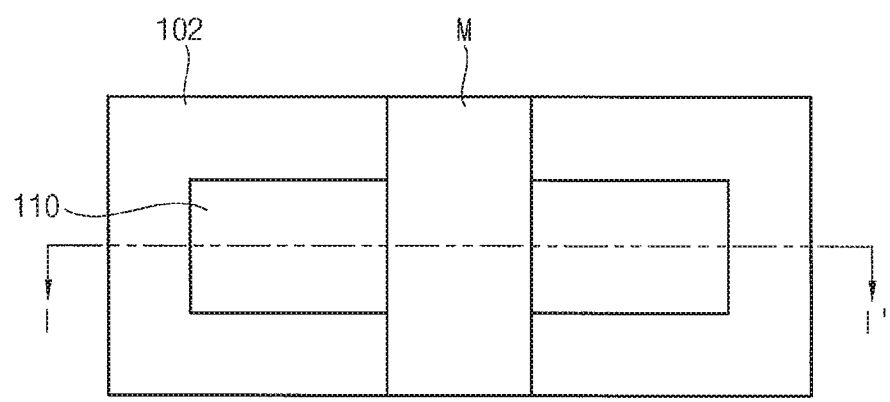
Figure 6B:
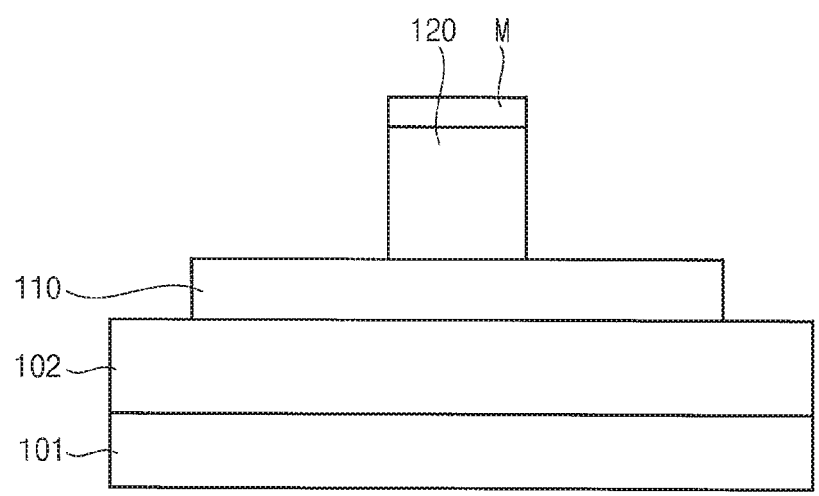

Referring to FIGS. 6A and 6B, the dummy gate layer 120a may be partially removed from the substrate 100 by an etching process using the dummy mask pattern M as an etching mask, thereby forming the dummy gate line 120 extending in the second direction y.

The dummy gate layer 120a exposed by the dummy mask pattern M may be removed from the substrate 100 and thus the active fin 110 and the body insulator 102 may be exposed to surroundings and the dummy gate layer 120a covered by the dummy mask pattern M may remain on the substrate 100 in a shape of a line extending in the second direction y, thereby forming the dummy gate line 120 along the second direction y. Thus, the active fin 110 extending in the first direction x may be partially covered by the dummy gate line 120 extending in the second direction y.

Since the active fin 110 and the dummy gate line 120 may cross each other, the active fin 110 may be divided into two portions by the dummy gate line 120 and each of the divided portions of the active fin 110 may be formed into source and drain junctions/regions in a subsequent process.

Figure 7A:
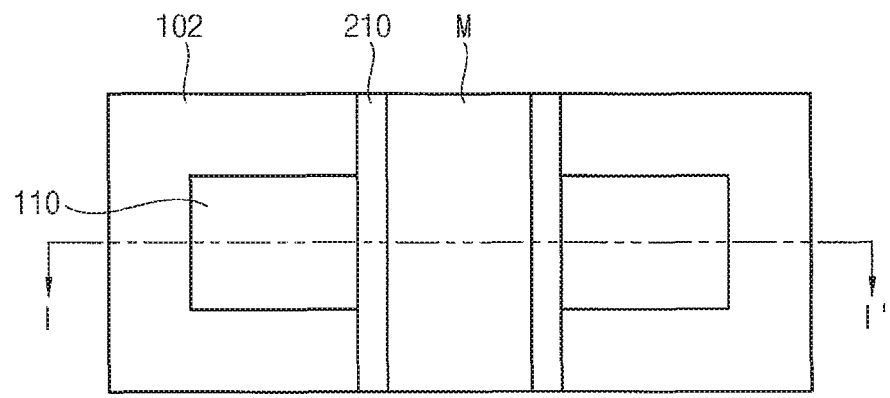
Figure 7B:
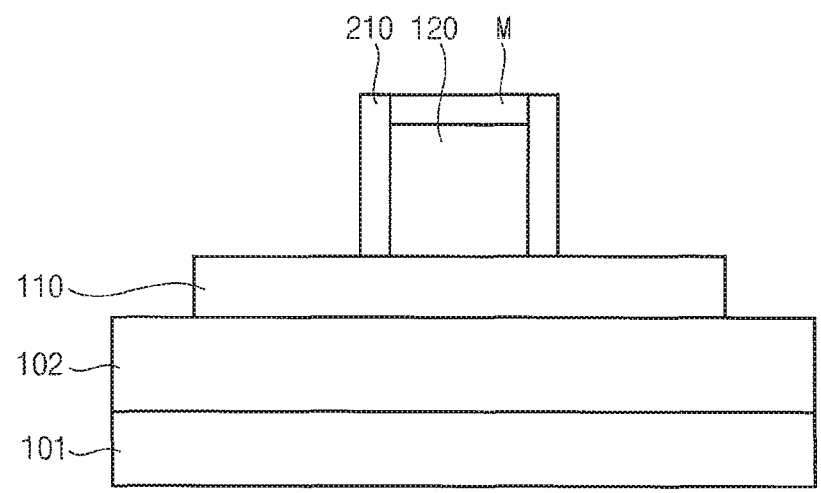

Referring to FIGS. 7A and 7B, the gate spacer 210 may be formed on each sidewall of the dummy gate line 120 so that the gate spacer 210 may also extend in the second direction y at each side of the dummy gate line 120. For example, the dummy gate line 120 may include silicon nitride.

Figure 8A:
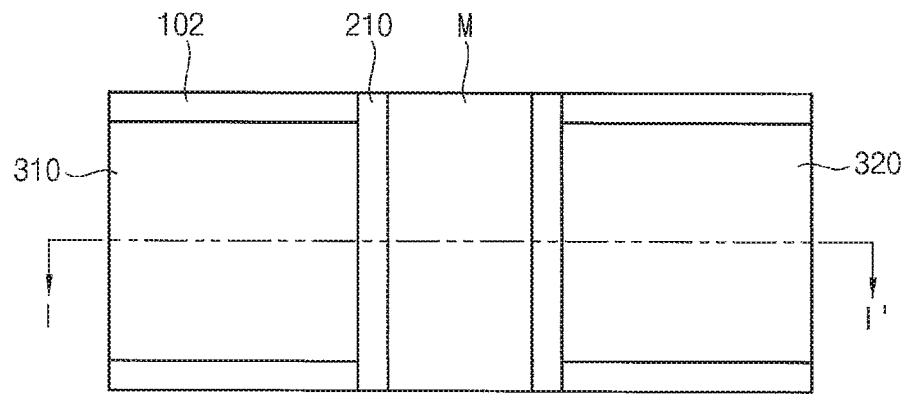
Figure 8B:
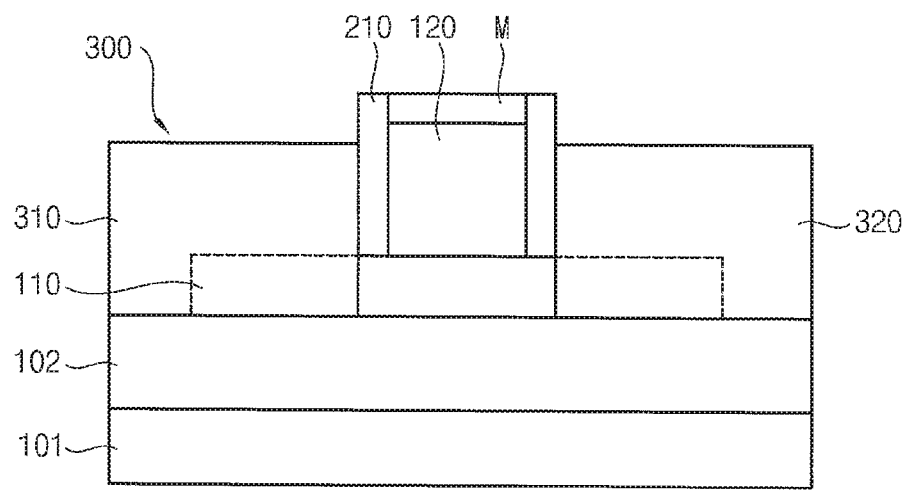

Referring to FIGS. 8A and 8B, the semiconductor junction 300 (e.g., a semiconductor region) may be formed on the active fin 110 that may be exposed by the gate spacer 210 and the dummy gate line 120.

For example, a single crystalline layer may be formed on portions of the active fin 110 by an epitaxial growth process using the active fin 110 as a seed layer, thereby forming a semiconductor growth layer on the active fin 110 that may make contact with a side surface of the gate spacer 210. The semiconductor growth layer may include silicon germanium (SiGe), germanium (Ge), silicon carbide (SiC) and combinations thereof in consideration of electric characteristics of the semiconductor device 1000.

Then, a plurality of dopants may be implanted into the semiconductor growth layer by an ion implantation process, thereby forming the semiconductor junction 300 including the source junction 310 and the drain junction 320. One of p-type dopants or n-type dopants may be implanted into the divided portions of the active fin 110. Particularly, the semiconductor junction 300 may be formed into an elevated structure by the epitaxial growth process and the dopants may be implanted around the active fin 110. Thus, the dummy gate line 120 may be separated from the semiconductor junction 300 by the gate spacer 210 and the source and drain junctions 310 and 320 may be arranged at both sides of the dummy gate line 120, respectively. The source and drain junctions 310 and 320 may be formed at both ends the channel Ch.

The epitaxial growth process and the implantation process may be performed in-situ with each other, and thus the dopant concentration may be uniform in the semiconductor junction 300 and the electrical resistance of the semiconductor junction 300 may be reduced/minimized.

The active fin 110 under the dummy gate line 120 may be formed into the channel Ch through which the source and drain junctions 310 and 320 may be connected.

Figure 9A:
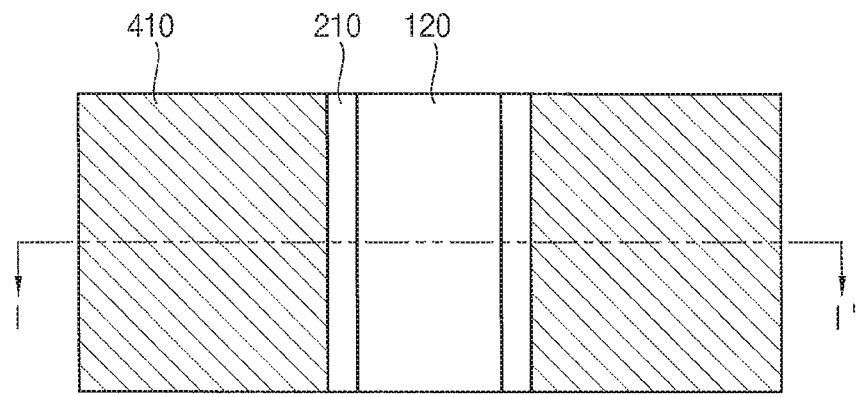
Figure 9B:
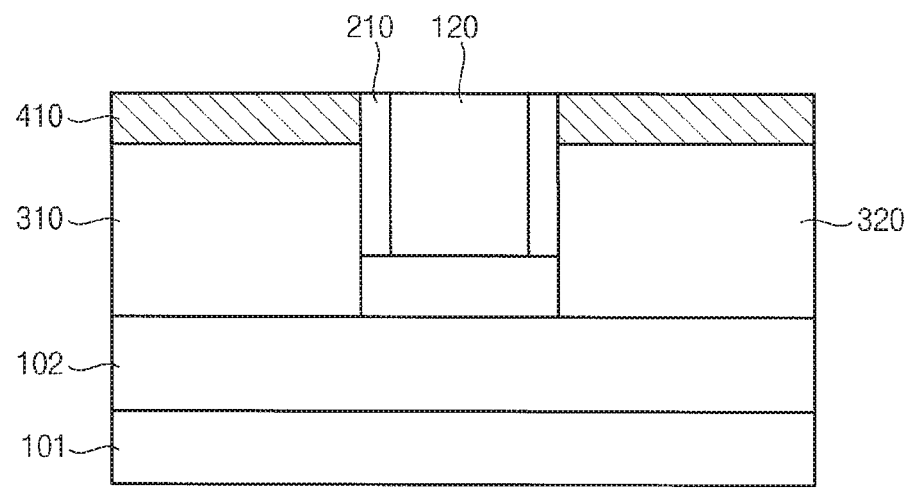

Referring to FIGS. 9A and 9B, the insulation interlayer pattern 410 may be formed on the semiconductor junction 300 and the gate spacer 210, and the dummy gate line 120 may be exposed through the insulation interlayer pattern 410.

An insulation interlayer may be formed on the substrate 100 to a sufficient thickness to cover the semiconductor junction 300, the gate spacer 210 and the dummy gate line 120. Then, the insulation interlayer may be partially removed from the substrate 100 by a planarization process until the gate spacer 210 and the dummy gate line 120 may be exposed. The dummy mask pattern M may be removed in the planarization process together with the insulation interlayer.

Accordingly, the insulation interlayer may remain just on the semiconductor junction 300 to thereby form the insulation interlayer pattern 410 through which the gate spacer 210 and the dummy gate line 120 may be exposed.

Various materials may be utilized for the insulation interlayer pattern 410 as long as the insulation interlayer pattern 410 may have a sufficient etching selectivity with respect to the dummy gate line 120 in an etching process for removing the dummy gate line 120. For example, the insulation interlayer pattern 410 may include one of silicon oxide, silicon nitride and silicon oxynitride.

Figure 10A:
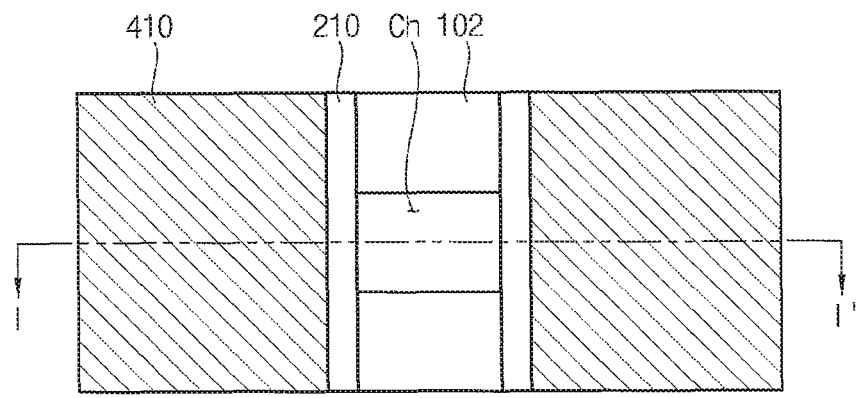
Figure 10B:
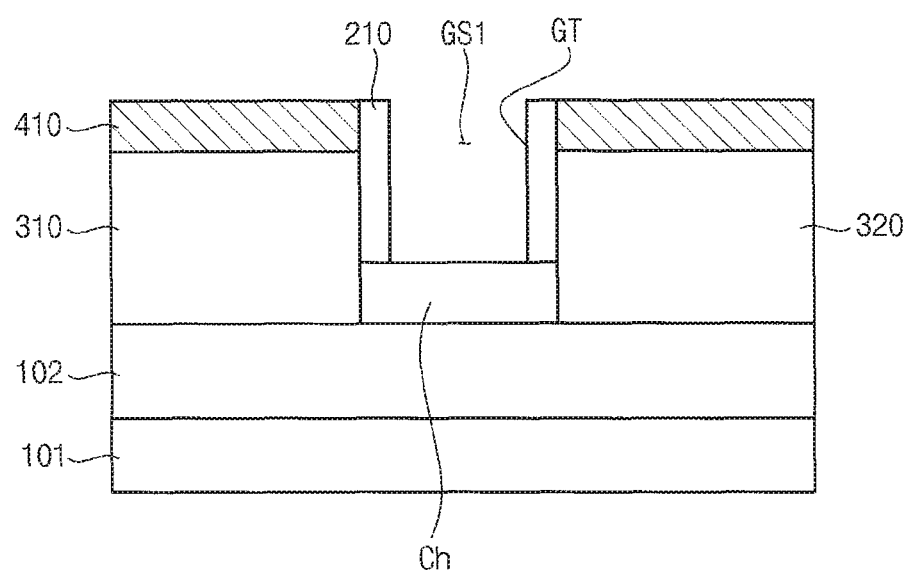

Referring to FIGS. 10A and 10B, the dummy gate line 120 may be removed from the body insulator 102 until the active fin 110 may be exposed, thereby forming a gate trench GT through which the active fin 110 may be exposed. The active fin 110 in the gate trench GT may be formed into the channel Ch extending in the first direction x and making contact with the semiconductor junction 300.

The dummy gate line 120 may be removed from the body insulator 102 by an etching process using the gate spacer 210 and the insulation interlayer pattern 410 as an etching mask, to thereby form the gate trench GT that may be defined by a pair of the gate spacers 210 and the body insulator 102 and may have a first gate space GS1. Since the active fin 110 may have an etching selectivity with respect to dummy gate line 120, the active fin 110 may function as an etch stop member to the etching process for forming the gate trench GT and the active fin 110 may be exposed through the gate trench GT.

The active fin 110 in the gate trench GT may be formed into the channel Ch of which the end portions may make contact with the source and drain junctions 310 and 320, respectively.

Since the channel Ch may be formed from the substrate layer 103 on the body insulator 102 and the source and drain junctions 310 and 320 may be locally grown from some portions of the substrate layer 103 close to both sides of the dummy gate line 120, the channel Ch and the source/drain junctions 310 and 320 may be connected on the body insulator 102.

Figure 11A:
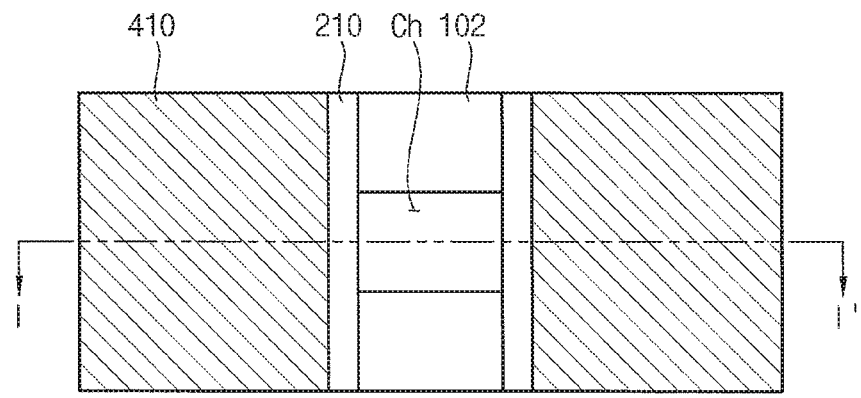
FIG. 11C is a cross-sectional view illustrating a processing operation/step for further forming the expanded trench under the channel trench.
Figure 11B:
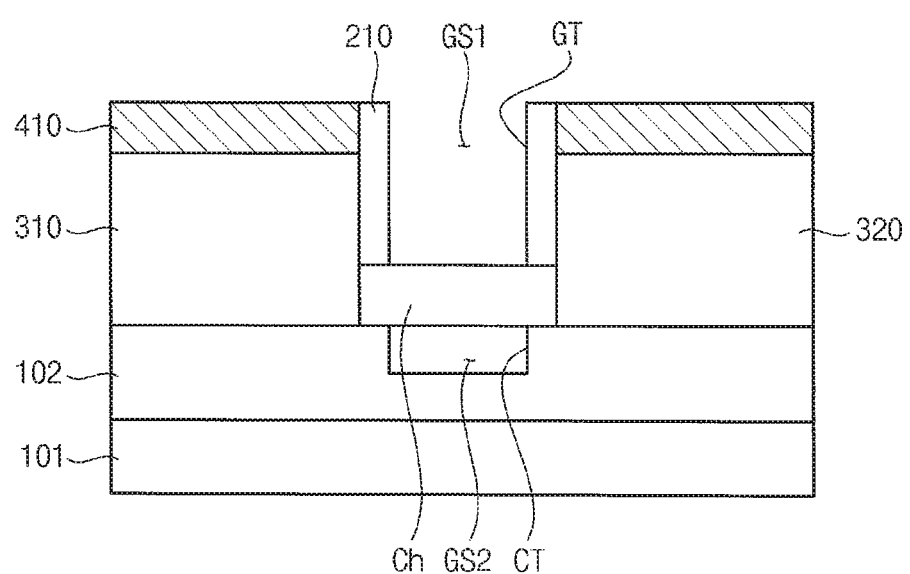

Referring to FIGS. 11A and 11B, the body insulator 102 that may be exposed through the gate trench GT may be further removed/etched from the substrate 100, thereby forming the channel trench CT that may be communicated/connected with the gate trench GT.

For example, the body insulator 102 may be further etched off from the substrate 100 by an anisotropic etching process using the gate spacer 210 as an etching mask. Since the active fin 110 may include single crystalline silicon and the body insulator 102 may include silicon oxide, the body insulator 102 may be much more rapidly etched off than the active fin 110 in the anisotropic etching process. Thus, the body insulator 102 under the active fin 110 may be recessed with the same width of the gate trench GT in a shape of a line extending along the second direction y, thereby forming the channel trench CT having the second gate space GS2 that may be communicated/connected with the first gate space GS1. The second gate space GS2 may be referred to herein as a recess.

The active fin 110 partially etched off by the anisotropic etching process may be formed into the channel Ch that may be spaced apart from the bottom of the channel trench CT. Thus, the channel Ch may cross over the channel trench CT along the first direction x and both end portions of the active fin 110 that may be covered with the gate spacer 210 may be connected to the semiconductor junction 300 without being etched.

The depth of the channel trench CT may be controlled by the variation of the process conditions of the anisotropic etching process in consideration of the characteristics of the gate structure 500 and the thickness t of the channel Ch. In some example embodiments, the channel trench CT may have the same depth as the width t of the channel Ch.

Particularly, the channel Ch may be formed into a nano wire that may cross over the channel trench CT in the first direction x and may be enclosed by the gate conductive pattern 520 in a subsequent process such as by forming a gate all-around channel (GAA).

In a modified example embodiment, a bottom portion of the channel trench CT may be expanded in the first direction x and the expanded trench ET may be further formed under the channel trench CT.

Figure 11C:
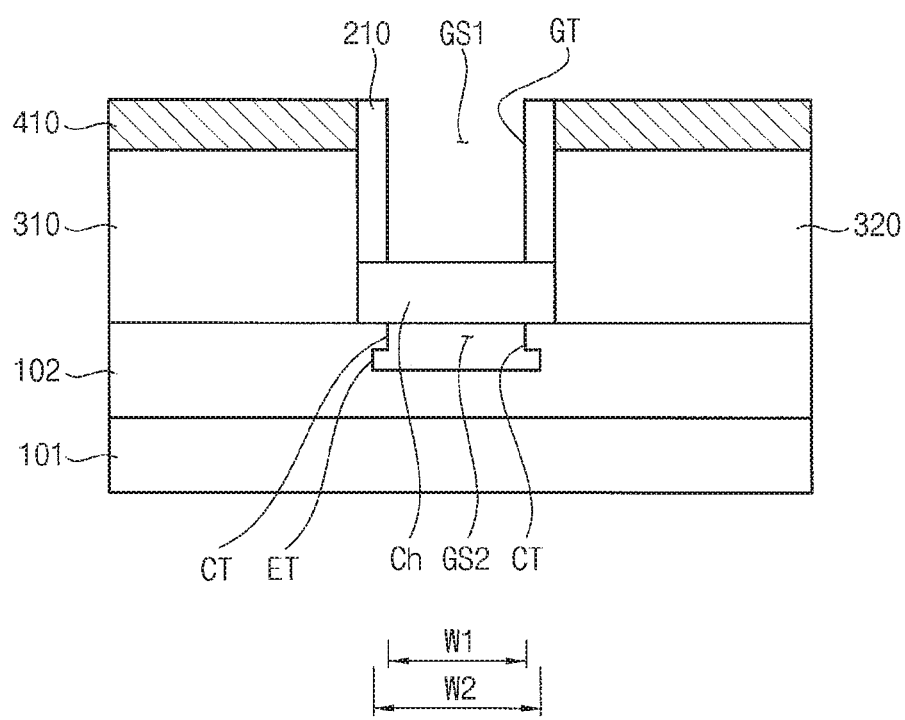

FIG. 11C is a cross-sectional view illustrating a processing step for further forming the expanded trench ET under the channel trench CT.

Referring to FIG. 11C, when the etching process for forming the channel trench CT may reach the terminal point, the process conditions of the etching process may be changed into isotropic conditions from the anisotropic conditions and the isotropic over etching process may be performed to the body insulator 102. Thus, the body insulator 102 may be further etched off in both of the first direction x and a depth direction, thereby forming the expanded trench ET having a second width W2 greater than the first width W1 of the channel trench CT and communicated/connected with the channel trench CT. Therefore, the size of the expanded trench ET may be varied by the process conditions of the isotropic over etching process in view of the size of the gate structure 500 that may be inserted into the body insulator 102.

The expanded portion 525c of the expanded gate structure 525 in FIG. 2B may be formed by filling the expanded trench ET with gate conductive materials.

Figure 12A:
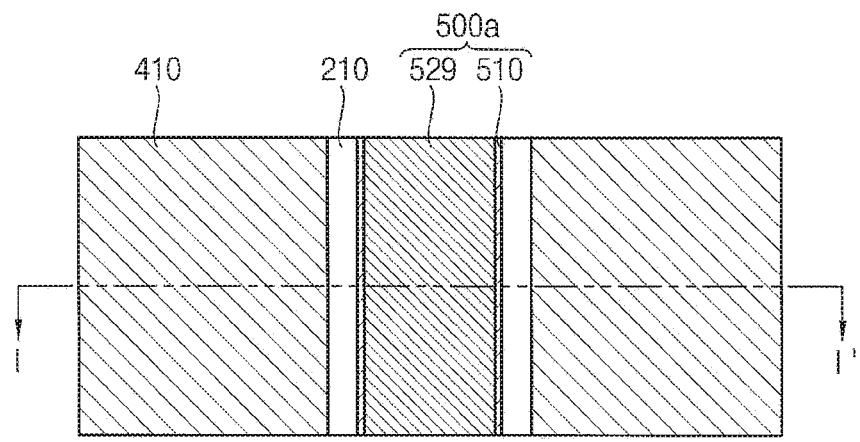
Figure 12B:
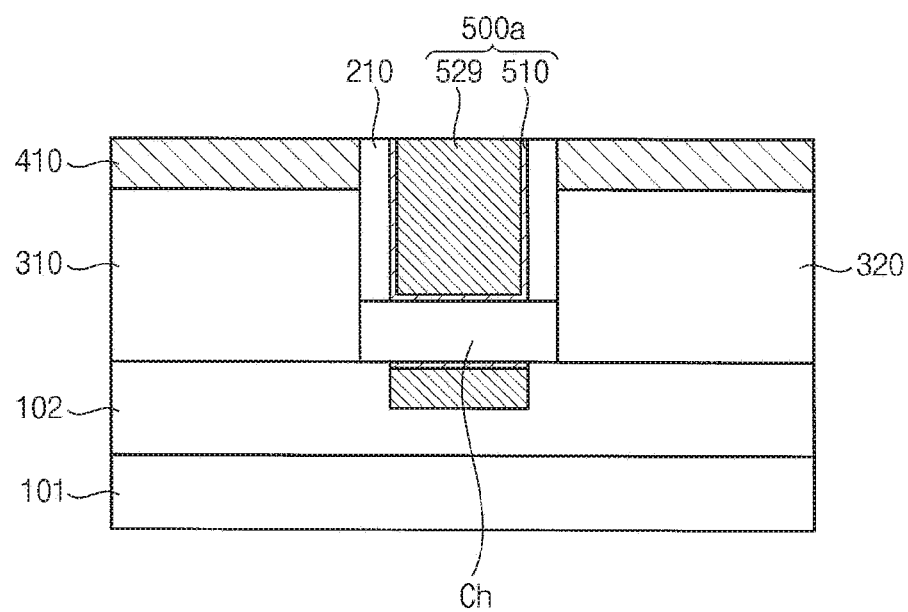

Referring to FIGS. 12A and 12B, a preliminary gate structure 500a may be formed in the gate trench GT and the channel trench CT in such a way that the channel Ch may be enclosed by the preliminary gate structure 500a.

For example, the preliminary gate structure 500a may be formed by node-separating a stack layer of a gate insulation layer and a gate conductive layer at each gate trench GT by a planarization process in such a way that a gate insulation pattern 510 may be formed on a surface of the channel Ch and the side surface of the gate spacer 210 in the gate trench GT and a preliminary gate conductive pattern 529 may be filled into the channel trench CT and the gate trench GT. Particularly, the gate insulation layer may be formed on the body insulator 102 along a surface profile of the substrate 100 having the gate trench GT and the channel trench CT. Thus, the gate insulation layer may be formed on side surfaces of the gate trench GT and on upper surfaces of the insulation interlayer pattern 410 and the gate spacer 210. In such a case, the channel Ch may be enclosed and covered by the gate insulation layer. Then, the gate conductive layer may be formed on the gate insulation layer to a sufficient thickness to fill up the channel trench CT and the gate trench GT, and then the gate conductive layer and the gate insulation layer may be planarized until a top surface of the insulation interlayer pattern 410 and the gate spacer 210 may be exposed. Therefore, the gate insulation layer and the gate conductive layer may be node-separated by the gate trench GT, thereby forming the preliminary gate structure 500a having the gate insulation pattern 510 and the preliminary gate conductive pattern 529.

The gate insulation pattern 510 may comprise dielectric materials such as silicon oxide, silicon oxynitride, high-k materials having a dielectric constant greater than silicon oxide and combinations thereof. Examples of the dielectric materials for the gate insulation pattern 510 may include hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), zirconium oxide (ZrO), aluminum oxide ($Al_2O_3$) and combinations thereof. The preliminary gate conductive pattern 529 may comprise conductive materials such as doped polysilicon, metal and combinations thereof. Examples of the conductive materials for the preliminary gate conductive pattern 529 may include aluminum (Al), copper (Cu), titanium (Ti), tantalum (Ta), tungsten (W), tantalum nitride (TaN), nickel silicide (NiSi), cobalt silicide (CoSi), titanium nitride (TiN), tungsten nitride (WN), titanium aluminide (TiAl), titanium aluminum nitride (TiAlN), tantalum carbon nitride (TaCN), tantalum carbide (TaC), tantalum silicon nitride (TaSiN) and combinations thereof.

In some example embodiments, the body insulator 102 and the gate insulation pattern 510 may include silicon oxide and the gate spacer 210 may include silicon nitride. Thus, the gate insulation pattern 510 may be formed only on the channel Ch and the side surfaces of the gate trench GT and may not be formed on the side surfaces and the bottom of the channel trench CT. However, the gate insulation pattern 510 may be formed on the side surfaces and the bottom of the channel trench CT when the compositions of the gate insulation pattern 510 and the body insulator 102 may be changed.

Figure 13A:
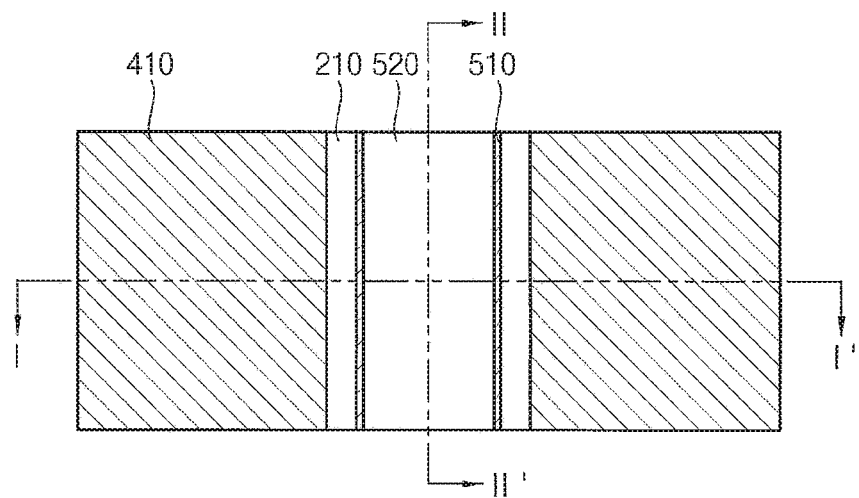
Figure 13B:
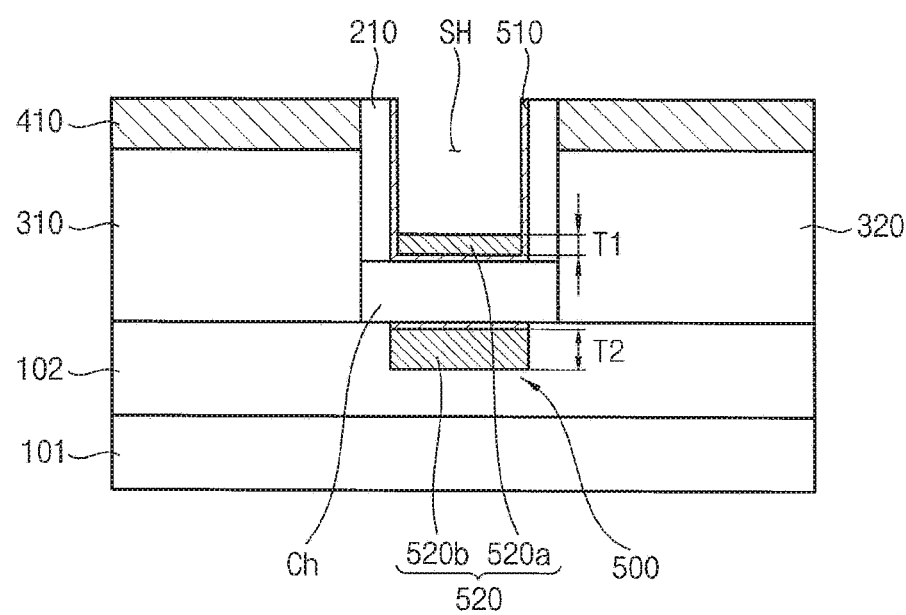

Referring to FIGS. 13A and 13B, an upper portion of the preliminary gate structure 500a may be removed from the substrate 100, and thus the gate structure 500 may be formed in a lower portion of the gate trench GT and the channel trench CT.

For example, the preliminary gate conductive pattern 529 may be partially etched from the substrate 100 by an etching process using the gate spacer 210 and the insulation interlayer pattern 410 as an etching mask, and thus the upper portion of the preliminary gate conductive pattern 529 may be etched off from the gate trench GT. Therefore, the upper portion of the gate trench GT may be opened again and a supplementary insulation hole SH may be provided at the upper portion of the gate trench GT.

In such a case, the preliminary gate conductive pattern 529 may be etched in such a way that the channel Ch may be sufficiently covered by the residuals of the preliminary gate conductive pattern 529 while an upper surface of the residuals of the preliminary gate conductive pattern 529 may be lower than the upper surface of the semiconductor junction 300 around the channel Ch.

In some example embodiments, the preliminary gate conductive pattern 529 may be etched to a depth of about 20 nm to about 40 nm, so that the supplementary insulation hole SH may have the depth of about 20 nm to about 40 nm from the upper surface of the gate spacer 210.

Accordingly, the preliminary gate conductive pattern 529 may be formed into the gate conductive pattern 520 that may cover the channel Ch and simultaneously fill up the channel trench CT. Thus, the gate conductive pattern 520 may include a covering portion 520a that may protrude from the channel Ch to a covering thickness T1 and may cover an upper portion of the channel Ch and a filling portion 520b that may fill up the channel trench CT with a filling thickness T2 and may cover a lower portion of the channel Ch. Particularly, the covering thickness T1 of the covering portion 520a may be controlled to be smaller than the filling thickness T2 of the filling portion 520b. The covering portion 520a may be exposed to surroundings through the supplementary insulation hole SH.

In a modified example embodiment, the gate insulation pattern 510 in the supplementary insulation hole SH may be further removed from the gate spacer 210 if necessary.

The same process as described in detail with reference to FIGS. 12A to 13B may be performed to the substrate 100 having the expanded trench ET shown in FIG. 11C, thereby forming the expanded gate conductive pattern 525 including the expanded portion 525c shown in FIG. 2B.

Figure 14A:
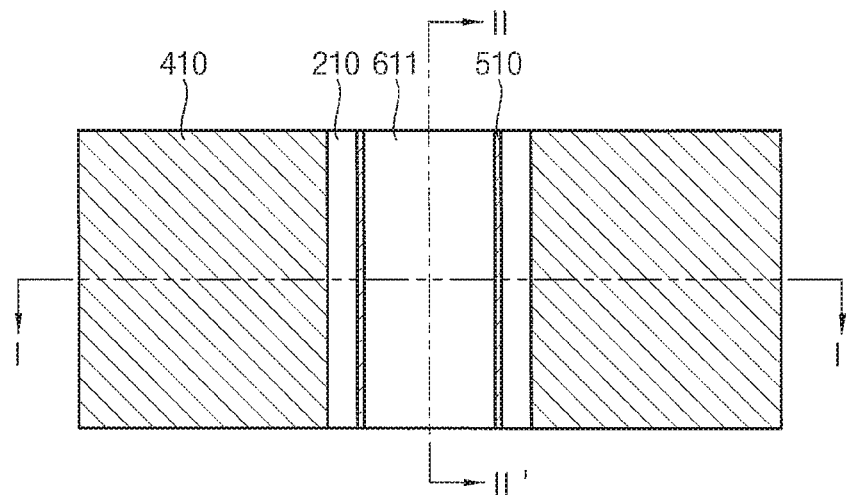
Figure 14B:
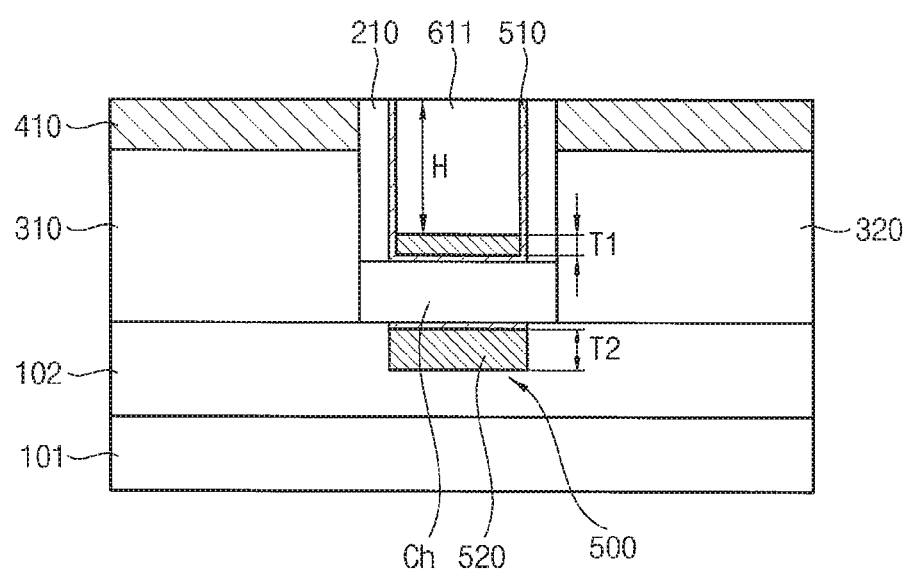

Referring to FIGS. 14A and 14B, the supplementary insulating member 611 may be formed in the supplementary insulation hole SH in such a way that an upper surface of the supplementary insulating member 611 may be coplanar with the upper surface of the insulation interlayer pattern 410.

For example, a supplementary insulating layer may be formed on the insulation interlayer pattern 410 to a sufficient thickness to fill up the supplementary insulation hole SH. Then, the supplementary insulating layer may be planarized until the upper surface of the insulation interlayer pattern 410 may be exposed, thereby forming the supplementary insulating member 611 in the supplementary insulation hole SH. Therefore, the supplementary insulating member 611 may have a height H of about 20 nm to about 40 nm.

Various insulation materials may be utilized for the supplementary insulating layer as long as the supplementary insulating layer may be sufficiently adhered to the covering portion 520a of the gate conductive pattern 520. For example, the supplementary insulating layer may include any one of silicon oxide, silicon nitride, silicon oxynitride and combinations thereof.

Figure 15A:
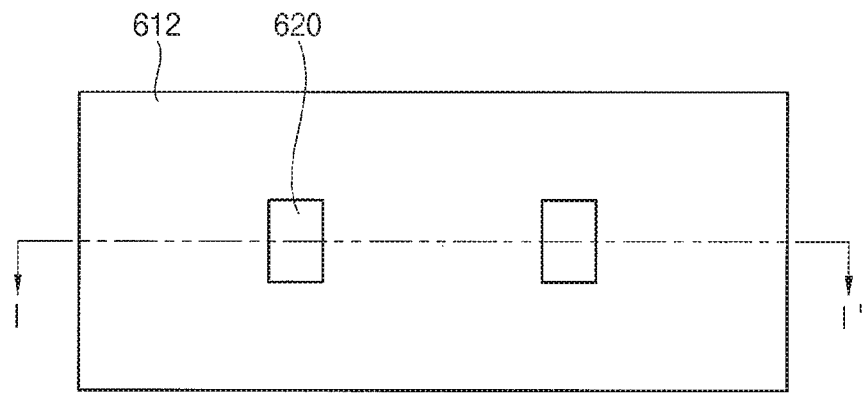
FIG. 15C is a cross-sectional view illustrating a processing operation/step for a method of enlarging the upper portion of the contact structure shown in FIG. 15B.
Figure 15B:
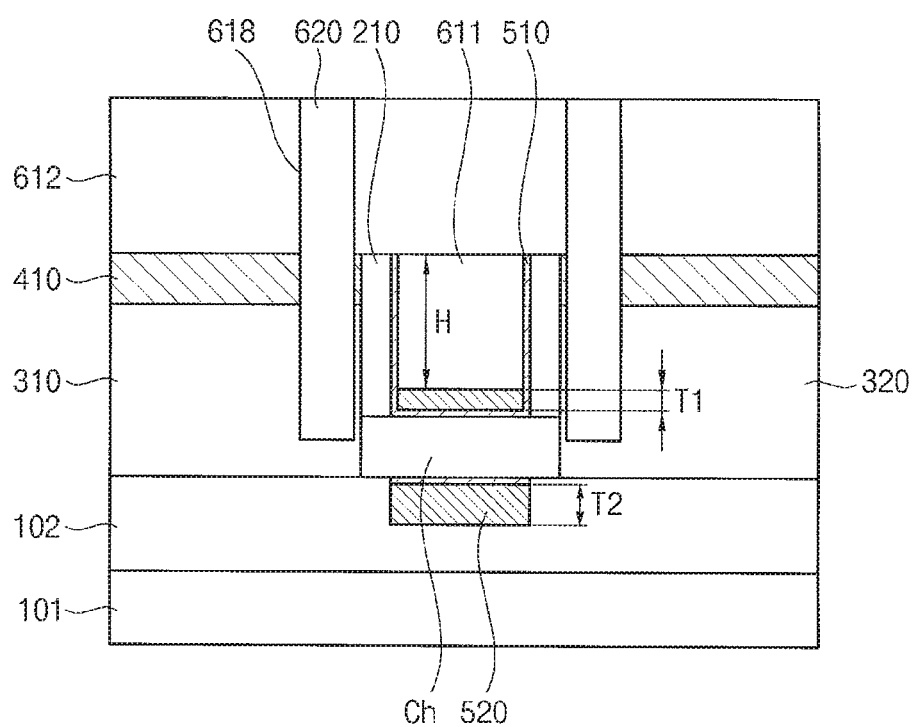

Referring to FIGS. 15A and 15B, the contact structure 620 may penetrate through the insulation interlayer pattern 410 and may make contact with the semiconductor junction 300.

For example, an additional insulation layer 612 may be formed on the substrate 100 having the insulation interlayer pattern 410, the gate spacer 210 and the supplementary insulating member 611, and the contact structure 620 may penetrate through the additional insulation layer 612 and the insulation interlayer pattern 410.

The additional insulation layer 612 may include any one of silicon oxide, silicon nitride, silicon oxynitride and combinations thereof. Otherwise, the additional insulation layer 612 may have the same materials as the insulation interlayer pattern 410.

Particularly, the supplementary insulating member 611 and the additional insulation layer 612 may include the same materials that may be formed on the substrate 100 in the same process. The supplementary insulating layer may be planarized to a uniform thickness on the insulation interlayer pattern 410, thereby forming the additional insulation layer 612 together with the supplementary insulating member 611 in one body. In such a case, the supplementary insulating member 611 and the additional insulation layer 612 may have the same insulation materials.

A contact hole 618 may be formed through the additional insulation layer 612 and the insulation interlayer pattern 410, and a conductive layer may be formed on the additional insulation layer 612 to a sufficient thickness to fill up the contact hole 618. Then, the conductive layer may planarized until an upper surface of the additional insulation layer 612 may be exposed, thereby forming the contact structure 620 filling up the contact hole 618 and making contact with the semiconductor junction 300. The contact structure 620 may include low-resistive metals such as tungsten (W), titanium (Ti), tantalum (Ta) and aluminum (Al).

In some embodiments, a metal silicide layer may be formed between the semiconductor junction 300 and the contact structure 620, thereby reducing contact resistance of the contact structure 620.

Thereafter, wiring structures connected to the contact structure 620 and other upper conductive structures may be further formed on the additional insulation layer 612 together with a passivation layer enclosing the wiring structure and the upper conductive structures, thereby manufacturing the semiconductor devices 1000.

In some modified example embodiments, an upper portion of the contact structure 620 may be enlarged to thereby decrease the contact resistance thereof.

Figure 15C:
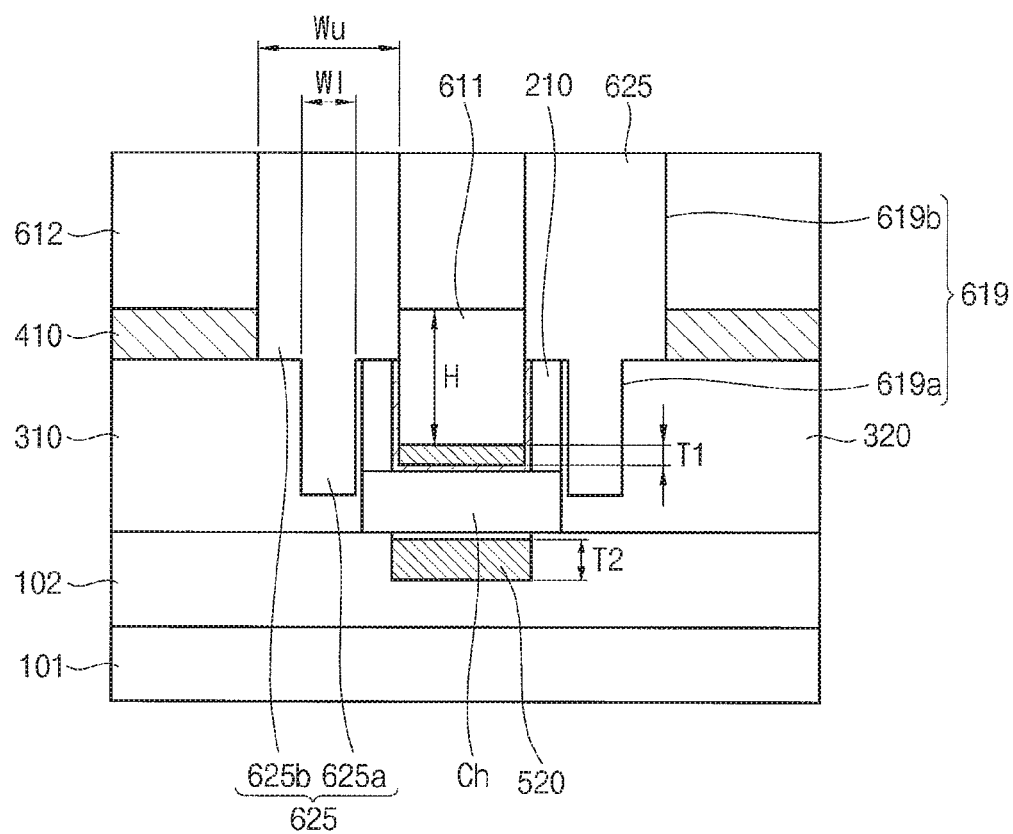

FIG. 15C is a cross-sectional view illustrating a processing step for a method of enlarging the upper portion of the contact structure shown in FIG. 15B.

Referring to FIG. 15C, an expanded contact hole 619 may be formed on/into the semiconductor junction 300 through the additional insulation layer 612 and the insulation interlayer pattern 410. The expanded contact hole 619 may include an upper hole 619b penetrating through the additional insulation layer 612 and the insulation interlayer pattern 410 and a lower hole 619a recessed in the semiconductor junction 300.

For example, after forming the contact hole 618 by the same process as described in detail with reference to FIG. 15B, the additional insulation layer 612 and the insulation interlayer pattern 410 may be further horizontally removed in the first direction x, so that an upper portion of the contact hole 618 may be expanded in the first direction x. Thus, the contact hole 618 maintained unchanged in the semiconductor junction 300 may be formed in the lower hole 619a having a lower width $W_l$ and the expanded contact hole 619 expanded in the additional insulation layer 612 and the insulation interlayer pattern 410 may be formed to include the upper hole 619b having an upper width $W_u$.

Particularly, an upper portion of the gate spacer 210 may be removed from the substrate 100 together with the insulation interlayer pattern 410 when expanding the upper portion of the contact hole 618, so that an upper surface of the gate spacer 210 may be exposed through the upper hole 619b. When the insulation interlayer pattern 410 and the gate spacer 210 may comprise the same materials and the supplementary insulating member 611 may comprise different materials from the insulation interlayer pattern 410 and the gate spacer 210, the upper hole 619b may be accurately/precisely expanded over the gate spacer 210 and the side surface of the supplementary insulating member 611 may be exposed through the upper hole 619b.

Thereafter, conductive materials may be filled into the expanded contact hole 619 to thereby form the expanded contact structure 625 of which the upper portion may be expanded over the gate spacer 210 in the first direction x.

Thus, the expanded contact structure 625 may include a lower contact 625a that may be inserted into the semiconductor junction 300 and having the lower width $W_1$ and an upper contact 625b making contact with both of the semiconductor junction 300 and the gate spacer 210 in one body with the lower contact 625a. The upper contact 625b may have the upper width $W_u$ greater than the lower width $W_l$. That is, the expanded structure 625 may include a plug that may be inserted into the semiconductor junction 300 and an expansion top integrally formed with the plug in one body and having an enlarged surface area.

Therefore, the expanded contact structure 625 may have a larger surface area than the contact structure 620, thereby reducing the contact resistance and increasing the process margin for forming the contact structure.

While some example embodiments disclose that the supplementary insulating member 611 may be exposed through the upper hole 619b and thus the upper hole 619b may be defined by the supplementary insulating pattern 611, a side portion of the supplementary insulating member 611 may be further removed together with the gate spacer 210 and the upper hole 619b may partially overlap the supplementary insulating member 611. In such a case, the supplementary insulating member 611 may be overlapped by the upper contact 625b as long as neighboring ones of the upper contacts 625b may be electrically separated from each other by the supplementary insulting member 611.

According to the above example embodiments of the method of manufacturing semiconductor devices, the channel trench CT may be formed under the channel Ch in the body insulator 102 and the gate structure 500 may be formed to fill up the channel trench CT and to enclose the channel Ch. The gate structure 500 may include the covering portion 520a on the channel Ch and the filling portion 520b in the channel trench CT. The covering portion 520a may have a covering thickness T1 as small/thin as possible on the condition that the channel Ch may be sufficiently covered with gate conductive materials and the filling portion 520b may have a sufficient thickness T2 for compensating for the deterioration of the electric characteristics caused by the height reduction of the gate structure 500.

Thus, the filling thickness T2 may be sufficiently greater than the covering thickness T1 and the gate structure 500 may be arranged in a reverse structure such that a larger portion may be arranged below the channel Ch and a smaller portion may be arranged on the channel Ch. Therefore, the overlap area of the contact structure 620 and the gate structure 500 may decrease and thus the parasitic capacitance may be reduced/minimized between the contact structure 620 and the gate structure 500. Particularly, the parasitic capacitance between the contact structure 620 and the gate structure 500 may be sufficiently reduced/prevented even when the gate spacer 210 may become narrow due to a size reduction of the semiconductor device 1000.

In addition, the upper portion of the contact structure 620 and the lower portion of the gate structure 500 may be horizontally expanded and thus the surface area of the contact structure 620 and the gate structure 500 may increase. Thus, the electrical resistance of the contact structure 620 and the gate structure 500 may be stable and reliable in spite of the size reduction of the semiconductor device 1000.

Figure 16A:
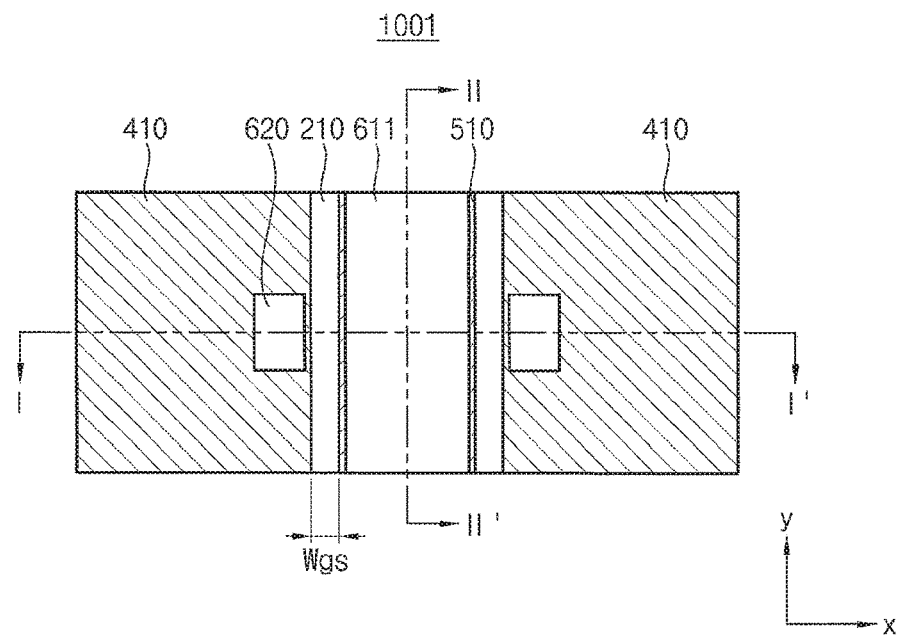
FIG. 16A is a plan view illustrating a semiconductor device in accordance with some example embodiments of present inventive concepts.
Figure 16B:
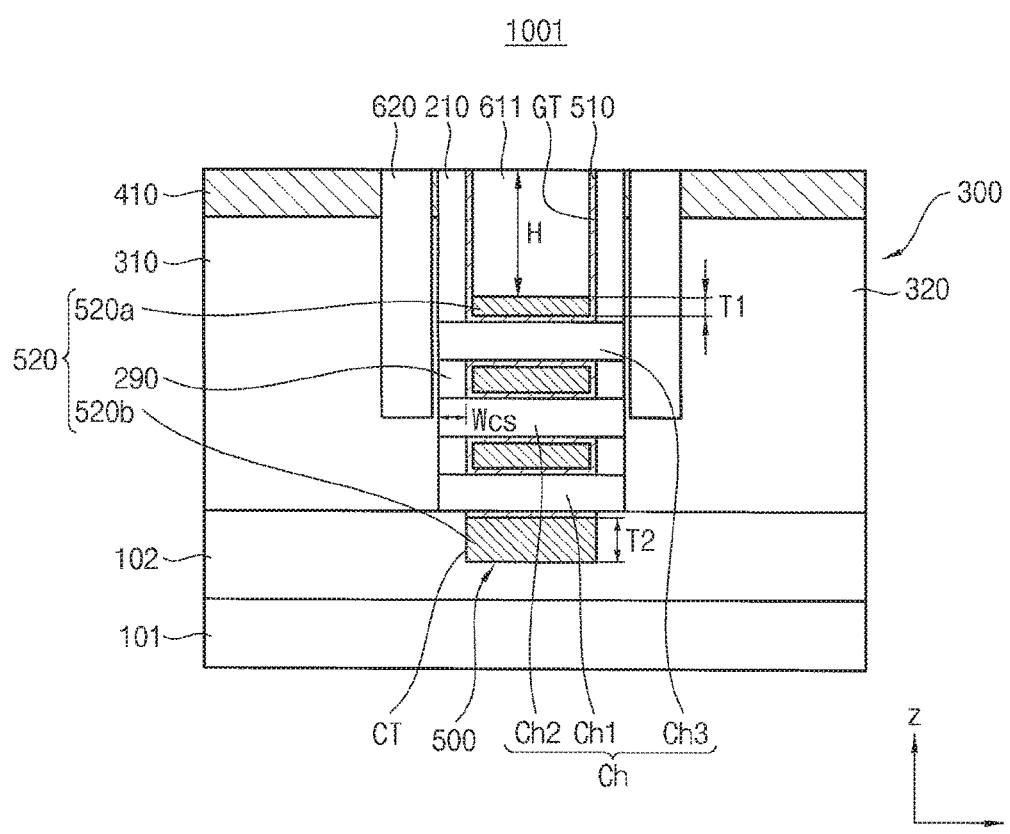
FIG. 16B is a cross-sectional view cut along a line I-I' of FIG. 16A.
Figure 16C:
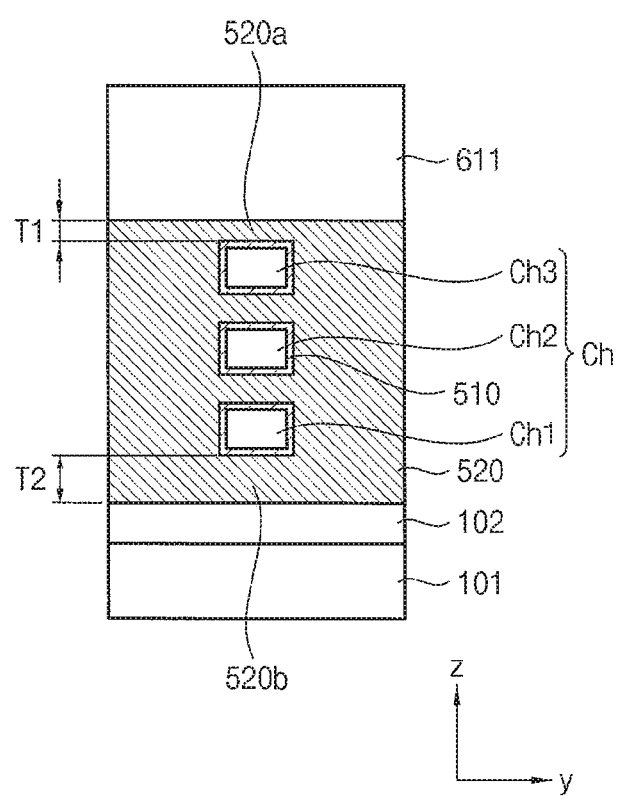
FIG. 16C is a cross-sectional view cut along a line II-II' of FIG. 16A.

FIG. 16A is a plan view illustrating a semiconductor device in accordance with some example embodiments of present inventive concepts. FIGS. 16B and 16C are cross-sectional views cut along a line I-I' and a line II-II' of FIG. 16A, respectively. In FIGS. 1A to 1C, the line I-I' extends along a fin shaped active region of the semiconductor device and the line II-II' extends along a gate line of the semiconductor device. The semiconductor device in FIGS. 16A to 16C has substantially the same structures as the semiconductor device in FIGS. 1A to 1C, except for the number/quantity of channels. Thus, in FIGS. 16A to 16C, the same reference numerals denote the same elements in FIGS. 1A to 1C and any further detailed descriptions on the same elements may be omitted hereinafter, Referring to FIGS. 16A to 16C, the semiconductor device 1001 in accordance with some example embodiments of present inventive concepts may include the channel Ch having a plurality of unit channels Ch1 to Ch3 that may be vertically spaced apart by the same gap distance on and over the body insulator 102 and make contact with the semiconductor junction 300 in the first direction x.

In some example embodiments, the channel Ch may include a lowermost unit channel Ch1 arranged on the body insulator 102 and crossing over the channel trench CT, a middle unit channel Ch2 spaced apart from the lowermost unit channel Ch1 in a third direction z by the gap distance and extending in parallel with the lowermost unit channel Ch1 and an uppermost unit channel Ch3 spaced apart from the middle unit channel Ch2 in the third direction z by the gap distance and extending in parallel with the middle unit channel Ch2. The channel Ch may also include four or more unit channels as the channel Ch. In such a case, the middle unit channel includes all of the other unit channels except for the uppermost and the lowermost unit channels.

The lowermost unit channel Ch1, the middle unit channel Ch2 and the uppermost unit channel Ch3 may be individually connected to the semiconductor junction 300, so that each of the unit channels Ch1 to Ch3 may function as an individual flow path of the charges between the source junction 310 and the drain junction 320. For example, each of the unit channels Ch1 to Ch3 may include a nano wire structure.

Figure 26A:
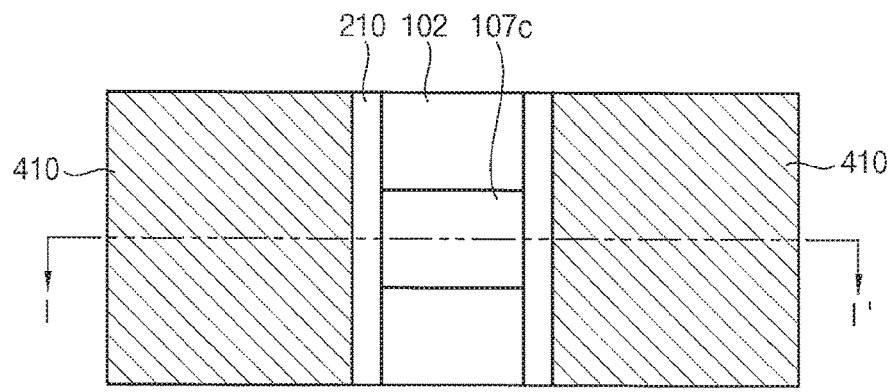
Figure 26B:
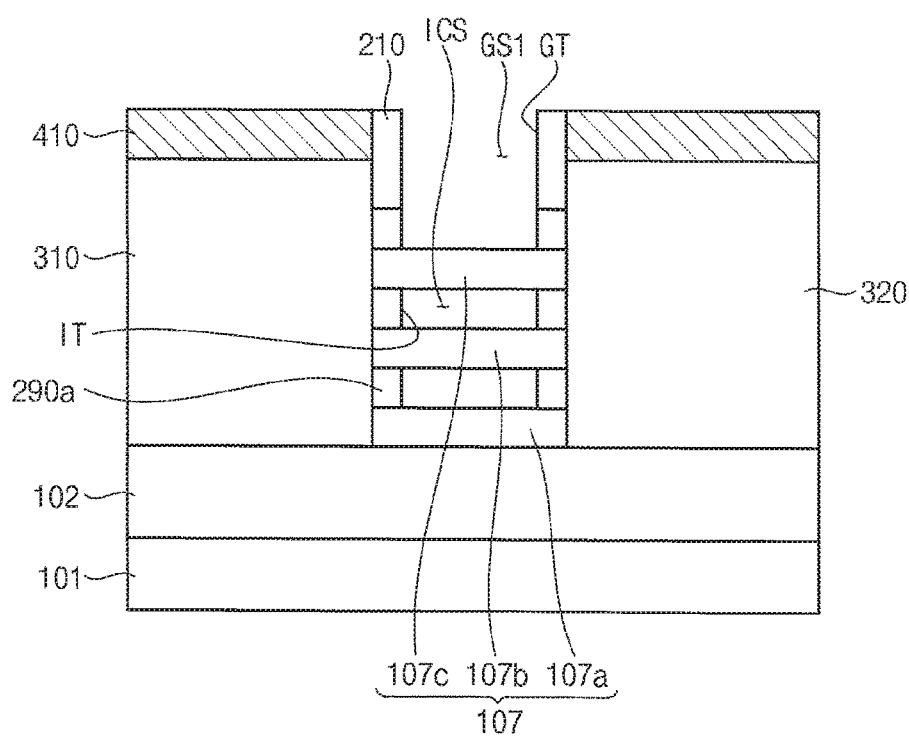

An inter-channel space ICS in FIG. 26B may be provided between the neighboring unit channels along the third direction z and may be filled with the gate conductive pattern 520 in a following process. Thus, each of the unit channels Ch1 to Ch3 may be individually enclosed by the gate conductive pattern 520 and the channel Ch may be formed into the GAA structure.

A channel spacer 290 may be interposed between the gate conductive pattern 520 and the semiconductor junction 300 in the inter-channel space ICS, so that the semiconductor junction 300 may be electrically isolated from the gate conductive pattern 520 by the channel spacer 290 in the inter-channel space ICS.

That is, the channel spacer 290 may make contact with a pair of the neighboring unit channels, the semiconductor junction 300 and the gate conductive pattern 520 in the inter-channel space ICS, so that the neighboring unit channels, the semiconductor junction 300 and the gate conductive pattern 520 may be electrically isolated from one another in the inter-channel space ICS.

The gate structure 500 may include the gate insulation pattern 510 enclosing each of the unit channels Ch1 to Ch3 and the gate conductive pattern 520 filling up a lower portion of the gate trench GT, the inter-channel space(s) ICS and the channel trench CT. The gate structure 500 may be shaped into a line extending in the first direction x.

Particularly, a lower portion of the gate structure 500 may be inserted into the body insulator 102 in such a configuration that the channel trench CT may be filled up with the gate structure 500 and an upper portion of the gate structure 500 may be arranged around the uppermost unit channel Ch3 in such a configuration that the uppermost unit channel Ch3 may be sufficiently covered with the gate structure 500 and an upper surface of the gate conductive pattern 520 may be lower than an upper surface of the semiconductor junction 300. Thus, the gate conductive pattern 520 may include the covering portion 520*a* that may protrude from the uppermost unit channel Ch3 and may cover an upper portion of the uppermost unit channel Ch3, and the filling portion 520*b* that may fill the channel trench CT and may cover a lower portion of the lowermost unit channel Ch1.

In such a case, the covering portion 520*a* may have the covering thickness T1 as small as possible on the condition that the uppermost unit channel Ch3 may be sufficiently covered with gate conductive pattern 520 and the filling portion 520*b* may have a sufficient thickness for compensating for the deterioration of the electric characteristics caused by the height reduction of the gate conductive pattern 520. Therefore, the filling thickness T2 of the filling portion 520*b* may be greater than the covering thickness T1.

The covering portion 520*a* may be electrically isolated from the semiconductor junction 300 by the gate spacer 210 and the gate conductive pattern 520 in the inter-channel space ICS may be electrically isolated from the semiconductor junction 300 by the channel spacer 290. In some example embodiments, the width Wcs of the channel spacer 290 may be the same as the width Wgs of the gate spacer 210, thus the channel spacer 290 may be vertically overlapped by the gate spacer 210, and may have the uppermost unit channel Ch3 therebetween. Moreover, a first of the channel spacers 290 may vertically overlap a second of the channel spacers 290, and the first and second channel spacers 290 may have the middle unit channel Ch2 therebetween. That is, the side surfaces of the channel spacer 290 may be vertically aligned with a side surface of the gate spacer 210 in the gate trench GT. The filling portion 520*b* may be electrically isolated from its surroundings by the body insulator 102.

The supplementary insulating member 611 may be positioned on the gate conductive pattern 520 and thus the gate conductive pattern 520 may be protected from its surroundings. Particularly, the upper surface of the supplementary insulating member 611 may be coplanar with the upper surface of the gate spacer 210.

Therefore, the gate spacer 210 may make contact with insulation materials across a larger contact area than the gate spacer 210 may contact with conductive materials. Thus, the capacitance area between the contact structure 620 and the gate conductive pattern 520, which may be opposite to each other with respect to the gate spacer 210, may be sufficiently reduced, so that the parasitic capacitance may be reduced/minimized between the contact structure 620 and the gate structure 500. That is, the parasitic capacitance may be effectively limited to being between the contact structure 620 and the covering portion 520a, and thus the parasitic capacitance between the contact structure 620 and the gate structure 500 may be sufficiently reduced in spite of the reduction of the width Wgs of the gate spacer 210.

In addition, the filling thickness T2 of the filling portion 520b may be greater than the covering thickness T1 in the semiconductor device 1001. The covering portion 520a may have the covering thickness T1 as small as possible on the condition that the uppermost unit channel Ch3 may be sufficiently covered with the gate conductive pattern 520 and the filling portion 520b may have a sufficient thickness for compensating for the deterioration of the electric characteristics caused by the height reduction of the gate conductive pattern 520.

Thus, the filling thickness T2 may be sufficiently greater than the covering thickness T1 and the gate structure 500 may be arranged in a reverse structure such that a larger portion may be arranged below the channel Ch and a smaller portion may be arranged on/above the channel Ch.

Therefore, the overlap area of the contact structure 620 and the gate structure 500 may decrease and thus the parasitic capacitance may be reduced/minimized between the contact structure 620 and the gate structure 500 even when the gate spacer 210 may become narrow due to the size reduction of the semiconductor device 1001.

In addition, the upper portion of the contact structure 620 and the lower portion of the gate structure 500 may be horizontally expanded, and thus the surface area of the contact structure 620 and the gate structure 500 may increase.

Since the supplementary insulating member 611 may be arranged on the gate conductive pattern 520 and may comprise insulation materials instead of conductive materials and the contact structure 620 may face the supplementary insulating member 611 (with the gate spacer 210 intervening between the contact structure 620 and the supplementary insulating member 611), the contact structure 620 may be expanded over the gate spacer 210 and as a result, the surface area of the contact structure 620 may increase without any increase of the parasitic capacitance, thereby reducing the contact resistance of the contact structure 620. In addition, the process margin may also increase in forming the contact structure 620.

In the same way, the channel trench CT may also be expanded in the first direction x to thereby form an expansion trench and as a result, the lower portion of the gate conductive pattern 520 may also be expanded in the first direction x. Therefore, the surface area of the gate conductive pattern 520 may increase and the electrical resistance of the gate structure 500 may decrease. That is, the gate driving voltage may decrease just by expanding the channel trench CT in the body insulator 102.

Figure 17A:
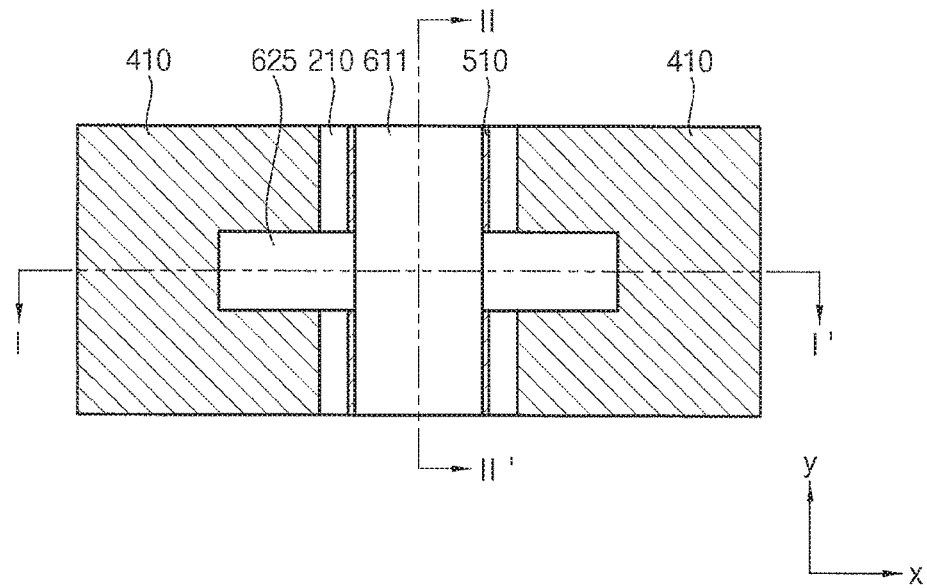
FIG. 17A is a plan view illustrating a modification of the semiconductor device shown in FIG. 16A.
Figure 17B:
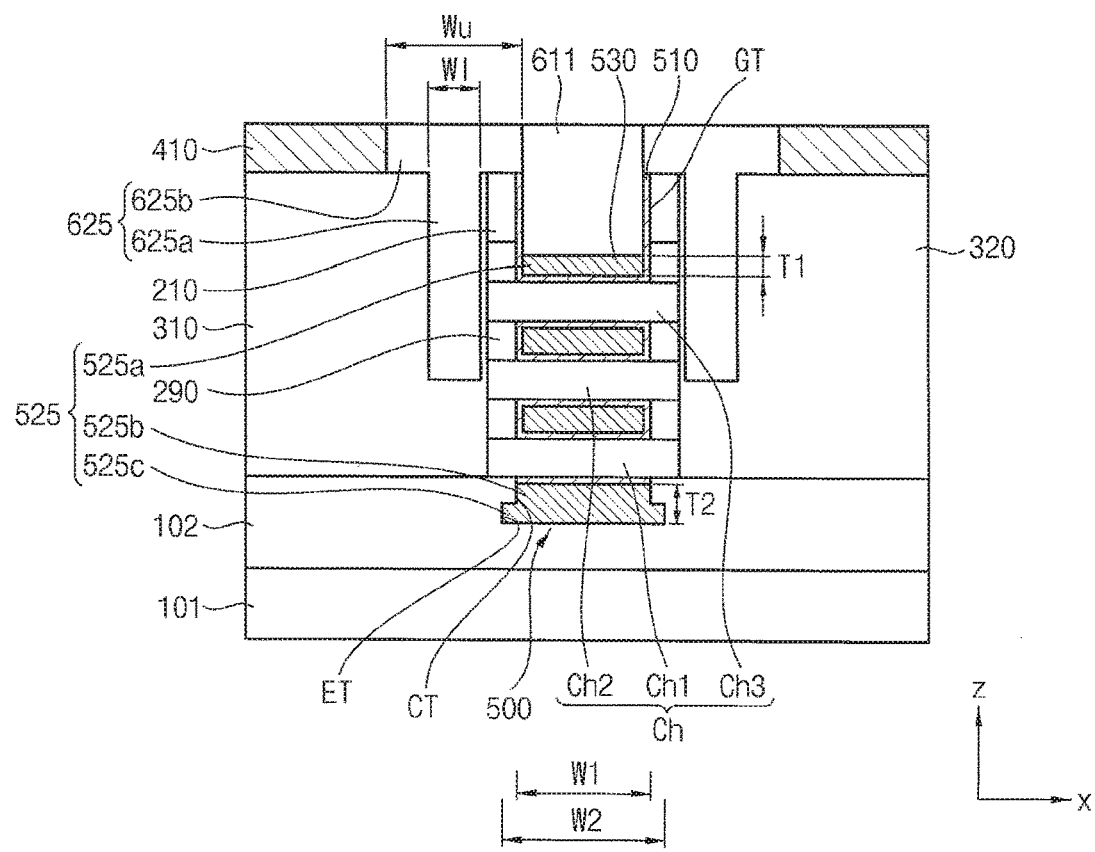
FIG. 17B is a cross-sectional view cut along a line I-I' of FIG. 17A.
Figure 17C:
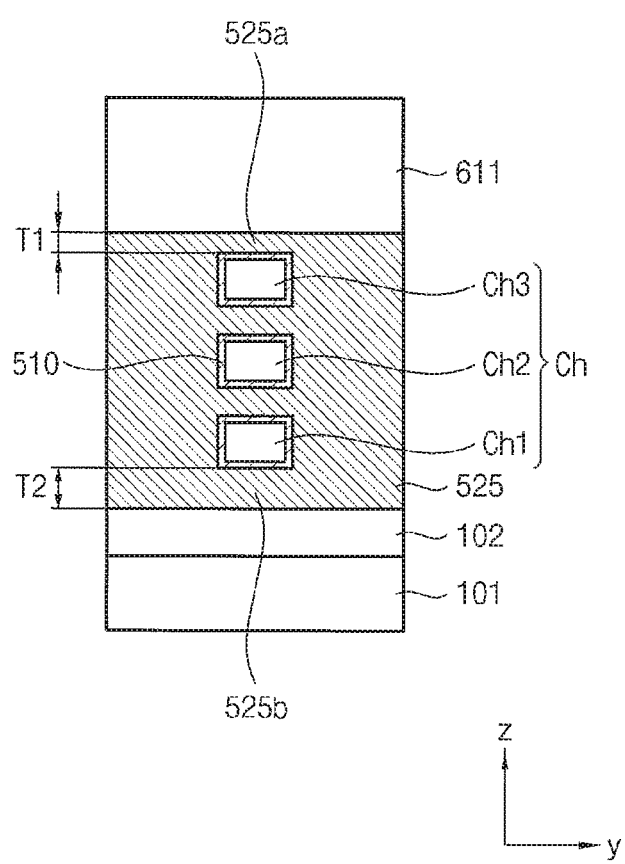
FIG. 17C is a cross-sectional view cut along a line II-II' of FIG. 17A.

FIG. 17A is a plan view illustrating a modification of the semiconductor device shown in FIG. 16A. FIGS. 17B and 17C are cross-sectional views cut along a line I-I' and a line II-II' of FIG. 17A, respectively. In FIGS. 17A to 17C, the modification of the semiconductor device has substantially the same structures as the semiconductor device 1001 shown in FIGS. 16A to 16C, except that the contact structure and the gate conductive pattern are expanded, so the same reference numerals denote the same elements in FIGS. 16A to 16C. Further detailed descriptions on the same elements may be omitted hereinafter.

Referring to FIGS. 17A to 17C, the gate structure 500 may include an expanded gate conductive pattern 525 having a covering portion 525a, a filling portion 525b and an expanding (e.g., expanded) portion 525c. The covering portion 525a may cover the upper portion of the uppermost unit channel Ch3 and the filling portion 525b may cover the lower portion of the lowermost unit channel Ch1 and fill up the channel trench CT. The expanding portion 525c may be provided under the filling portion 525b and may fill an expanded trench ET that may be communicated/connected with the channel trench CT.

The expanded trench ET may be arranged under the channel trench CT and may have a second width W2 larger than a first width W1 of the channel trench CT. The covering portion 525a, the filling portion 525b and the expanding portion 525c may have substantially the same structures as the covering portion 520a, the filling portion 520b and the expanding portion 525c of the semiconductor devices 1000 shown FIGS. 2B and 2C, thus any further descriptions on the covering portion 525a, the filling portion 525b and the expanding portion 525c may be omitted.

Since the surface area of the gate structure 500 may increase due to the expanded portion 525c, the electrical resistance of the gate structure 500 may decrease and as a result, the driving voltage applied to the gate structure 500 may also be decreased. Particularly, when the widths of the gate trench GT and the channel trench CT may decrease unexpectedly and thus the widths of the covering portion 525a and the filling portion 525b may be over reduced, the expanding portion 525c may compensate for the reduction of the covering portion 525a and the filling portion 525b, thereby reducing/preventing the increase of the overall resistance of the gate structure 500.

Further, an upper portion of the contact structure 620 may be expanded in the first direction x, thereby forming an expanded contact structure 625 to cover the gate spacer 210. That is, the expanded contact structure 625 may include a lower contact 625a inserted into the semiconductor junction 300 and having a lower width $W_l$ and an upper contact 625b making contact with both of the semiconductor junction 300 and the gate spacer 210 in one body with the lower contact 625a. The upper contact 625b may have an upper width $W_u$ greater than the lower width $W_l$ of the lower contact 625a.

The lower contact 625a and the upper contact 625b may have substantially the same structures as the lower contact 625a and the upper contact 625b of the semiconductor device 1000 shown FIGS. 2B and 2C, thus any further descriptions on the lower contact 625a and the upper contact 625b may be omitted.

The increase of the surface area of the expanded contact structure 625 may decrease the contact resistance and increase the process margin for forming the expanded contact structure 625.

According to the above example embodiments of the semiconductor device, the gate structure may fill up the channel trench in the body insulator and may enclose a plurality of the unit channels in such a configuration that the filling portion of the gate structure filling in the channel trench has a greater width than the covering portion of the gate structure on the channel and the covering portion may be lower than the gate spacer. The supplementary insulating member may be positioned on the gate structure in such a way that the upper surface of the supplementary insulating member may be coplanar with the upper surface of the gate spacer. Therefore, the parasitic capacitance may be reduced/minimized between the contact structure and the gate structure. In addition, the electrical resistance of the contact structure and the gate structure may be stable and reliable in spite of the size reduction of the semiconductor device.

FIGS. 18A to 32B are views illustrating the processing steps for a method of manufacturing the semiconductor devices shown in FIGS. 16A to 16C. In FIGS. 18A to 32B, the alphabetic letter A in each figure number denotes a plan view of each processing step and the alphabetic letter B in each figure number denotes a cross-sectional view cut along the line I-I' of FIG. 16A.

Figure 18A:
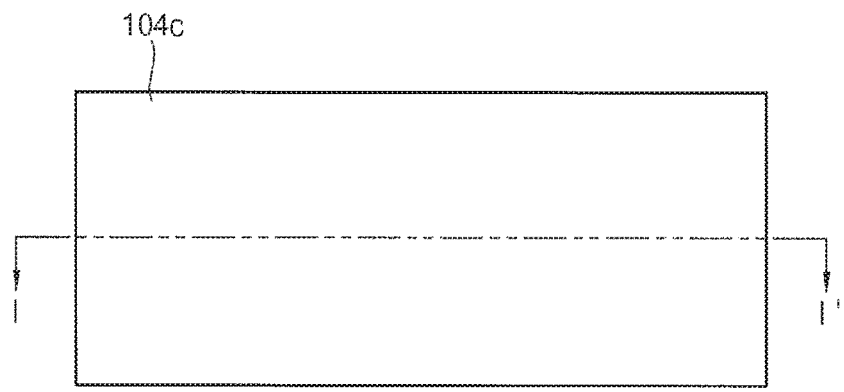
FIGS. 18A to 32B are views illustrating processing operations/steps for a method of manufacturing the semiconductor devices shown in FIGS. 16A to 16C.
Figure 18B:
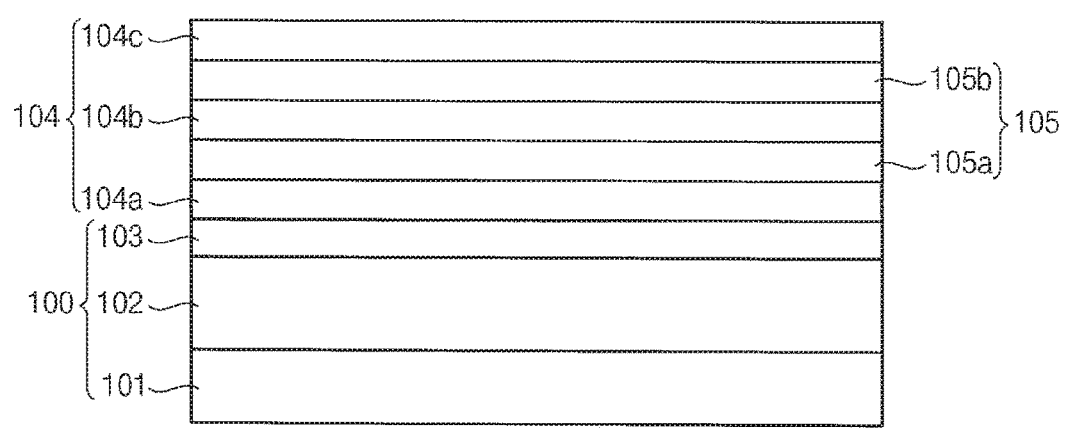

Referring to FIGS. 18A and 18B, a sacrificial layer 104 and a semiconductor layer 105 may be formed on the semiconductor substrate 100 having the body insulator 102.

For example, a silicon-on-insulator (SOI) substrate may be provided as the semiconductor substrate 100 in which the body insulator 102 may be formed on the base body 101 comprising silicon (Si) and the semiconductor substrate layer 103 may be formed on the body insulator 102. The substrate 100 may have substantially the same structures as the substrate 100 described in detail with reference to FIGS. 3A and 3B, thus any further detailed descriptions on the substrate 100 may be omitted.

A plurality of the sacrificial layers 104 and a plurality of the semiconductor layers 105 may be alternately formed on the substrate layer 103. For example, a first sacrificial layer 104a may be formed on the substrate layer 103 and a first semiconductor layer 105a may be formed on the first sacrificial layer 104a. Further, a second sacrificial layer 104b may be formed on the first semiconductor layer 105a and a second semiconductor layer 105b may formed on the second sacrificial layer 104b. A third sacrificial layer 104c may be formed on the second semiconductor layer 105b.

For example, the sacrificial layer 104 and the semiconductor layer 105 may be formed on the substrate 100 by a deposition process such as a CVD process or a PVD process. The sacrificial layer 104 may include silicon germanium (SiGe) or indium phosphorous (InP) and the semiconductor layer 105 may include single crystalline silicon just like the substrate layer 103. However, various semiconductor materials may be utilized for the semiconductor layer 105 as long as the semiconductor layer 105 may have sufficient etching selectivity with respect to the sacrificial layer 104. For example, the semiconductor layer 105 may include semiconductor compositions including the elements of Group III to Group V.

Since the substrate layer 103 and the semiconductor layer 105 may be formed into the channel Ch of the semiconductor device 1001, the number/quantity of the semiconductor layers 105 may be varied according to the number/quantity of the unit channels of the channel Ch. In some example embodiments, the channel Ch may include three unit channels Ch1 to Ch3, and the first and the second semiconductor layers 105a and 105b may be formed on the substrate 100.

Figure 19A:
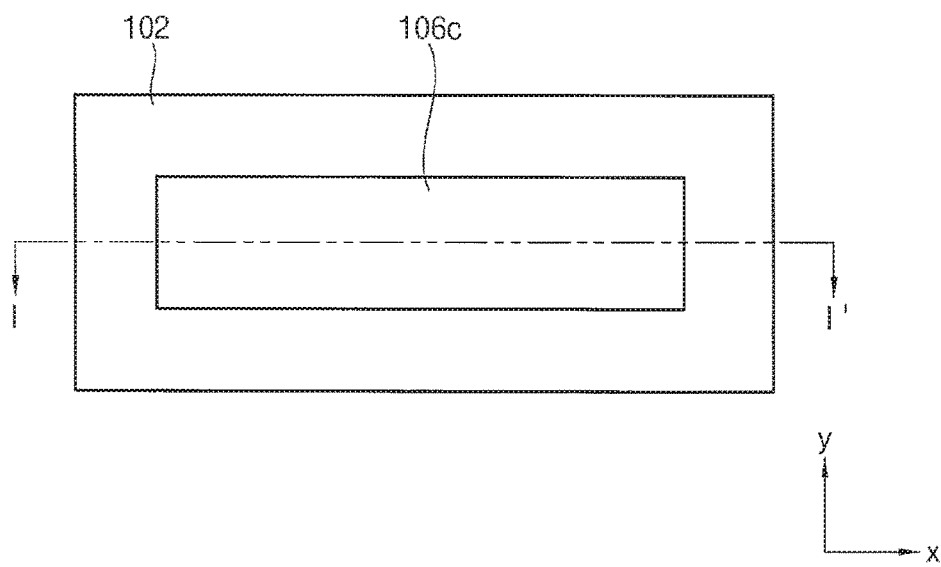
Figure 19B:
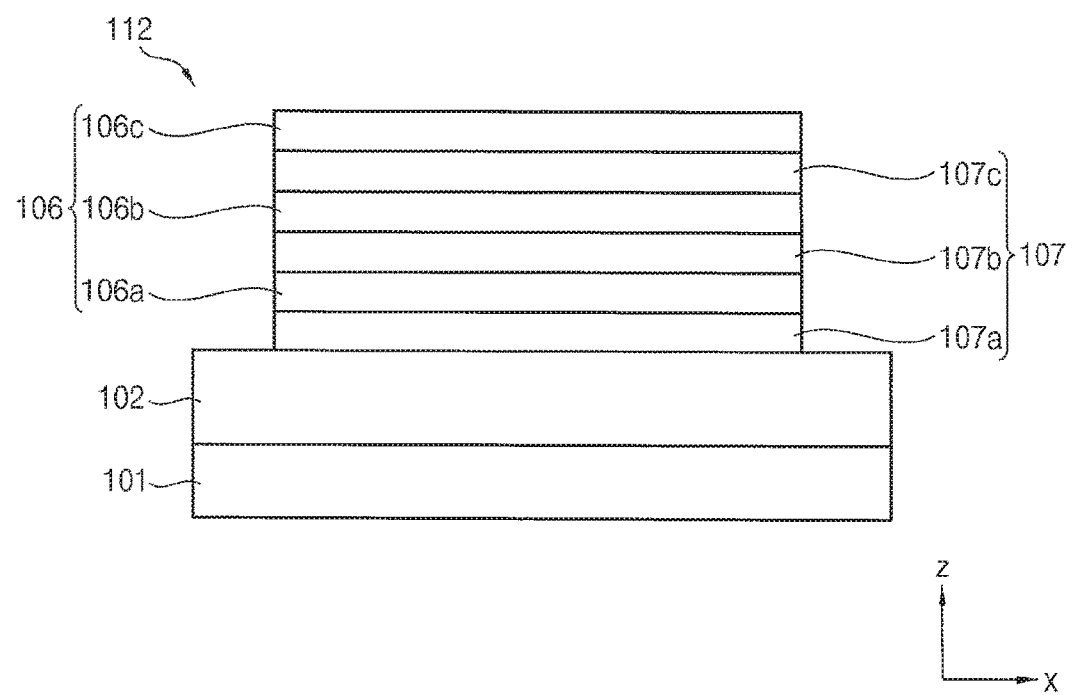
Figure 20A:
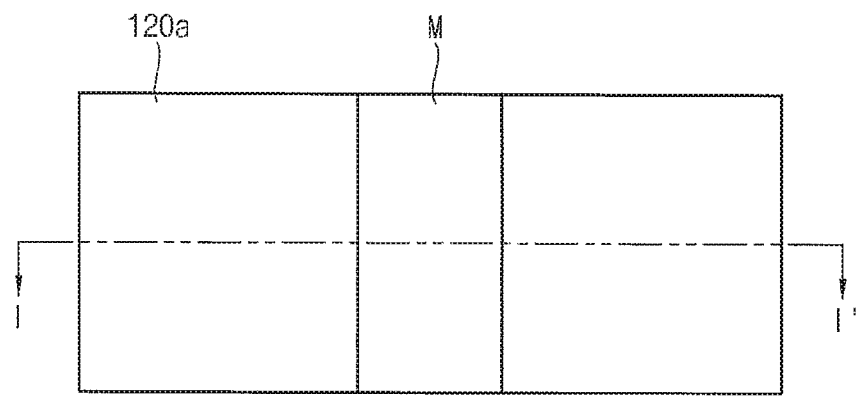
Figure 20B:
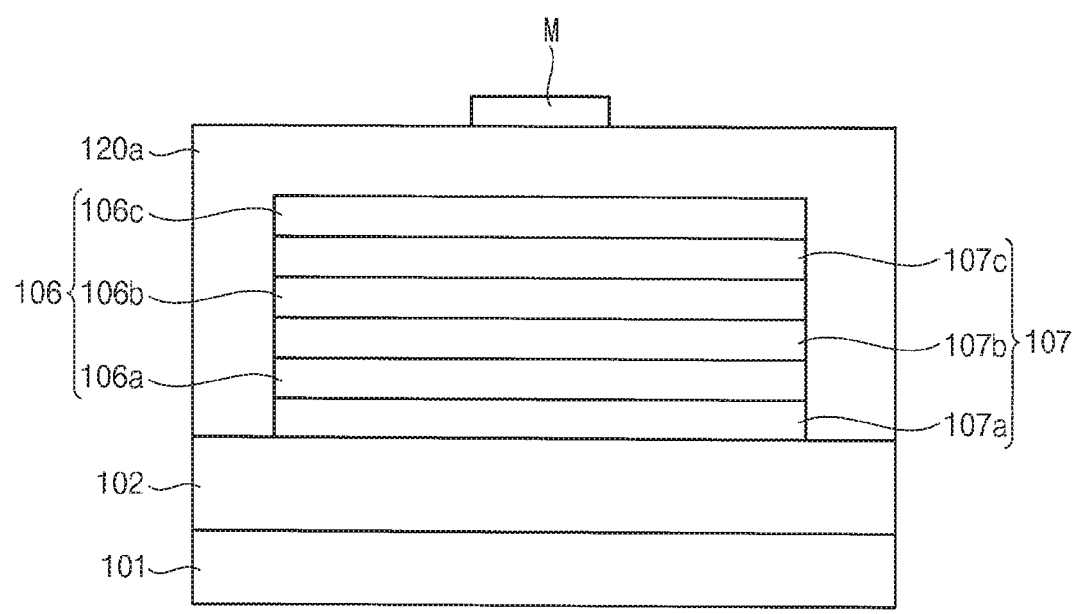
Figure 21A:
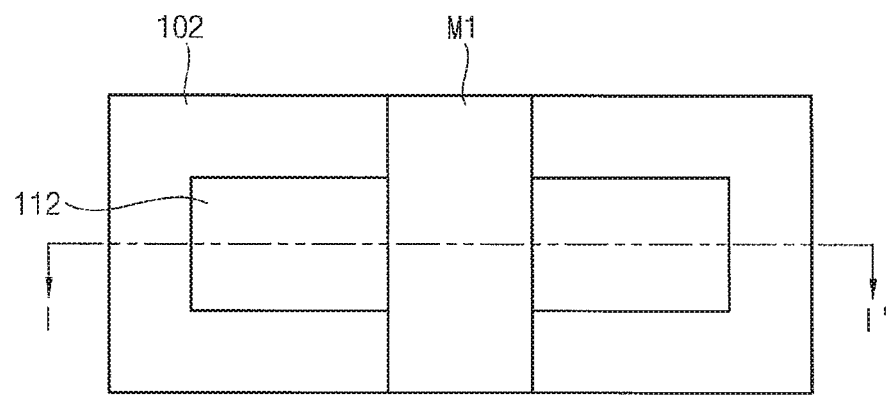
Figure 21B:
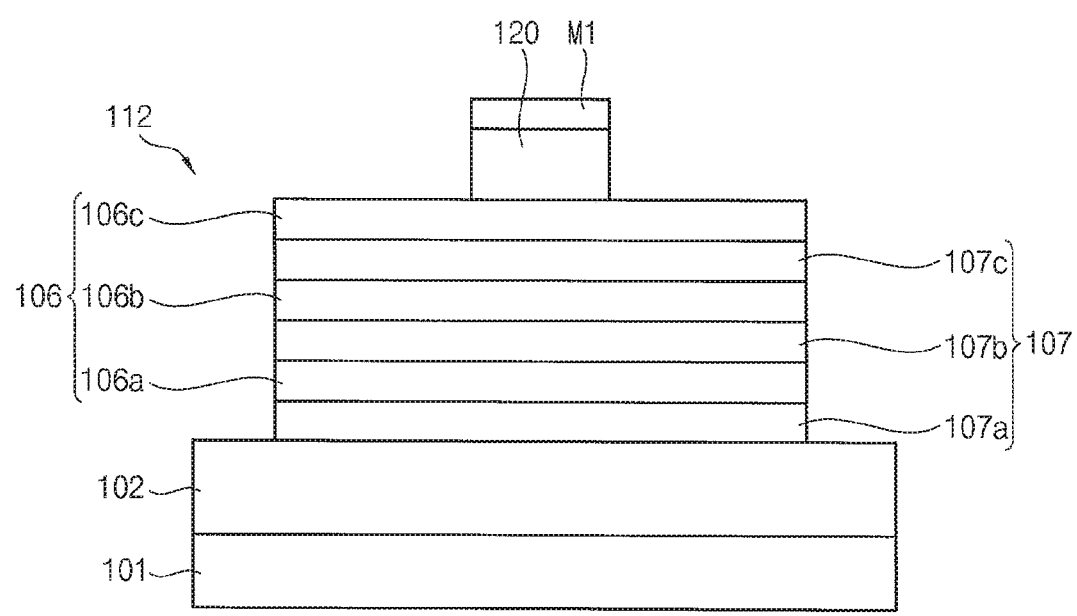
Figure 22A:
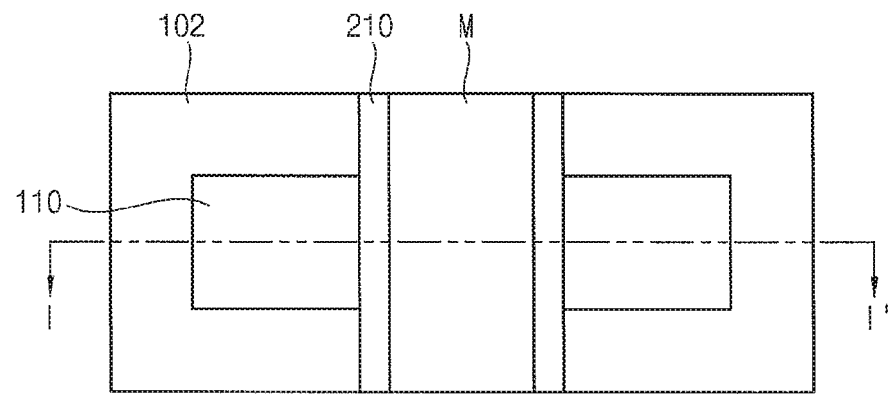
Figure 22B:
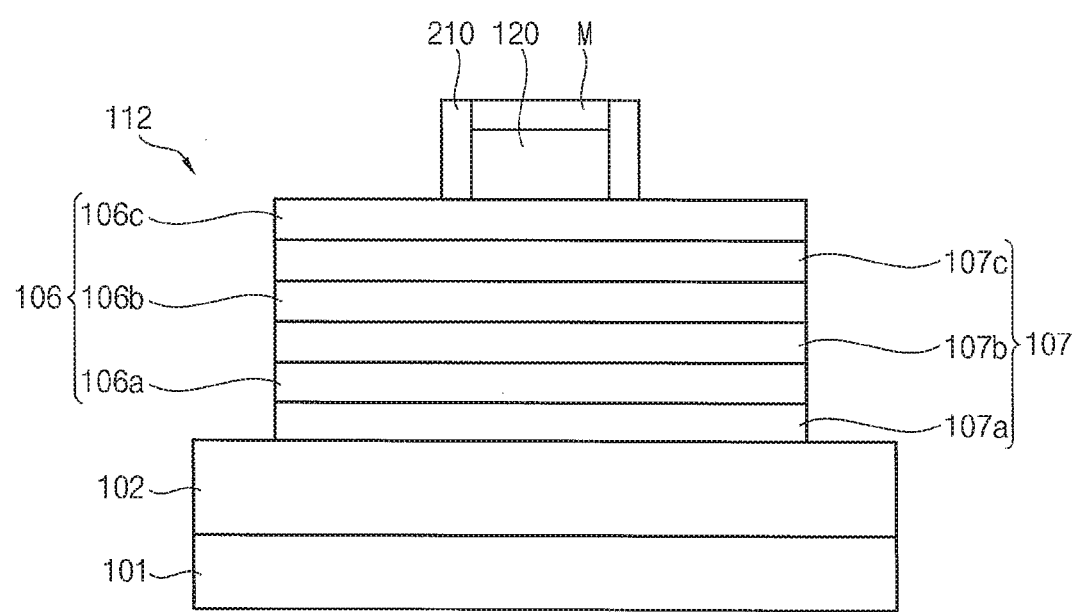

Referring to FIGS. 19A and 19B, a stacked active fin 112 may be formed on the body insulator 102 by the same process as described in detail with reference to FIGS. 4A and 4B in such a way that the stacked active fin 112 may protrude from the body insulator 102 and may be shaped into a line extending in the first direction x. The stacked active fin 112 may include a sacrificial pattern 106 having a plurality of sacrificial fins 106a to 106c and a semiconductor pattern 107 having a plurality of semiconductor fins 107a to 107c. The semiconductor fins 107a to 107c and the sacrificial fins 106a to 106c may be alternately stacked on the body insulator 102, thereby forming the stacked active fin 112.

The substrate layer 103 may be formed into the first semiconductor fin 107a of the semiconductor pattern 107 and the first and the second semiconductor layers 105a and 105b may be formed into the second and third semiconductor fins 107b and 107c of the semiconductor pattern 107. The first to third sacrificial layers 104a to 104c may be formed into the first to third sacrificial fins 106a to 106c of the sacrificial pattern 106. The first semiconductor fin 107a may be arranged on the body insulator 102, and the first to third sacrificial fins 106a to 106c may be alternately arranged on the first to third semiconductor fins 107a to 107c, respectively.

Referring to FIGS. 20A to 22B, a dummy gate layer 120a may be formed on the substrate 100 to a sufficient thickness to cover the stacked active fin 112 and a dummy mask pattern M may be formed on the dummy gate layer 120a in a shape of a line extending in the second direction y. The dummy gate layer 120a may be partially removed from the substrate 100 by an etching process using the dummy mask pattern M as an etching mask, thereby forming the dummy gate line 120 extending in the second direction y. The gate spacer 210 may be formed on each sidewall of the dummy gate line 120 so that the gate spacer 210 may also extend in the second direction y at each side of the dummy gate line 120.

The stacked active fin 112 may extend in the first direction x and the dummy gate line 120 and the gate spacer 210 may extend in the second direction y, and thus the stacked active fin 112 may be partially covered with the dummy gate line 120 and the gate spacer 210. In some example embodiments, a central portion of the third sacrificial fin 106c may be covered with the dummy gate line 120 and the gate spacer 210, and both sides of the third sacrificial fin 106c may be exposed to surroundings.

The dummy gate layer 120a, the dummy gate line 120 and the gate spacer 210 may be formed on the substrate 100 by substantially the same process(es) as described in detail with reference to FIGS. 5A to 7B, so any further descriptions for forming the dummy gate layer 120a, the dummy gate line 120 and the gate spacer 210 may be omitted.

Figure 23A:
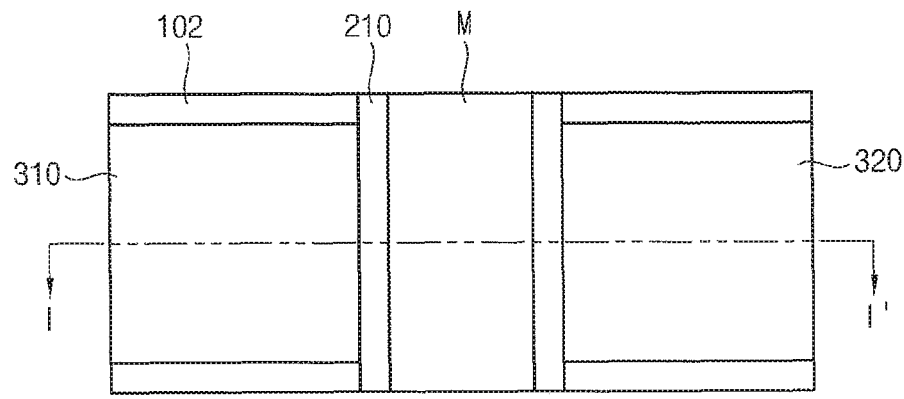
Figure 23B:
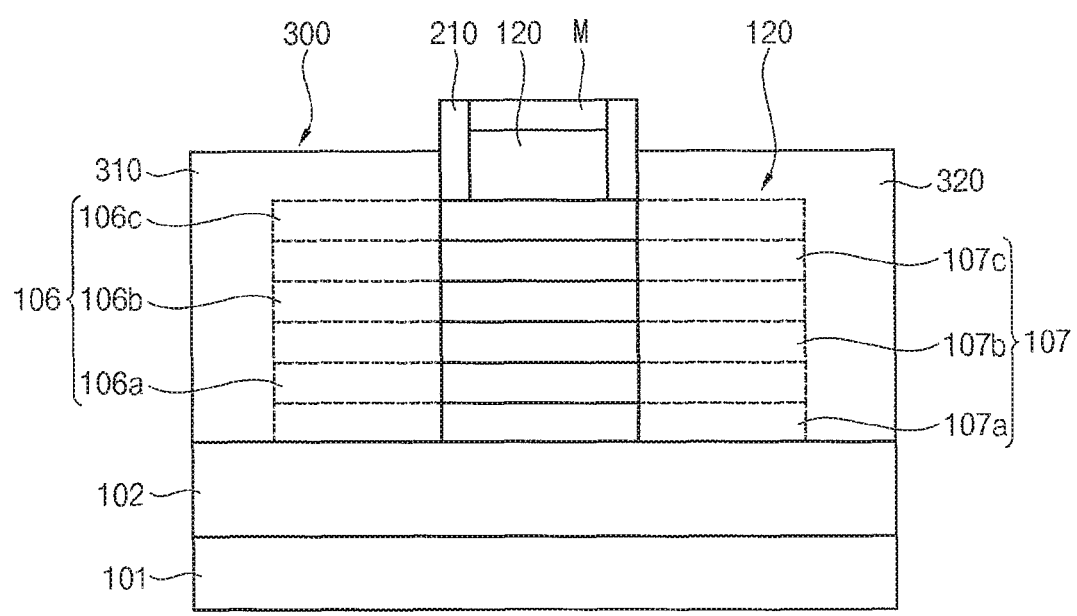
Figure 24A:
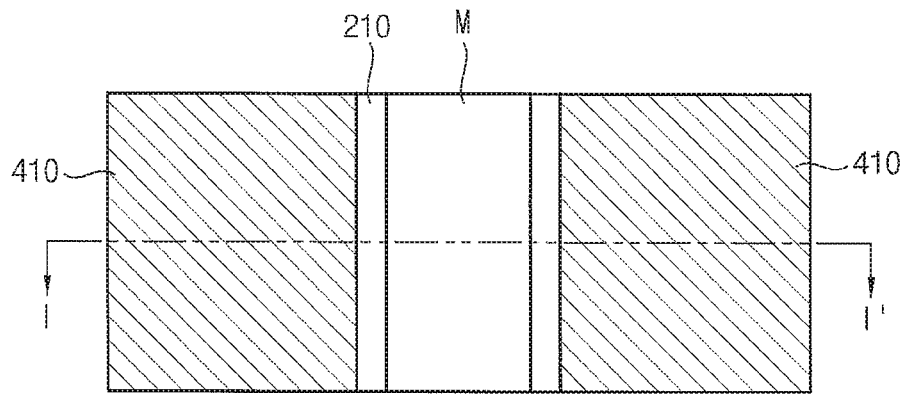
Figure 24B:
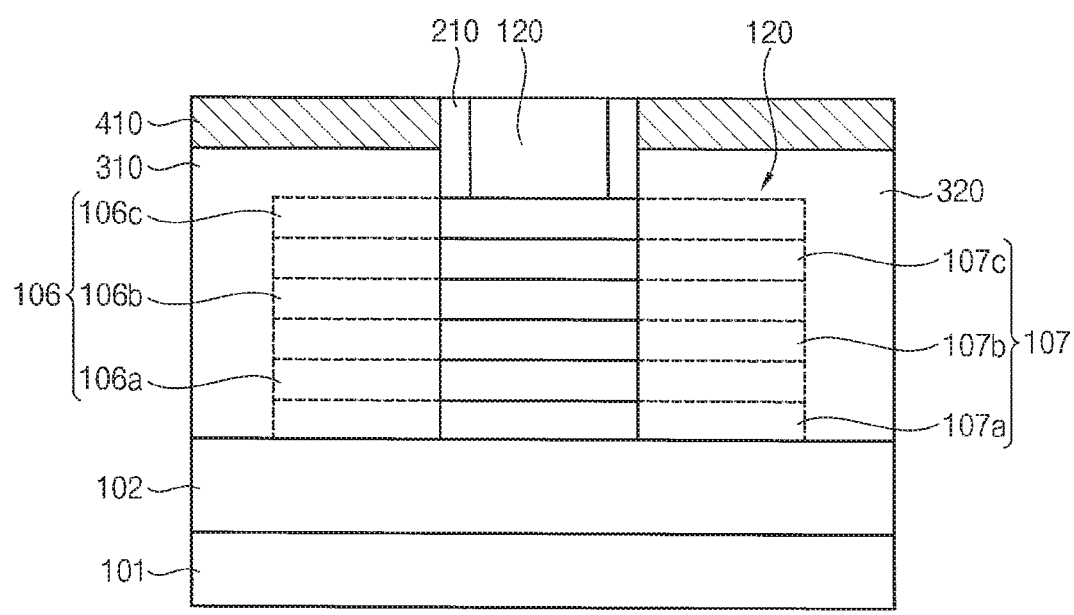
Figure 25A:
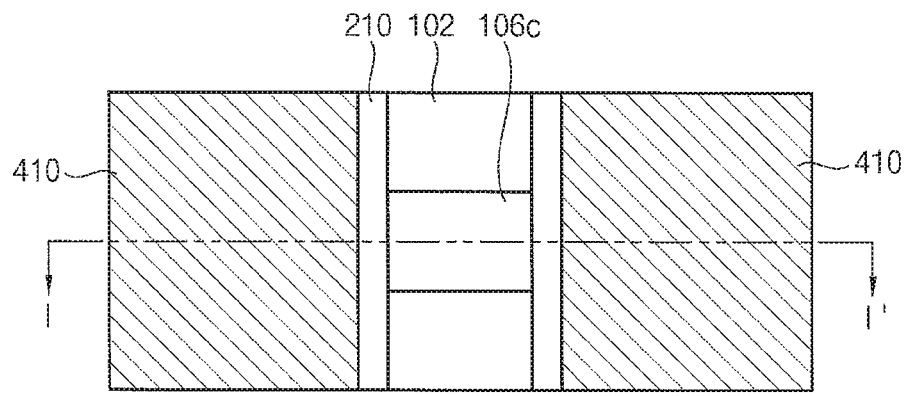
Figure 25B:
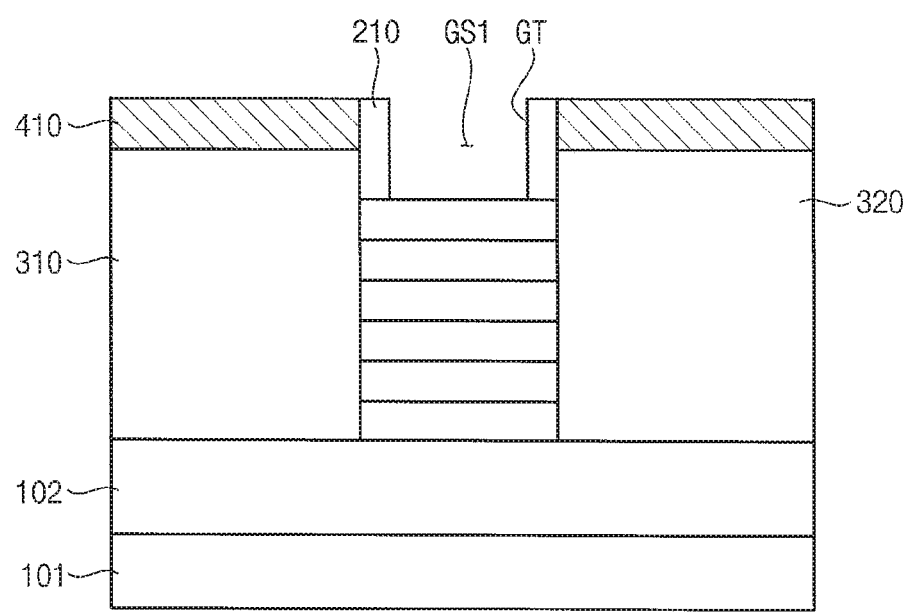

Then, the semiconductor junction 300 may be formed on the stacked active fin 112 that may be uncovered by the gate spacer 210 and the dummy gate line 120 by the same process as described with reference to FIGS. 8A and 8B. For example, a single crystalline layer may be formed on the exposed portions of the stacked active fin 112 by an epitaxial growth process using the stacked active fin as a seed layer, thereby forming a semiconductor growth layer on the stacked active fin 112 that may make contact with a side surface of the gate spacer 210. Then, a plurality of dopants may be implanted onto the semiconductor growth layer by an ion implantation process, thereby forming the semiconductor junction 300 including the source junction 310 and the drain junction 320, as illustrated in FIGS. 23A and 23B. One of p-type dopants or n-type dopants may be implanted onto the exposed portions of the stacked active fin 112.

Particularly, the semiconductor junction 300 may be formed into an elevated structure by the epitaxial growth process and the dopants may be implanted around the stacked active fin 112. Thus, the dummy gate line 120 may be separated from the semiconductor junction 300 by the gate spacer 210 and the source and drain junctions 310 and 320 may be arranged at both sides of the dummy gate line 120, respectively. The stacked active fin 112 under the dummy gate line 120 may be formed into the channel Ch through which the source and drain junctions 310 and 320 may be connected.

Referring to FIGS. 24A to 25B, the insulation interlayer pattern 410 may be formed on the semiconductor junction 300 in such a way that the gate spacer 210 and the dummy gate line 120 may be exposed through the insulation interlayer pattern 410. Then, the dummy gate line 120 may be removed from the body insulator 102 until the stacked active fin 112 may be exposed, thereby forming a gate trench GT through which the stacked active fin 112 may be exposed.

The insulation interlayer pattern 410 and the gate trench GT may be formed on the substrate 100 by substantially the same process(es) as described in detail with reference to FIGS. 9A to 10B, so any further descriptions for forming the insulation interlayer pattern 410 and the gate trench GT may be omitted.

The gate trench GT may be defined by a pair of the gate spacers 210 and the body insulator 102 and may have a first gate space GS1. The stacked active fin 112 may be exposed through the gate trench GT.

Referring to FIGS. 26A and 26B, the sacrificial pattern 106a may be partially removed from the stacked active fin 112 in the gate trench GT, thereby forming sacrificial fin residuals 290a on each of the semiconductor fins 107a to 107c and an inter-channel trench IT communicated/connected with the gate trench GT. The sacrificial fin residuals 290a may remain on end portions of each semiconductor fins 107a to 107c in a vertical line with the gate spacer 210. Thus, the inter-channel space ICS between the neighboring semiconductor fins 107a to 107c may be defined by the sacrificial fin residuals 290a to thereby form the inter-channel trench IT similarly to how the first gate space GS1 may be defined by the gate spacer 210 to thereby form the gate trench GT.

The sacrificial pattern 106 may be removed from the stacked active fin 112 by a wet etching process or a dry etching process in which the semiconductor pattern 107 may have an etching selectivity with respect to the sacrificial pattern 106.

Particularly, when the sacrificial pattern 106 may include silicon germanium (SiGe) and the semiconductor pattern 107 may include silicon (Si), the sacrificial pattern 106 may be removed by a wet etching process using an etchant in which an etching rate of silicon germanium (SiGe) may be greater than that of silicon (Si). For example, examples of the etchant for removing the sacrificial pattern may include a mixture of hydrogen peroxide ($H_2O_2$), hydrogen fluoride (HF) and acetic acid ($CH_3COOH$), a mixture of ammonium hydroxide ($NH_4OH$), hydrogen peroxide ($H_2O_2$) and de-ionized water and a mixture of peracetic acid.

In some example embodiments, the sacrificial pattern 106 may be removed from the stack active fin 112 by an anisotropic etching process using the gate spacer 210 as an etching mask, thus the sacrificial pattern 106 may be etched off along a vertical surface profile of the gate trench GT. That is, some portion of the sacrificial pattern 106 that may be overlapped by the gate spacer 210 in the third direction z may remain without being etched, to form the sacrificial fin residuals 290a. The inter-channel space ICS communicated/connected with the first gate space GS1 may be defined by the sacrificial fin residuals 290a to form the inter-channel trench IT communicated/connected with the gate trench GT.

Figure 27A:
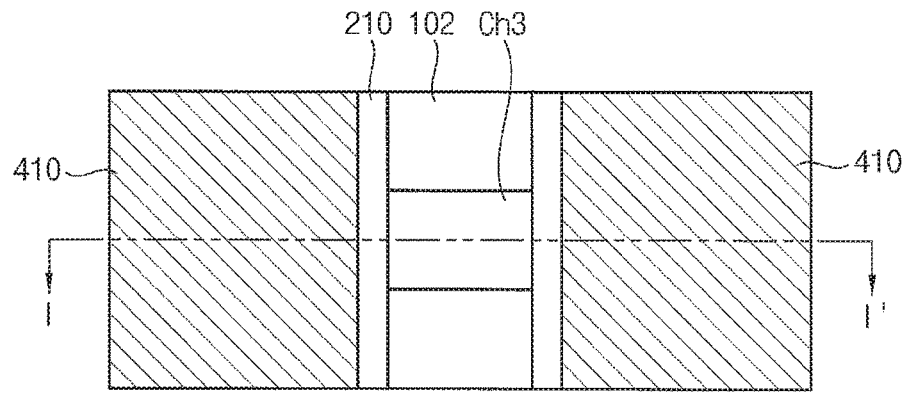
Figure 27B:
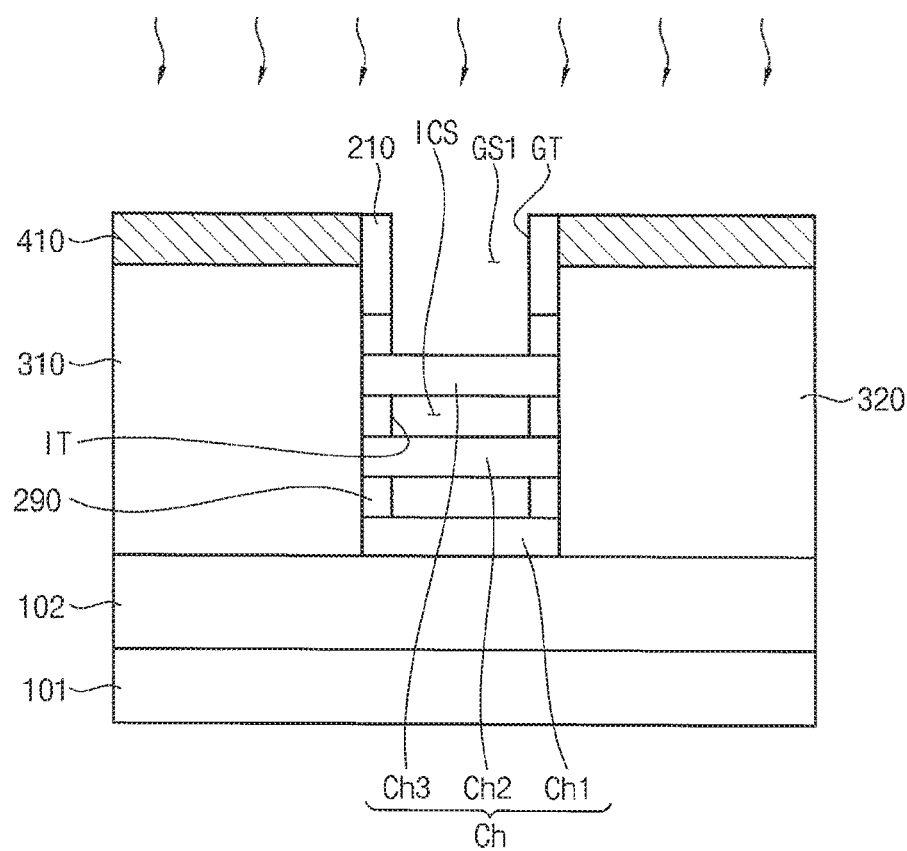

Referring to FIGS. 27A and 27B, the sacrificial fin residuals 290a may be formed into the channel spacer 290 and the semiconductor pattern 107 may be formed into the channel Ch including first to third unit channels Ch1 to Ch3.

For example, a thermal oxidation process may be performed on/to the substrate 100 having the sacrificial fin residuals 290a for a sufficient time for fully oxidizing silicon germanium (SiGe) of the sacrificial fin residuals 290a, thereby forming the channel spacer 290 that may comprise silicon germanium oxide. Since silicon germanium (SiGe) may be much more rapidly oxidized than silicon (Si), the semiconductor pattern 107 may be much less oxidized than the sacrificial fin residuals 290a in the same oxidation process and the silicon oxide layer may be formed to a sufficiently small thickness on the semiconductor pattern 107.

The semiconductor fins 107a to 107c spaced apart by the inter-channel space ICS and the channel spacer 290 may be formed into the unit channels Ch1 to Ch3 that may cross over the gate trench GT and may make contact with the semiconductor junction 300. The inter-channel space ICS may be separated from the semiconductor junction 300 by the channel spacer 290.

Figure 28A:
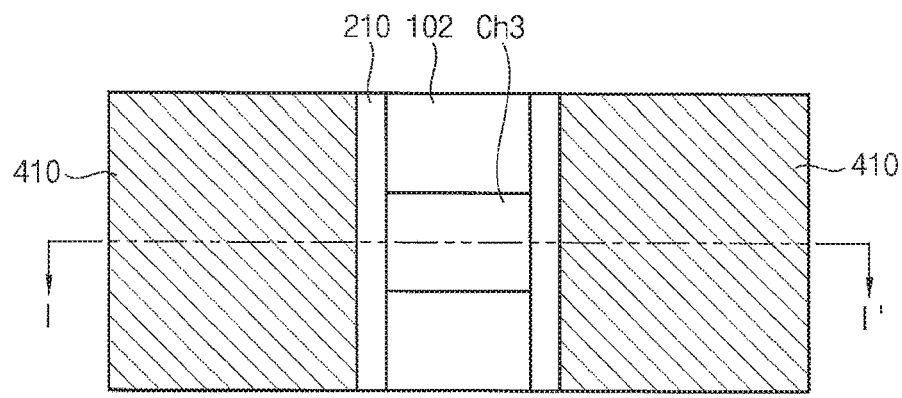
Figure 28B:
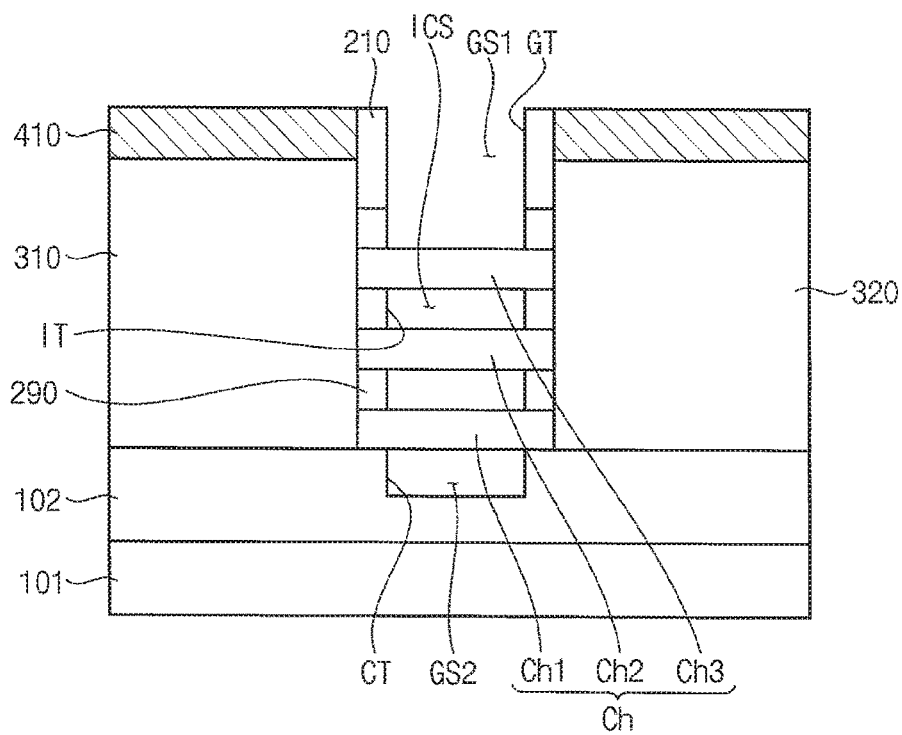

Referring to FIGS. 28A and 28B, the body insulator 102 that may be exposed through the gate trench GT and the inter-channel space ICS may be further removed from the substrate 100, thereby forming the channel trench CT that may be communicated/connected with the gate trench GT and the inter-channel trench IT.

For example, the body insulator 102 may be further etched off from the substrate 100 by an anisotropic etching process using the gate spacer 210 and the channel spacer 290 as an etching mask.

Since the semiconductor fins 107a to 107c may include single crystalline silicon and the body insulator 102 may include silicon oxide, the body insulator 102 may be much more rapidly etched off than the semiconductor fins 107a to 107c in the anisotropic etching process. Thus, the body insulator 102 under the first semiconductor fin 107a may be recessed with the same width of the gate trench GT in a shape of line extending along the second direction y, thereby forming the channel trench CT having the second gate space GS2 that may be communicated with the inter-channel space ICS the first gate space GS1. The depth of the channel trench CT may be controlled by the variation of the process conditions of the anisotropic etching process in consideration of the characteristics of the gate structure 500 and the width t of the unit channel Ch1 to Ch3. In some example embodiments, the channel trench CT may have the same depth as the width t of the unit channels Ch1 to Ch3.

Particularly, the unit channels Ch1 to Ch3 may be formed into a nano wire that may cross over the channel trench CT and traverse the gate trench GT in the first direction x and may be enclosed by the gate conductive pattern 520 in a subsequent process such as gate all-around channel (GAA).

The channel trench CT may be formed in the body insulator 102 by the same process as described in detail with reference to FIGS. 11A to 11B, so any further descriptions for forming the channel trench CT may be omitted.

In some embodiments, a bottom portion of the channel trench CT may be expanded in the first direction x and the expanded trench ET may be further formed under the channel trench CT by the same process as described in detail with reference to FIG. 11C. Thus, the expanding portion 525c of the expanded gate conductive pattern 525 in FIG. 17B may be formed by filling up the expanded trench ET with gate conductive materials.

Figure 29A:
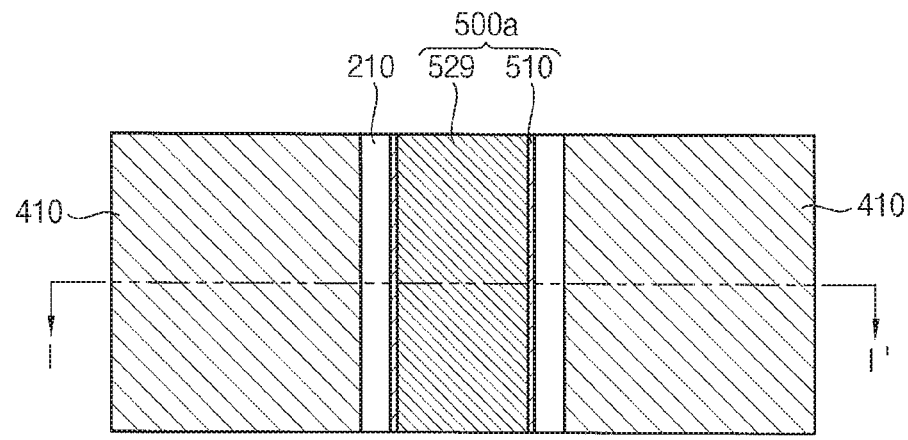
Figure 29B:
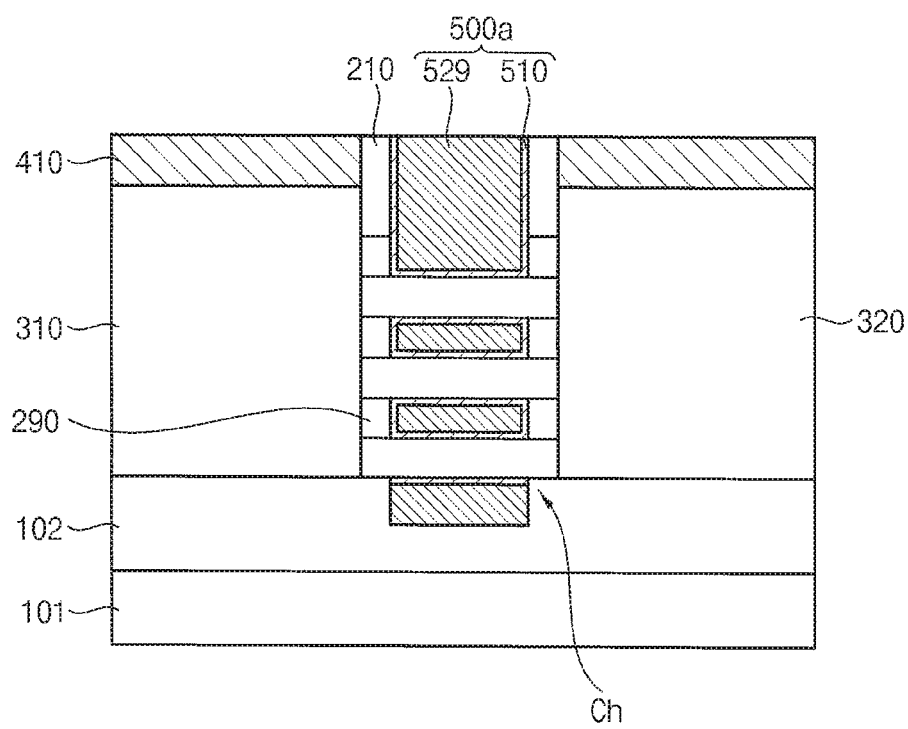

Referring to FIGS. 29A and 29B, a preliminary gate structure 500a may be formed in the gate trench GT, the inter-channel trench IT and the channel trench CT in such a way that the unit channels Ch1 to Ch3 may be individually enclosed by the preliminary gate structure 500a.

For example, the preliminary gate structure 500a may be formed by node-separating a stack layer of a gate insulation layer and a gate conductive layer at each gate trench GT by a planarization process in such a way that a gate insulation pattern 510 may be formed on a surface of the unit channels Ch1 to Ch3 and the side surfaces of the gate spacer 210 and the channel spacer 290 and then a preliminary gate conductive pattern 529 may be formed in the channel trench CT, the inter-channel trench IT and the gate trench GT. Particularly, the gate insulation layer may be formed on the body insulator 102 along a surface profile of the substrate 100 having the gate trench GT and the channel trench CT. Thus, the gate insulation layer may be formed on side surfaces of the gate trench GT and inter-channel trench IT and on upper surfaces of the insulation interlayer pattern 410 and the gate spacer 210. In such a case, the unit channels Ch1 to Ch3 may be individually enclosed and covered by the gate insulation layer. Then, the gate conductive layer may be formed on the gate insulation layer to a sufficient thickness to fill up the channel trench CT to the gate trench GT, and then the gate conductive layer and the gate insulation layer may be planarized until a top surface of the insulation interlayer pattern 410 and the gate spacer 210 may be exposed. Therefore, the gate insulation layer and the gate conductive layer may be node-separated by the gate trench GT, thereby forming the preliminary gate structure 500a having the gate insulation pattern 510 and the preliminary gate conductive pattern 529.

In some example embodiments, the body insulator 102 and the gate insulation pattern 510 may include silicon oxide and the gate spacer 210 may include silicon nitride. Thus, the gate insulation pattern 510 may be formed only on the channel Ch and the side surfaces of the gate spacer 210 and the channel spacer 290 and may not be formed on the side surfaces and the bottom of the channel trench CT.

Figure 30A:
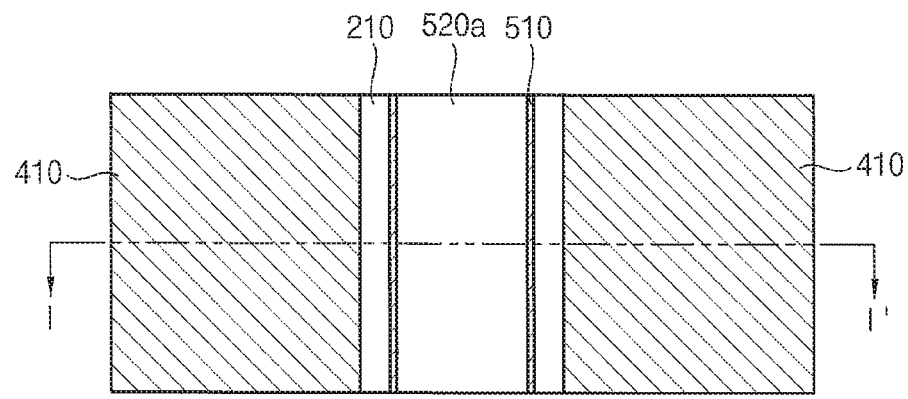
Figure 30B:
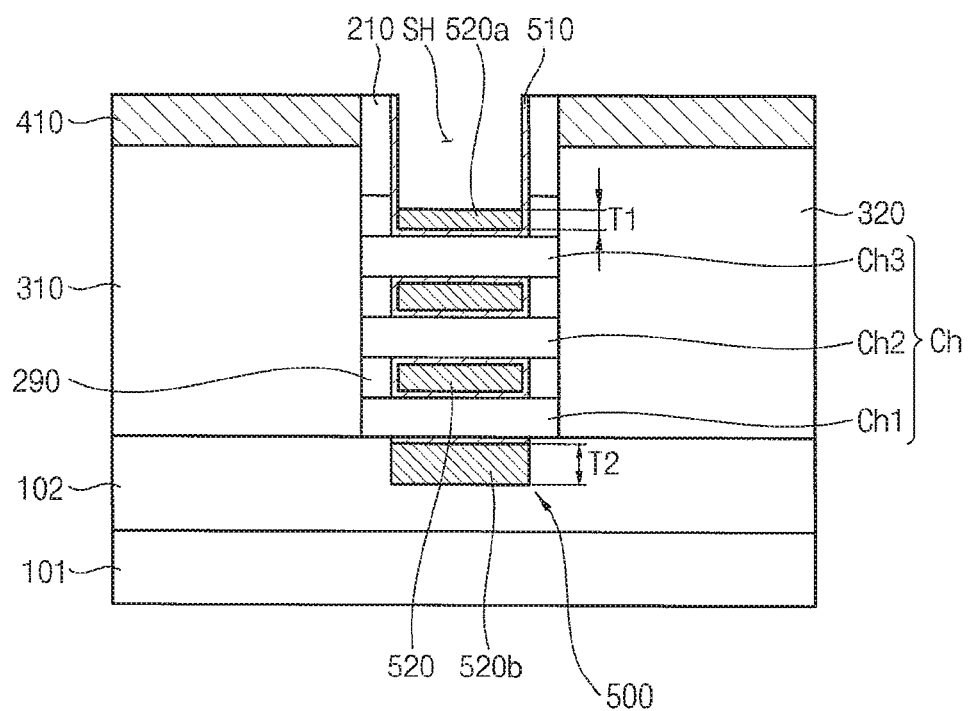

Referring to FIGS. 30A and 30B, an upper portion of the preliminary gate structure 500a may be removed from the substrate 100, thus the gate structure 500 may be formed in a lower portion of the gate trench GT, the inter-channel trench IT and the channel trench CT.

For example, the preliminary gate conductive pattern 529 may be partially etched from the substrate 100 by an etching process using the gate spacer 210 and the insulation interlayer pattern 410 as an etching mask, thus the upper portion of the preliminary gate conductive pattern 529 may be etched off from the gate trench GT. Therefore, the upper portion of the gate trench GT may be opened again and a supplementary insulation hole SH may be provided at the upper portion of the gate trench GT.

In such a case, the preliminary gate conductive pattern 529 may be etched in such a way that the uppermost unit channel Ch3 may be sufficiently covered by the residuals of the preliminary gate conductive pattern 529 while an upper surface of the residuals of the preliminary gate conductive pattern 529 may be lower than the upper surface of the semiconductor junction 300 around the uppermost unit channel Ch3.

Accordingly, the preliminary gate conductive pattern 529 may be formed into the gate conductive pattern 520 that may enclose the channel Ch and simultaneously fill up the inter-channel trench IT and the channel trench CT. Thus, the gate conductive pattern 520 may include a covering portion 520a that may be protruded from the uppermost unit channel Ch3 to a covering thickness T1 and may cover an upper portion of the uppermost unit channel Ch3 and a filling portion 520b that may fill up the channel trench CT with a filling thickness T2 and may cover a lower portion of the lowermost unit channel Ch1. The covering portion 520a and the filling portion 520b may be integrally combined with a middle portion filling the inter-channel trench IT, thereby forming the gate conductive pattern 520 by which the unit channels Ch1 to Ch3 may be individually enclosed.

Figure 31A:
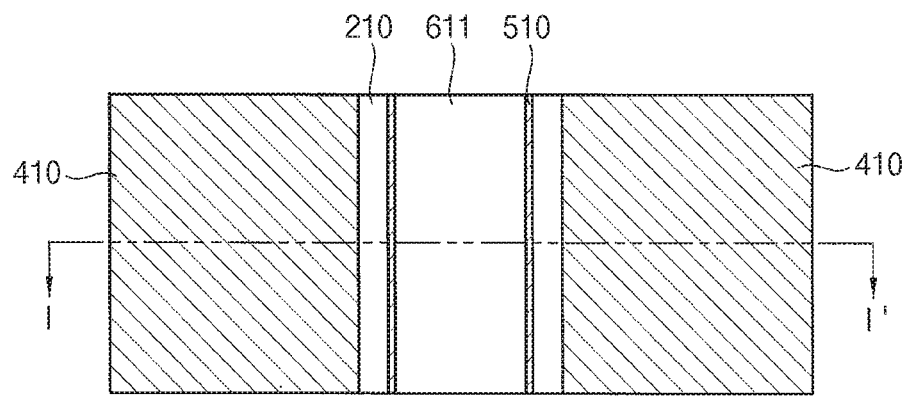
Figure 31B:
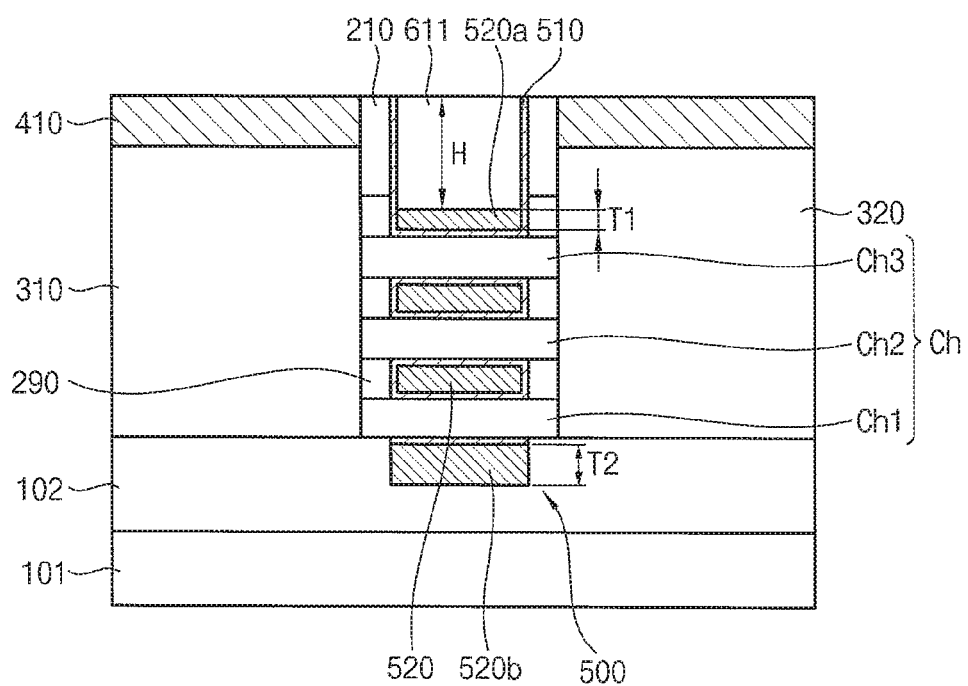

Referring to FIGS. 31A and 31B, the supplementary insulating member 611 may be formed in the supplementary insulation hole SH in such a way that an upper surface of the supplementary insulating member 611 may be coplanar with the upper surface of the insulation interlayer pattern 410. For example, the supplementary insulating layer may include any one of silicon oxide, silicon nitride, silicon oxynitride and combinations thereof. The supplementary insulating member 611 may be formed in the supplementary insulation hole SH by the same process as described in detail with reference to FIGS. 14A to 14B, so any further descriptions for forming the channel trench CT may be omitted.

Figure 32A:
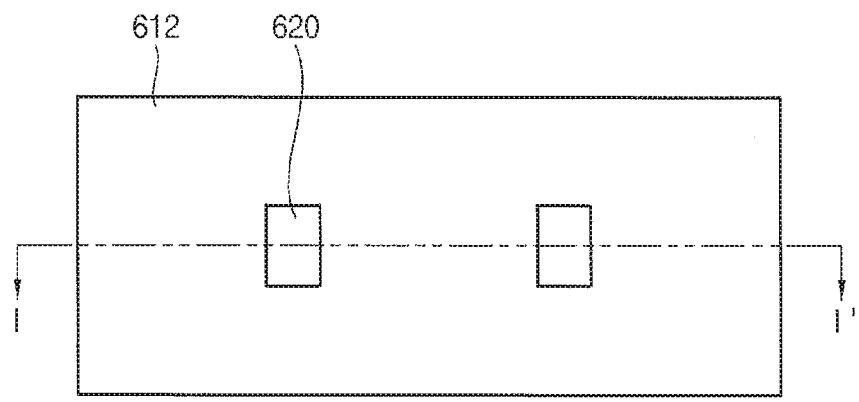
FIG. 32C is a cross-sectional view illustrating a processing operation/step for a method of enlarging the upper portion of the contact structure shown in FIG. 32B.
Figure 32B:
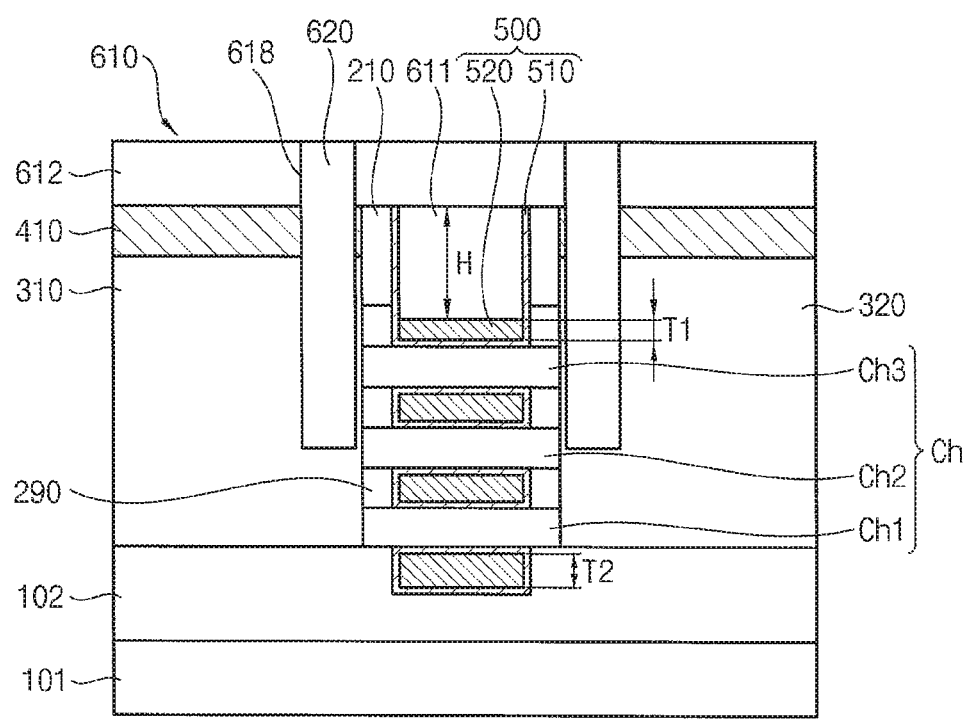

Referring to FIGS. 32A and 32B, the contact structure 620 penetrating through the insulation interlayer pattern 410 and making contact with the semiconductor junction 300 may be formed by the same process as described in detail with reference to FIGS. 15A and 15B. The contact structure 620 may include low-resistive metals such as tungsten (W), titanium (Ti), tantalum (Ta) and aluminum (Al). In some embodiments, a metal silicide layer may be further formed between the semiconductor junction 300 and the contact structure 620, thereby reducing contact resistance of the contact structure 620.

Thereafter, wiring structures connected to the contact structure 620 and other upper conductive structures may be further formed on the additional insulation layer 612 together with a passivation layer enclosing the wiring structure and the upper conductive structures, thereby manufacturing the semiconductor devices 1001.

In modified example embodiments, an upper portion of the contact structure 620 may be enlarged to thereby decrease the contact resistance thereof.

Figure 32C:
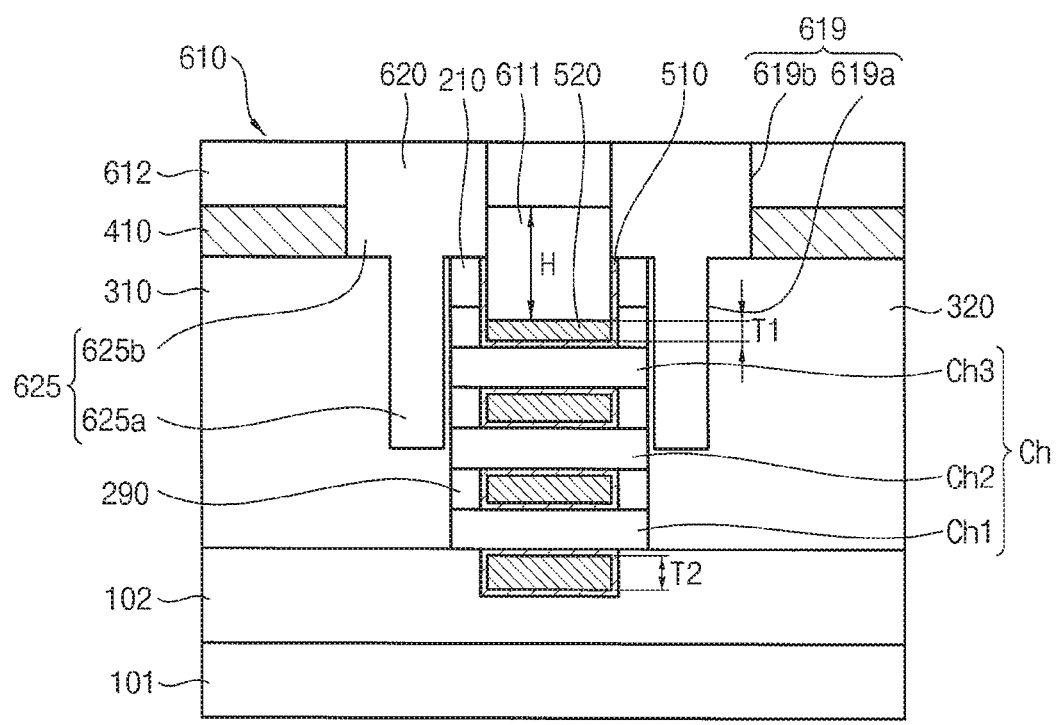

FIG. 32C is a cross-sectional view illustrating a processing step for a method of enlarging the upper portion of the contact structure shown in FIG. 32B.

Referring to FIG. 32C, an expanded contact hole 619 may be formed into the semiconductor junction 300 through the additional insulation layer 612 and the insulation interlayer pattern 410. The expanded contact hole 619 may include an upper hole 619b penetrating through the additional insulation layer 612 and the insulation interlayer pattern 410 and a lower hole 619a recessed in the semiconductor junction 300. Thereafter, conductive materials may be filled into the expanded contact hole 619 to thereby form the expanded contact structure 625 of which the upper portion may be expanded over the gate spacer 210 in the first direction x.

Thus, the expanded contact structure 625 may include a lower contact 625a that may be inserted into the semiconductor junction 300 and having the lower width $W_l$ and an upper contact 625b making contact with both of the semiconductor junction 300 and the gate spacer 210 in one body with the lower contact 625a. The upper contact 625b may have the upper width $W_u$ greater than the lower width $W_l$.

The expanded contact structure 625 may have a larger surface area than the contact structure 620, thereby reducing the contact resistance and increasing the process margin for forming the contact structure.

The expanded contact structure 625 may be formed in the expanded contact hole 619 by the same process as described in detail with reference to FIG. 15C, so any further descriptions for forming the expanded contact structure 625 may be omitted.

According to the above example embodiments of the method of manufacturing semiconductor devices, the channel trench may be formed in the body insulator and a plurality of channels may be stacked on the body insulator. The gate structure may be formed to fill up the channel trench and to enclose each of the channels. The gate structure may include the covering portion on the uppermost channel and the filling portion in the channel trench. The covering portion may have the covering thickness as small as possible on condition that the uppermost channel may be sufficiently covered with gate conductive materials and the filling portion may have a sufficient thickness for compensating for the deterioration of the electric characteristics caused by the height reduction of the gate structure.

An upper portion of the gate conductive pattern of the gate structure may be replaced with the supplementary insulating member, so that the overlap area between the contact structure and the gate structure may be reduced just between the contact structure and the protruding portion. Therefore, the parasitic capacitance may be reduced/minimized between the contact structure and the gate structure.

The above-described semiconductor devices with reference to FIGS. 1A to 32C may be used for transistors of various digital or analogue circuits. In addition, the above-described semiconductor devices may also be used as a high voltage transistor or a low voltage transistor.

For example, some example embodiments of the semiconductor devices may be utilized as high voltage transistors of peripheral circuit for the flash memory devices or EEPROM (electrically erasable and programmable read only memory) devices that may be operated by a high voltage power.

Particularly, some example embodiments of the semiconductor devices may be used for transistors for a high voltage driving integrated circuit (IC) device that may require a driving power over about 10 V. For example, the driving IC device for an LCD apparatus may require the driving power of about 20 V to about 30 V and the driving IC device for a plasma display panel (PDP) may require the driving power of about 100 V or more. The above-described semiconductor devices may be sufficiently applied to the transistor of the driving IC device for the LCD apparatus or the PDP apparatus as well as a mobile display apparatus.

Figure 33:
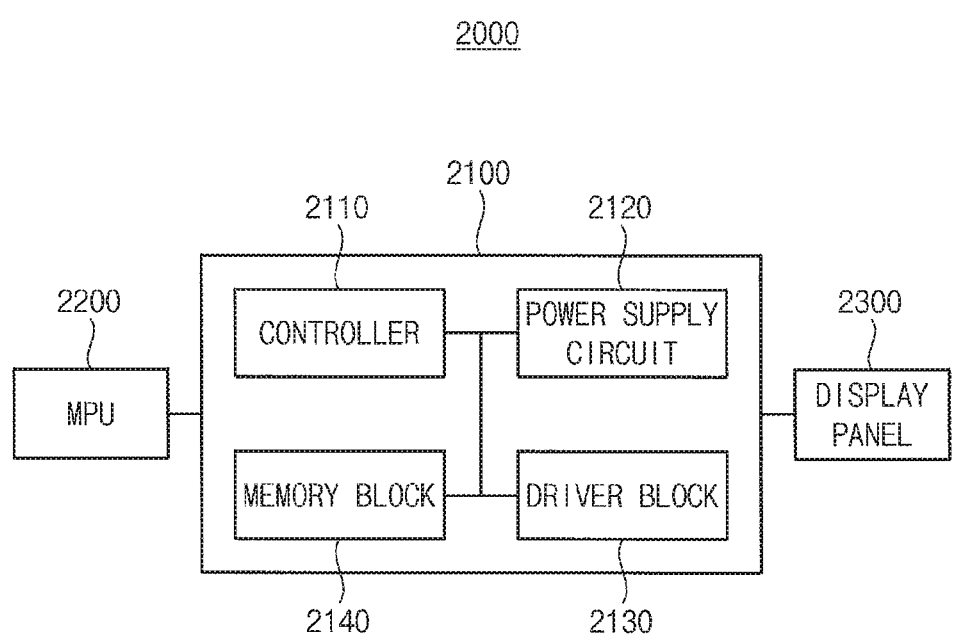
FIG. 33 is a schematic block diagram illustrating a display apparatus including the semiconductor devices in accordance with example embodiments of present inventive concepts.

FIG. 33 is a schematic block diagram illustrating a display apparatus including the semiconductor devices in accordance with some example embodiments of present inventive concepts.

Referring to FIG. 33, the display apparatus 2000 may include a display drive IC (DDI) device 2100, a main processing unit (MPU) 2200 connected to the DDI device 2100 and processing image signals and a display panel 2300 driven by the DDI device 2100 and displaying images in response to the image signals.

The DDI device 2100 may include a controller 2110, a power supply circuit 2120, a driver block 2130 and a memory block 2140.

The controller 2110 may decode the instructions transferred from the MPU 2200 and may control each operation block of the DDI device 2100 in response to the instructions. The power supply circuit 2120 may generate a driving power in response to a control signal of the controller 2110. The driver block 2130 may drive the display panel 2300 to operate by using the driving power. The display panel 2300 may include a flat panel such as an LCD panel and a PDP panel as well as a mobile display panel.

The memory block 2140 may temporarily store the instructions that may be applied to the controller 2110, the control signals that may be generated from the controller 2110 and various processing data for operating the display apparatus 2000. Thus, the memory block 2140 may include a plurality of random access memory (RAM) devices and/or read only memory (ROM) devices.

Particularly, the power supply circuit 2120, the driver block 2130 and the memory block 2140 may include a plurality of the semiconductor devices exemplarily described in detail with reference to FIGS. 1 to 32C.

The size of the DDI device 2100 may be reduced and the occupancy area of the power supply circuit 2120, the driver block 2130 and the memory block 2140 may decrease in accordance with the recent technical trends of small size and thickness of the display apparatus 2000, so that the line widths of the semiconductor devices in each of the power supply circuit 2120, the driver block 2130 and the memory block 2140 may be extremely small. However, the parasitic capacitance between the contact structure and the gate structure may be sufficiently reduced/prevented in spite of the size reduction of the semiconductor devices in the DDI device 2100. Therefore, the DDI device 2100 may be operated with high reliability in spite of small occupancy area and small size.

In addition, the expansion of the upper portion of the contact structure and the lower portion of the gate structure may increase the surface area of the contact structure and the gate structure to thereby decrease the electrical resistance at the contact structure and the gate structure of the semiconductor device in the DDI device 2100.

Figure 34:
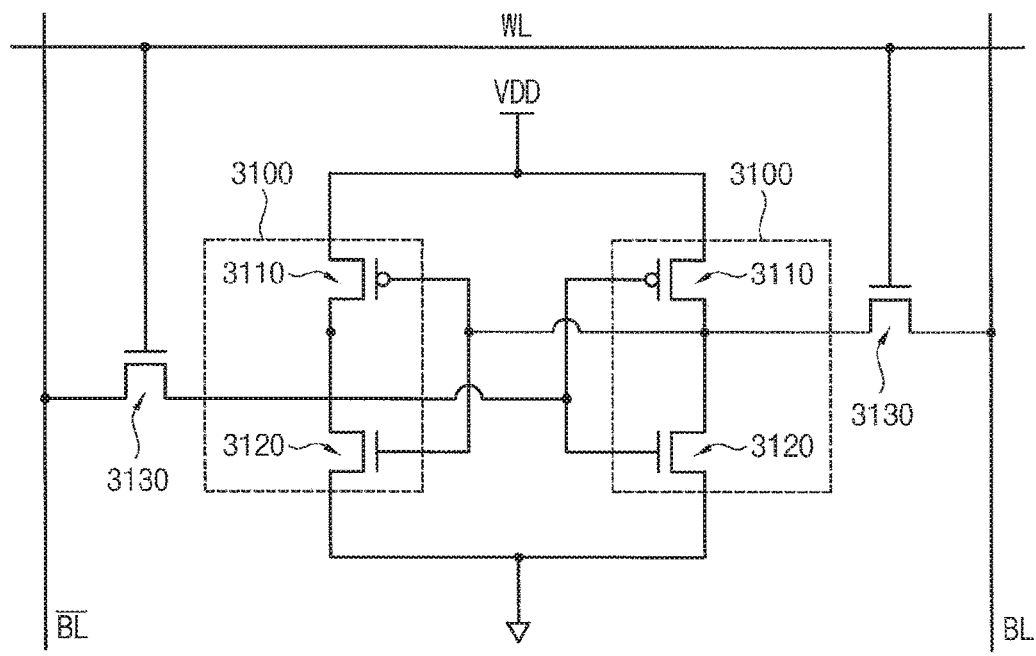
FIG. 34 is a circuit diagram illustrating a CMOS SRAM including the semiconductor devices in accordance with example embodiments of present inventive concepts.

FIG. 34 is a circuit diagram illustrating a CMOS SRAM including the semiconductor devices in accordance with some example embodiments of present inventive concepts.

Referring to FIG. 34, the CMOS SRAM device 3000 may include a pair of driving transistors 3100. Each of the driving transistors 3100 may include a PMOS transistor 3110 connected to a power terminal Vdd, an NMOS transistor 3120 connected to a ground terminal and a transfer transistor 3130. The source electrode of the transfer transistor 3130 may be connected to a common node of the PMOS transistor 3110 and the NMOS transistor 3120. The power terminal Vdd may be connected to the source electrode of the PMOS transistor 3110 and the ground terminal may be connected to the source electrode of the NMOS transistor 3120. A word line WL may be connected to a gate electrode of the transfer transistor 3130. A bit line BL may be connected to a drain electrode of one of the pair of the transfer transistor 3130 and a complementary bit line BL may be connected to a drain electrode of the other transfer transistor 3130.

The example embodiments of the semiconductor devices described with reference to FIGS. 1A to 32C may be applied to at least one of the PMOS transistor 3110, the NMOS transistor 3120 and the transfer transistor 3130. Thus, although the CMOS SRAM device 3000 may be downsized and as a result, the semiconductor devices in the PMOS transistor 3110, NMOS transistor 3120 and the transfer transistor 3130 may have small line widths and occupancy areas, the parasitic capacitance between the contact structure and the gate structure may be sufficiently reduced/prevented/minimized, thereby increasing the operation reliability and stability of the CMOS SRAM 3000 together with high integration degree.

Figure 35:
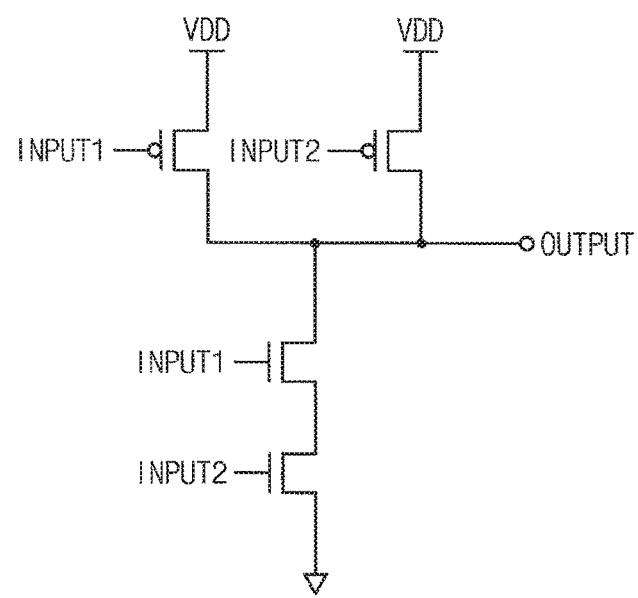
FIG. 35 is a circuit diagram illustrating a CMOS NAND device including the semiconductor devices in accordance with example embodiments of present inventive concepts.

FIG. 35 is a circuit diagram illustrating a CMOS NAND device including the semiconductor devices in accordance with some example embodiments of present inventive concepts.

Referring to FIG. 35, the CMOS NAND device 4000 may include a pair of CMOS transistors to which different signals may be applied. The PMOS transistor and the NMOS transistor of the CMOS transistor may include the example embodiments of the semiconductor devices described with reference to FIGS. 1A to 32C.

Thus, the CMOS NAND device 4000 may be sufficiently downsized without any increase of the parasitic capacitance between the contact structure and the gate structure, thereby increasing the memory capacity of the CMOS NAND device 4000 without deterioration of operation reliability.

Figure 36:
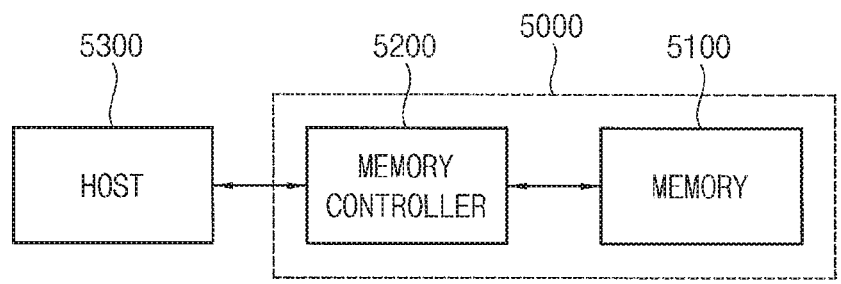
FIG. 36 is a block diagram illustrating a memory apparatus including the semiconductor devices in accordance with some example embodiments of present inventive concepts.

FIG. 36 is a block diagram illustrating a memory apparatus including the semiconductor devices in accordance with some example embodiments of present inventive concepts.

Referring to FIG. 36, the memory apparatus 5000 may include a memory unit 5100 and a memory controller 5200 controlling the operation of the memory unit 5100. The memory controller 5200 may control data reading from the memory unit 5100 and/or data storing to the memory unit 5100 in response to a host signal from a host 5300.

The memory unit 5100 and the memory controller 5200 may include example embodiments of the semiconductor devices described in detail with reference to FIGS. 1A to 32C.

Thus, the parasitic capacitance between the contact structure and the gate structure may be sufficiently reduced/prevented/minimized when the semiconductor device may be downsized and thus the line width of the semiconductor device may decrease. Therefore, the memory apparatus 5000 may be downsized with high memory capacity without any deterioration of the operational reliability.

Figure 37:
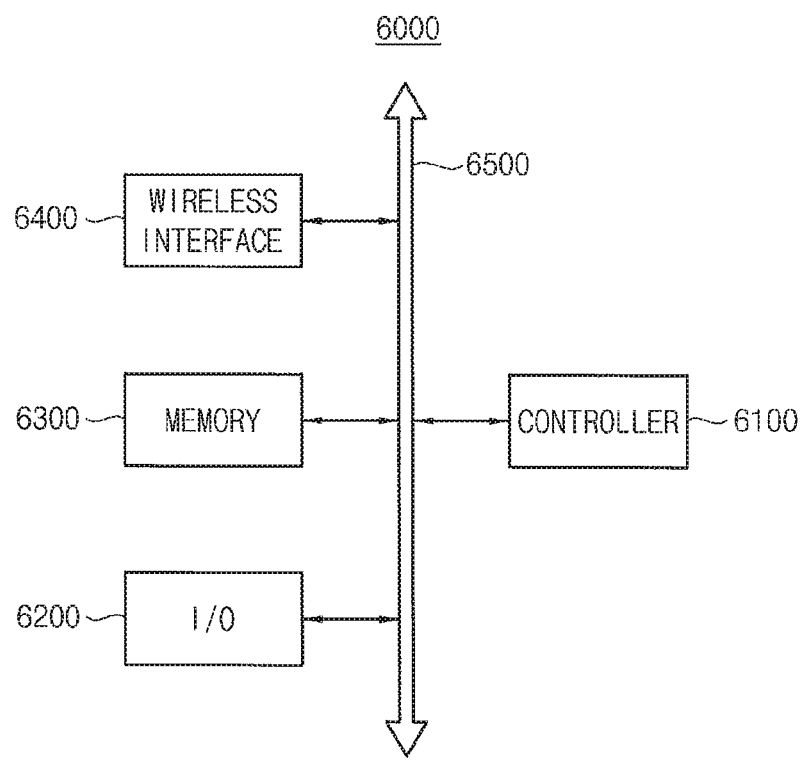
FIG. 37 is a block diagram illustrating an electronic system having the semiconductor devices in accordance with example embodiments of present inventive concepts.

FIG. 37 is a block diagram illustrating an electronic system having the semiconductor devices in accordance with some example embodiments of present inventive concepts.

Referring to FIG. 37, the electronic system 6000 may include a controller 6100, an input/output (I/O) unit 6200, a memory unit 6300 and a wireless interface 6400 that may be electrically interconnected with one another via a bus line 6500.

The controller 6100 may include any one of a microprocessor, a digital signal processor and the like. The I/O unit 6200 may include a keypad, a keyboard and a display device.

The memory unit 6300 may store the instructions executed by the controller 6100 and the user data processed by the controller 6100.

The electronic system 6000 may transfer and receive data in a wireless communication network by using the wireless interface 6400. The wireless interface 6400 may include an antenna and/or wireless transceiver.

The electronic system 6000 may include a wireless communication system or a wireless data communicator having a third generation communication interface protocol such as a code division multiple access (CDMA), a global system for mobile communications (GSM), a North America digital cellular communications (NADC), an extended-time division multiple access (E-TDMA) and a wide band code division multiple access (WCDMA).

The electronic system 6000 may include example embodiments of the semiconductor devices described with reference to FIGS. 1A to 32C. Thus, the parasitic capacitance may be reduced/impeded between the contact structure and the gate structure of each semiconductor device in at least one of the controller 6100, the input/output (I/O) unit 6200, the memory unit 6300 and the wireless interface 6400, thereby downsizing the electronic system 6000 without any deterioration of the operational reliability.

According to the example embodiments of the semiconductor devices and the method of manufacturing thereof, the channel trench may be formed in the body insulator of the substrate and the channel may be arranged or stacked on the body insulator across the channel trench. The gate structure may fill up the channel trench and enclose the channel in such a configuration that an upper surface of the gate structure may be lower than an upper surface of the gate spacer and may be close to the channel. Thus, the gate structure may include a covering portion protruding from the channel and a filling portion recessed into the channel trench. The covering portion may have the covering thickness smaller than the filling thickness of the filling portion. The upper portion of the gate structure may be replaced with the supplementary insulating member in the gate trench.

Therefore, the overlap area of the contact structure and the gate structure may decrease while increasing the overlap area of the contact structure and the supplementary insulating member, thus the overlap area between the contact structure and the gate structure may be limited to being between the contact structure and the covering portion and the parasitic capacitance may be sufficiently reduced/minimized between the contact structure and the gate structure. Particularly, the parasitic capacitance between the contact structure and the gate structure may be sufficiently reduced/prevented even when the gate spacer may become narrow due to the size reduction of the semiconductor device.

In addition, the upper portion of the contact structure and the lower portion of the gate structure may be horizontally expanded and thus the surface area of the contact structure and the gate structure may increase. Thus, the electrical resistance of the contact structure and the gate structure may be stable and reliable in spite of the size reduction of the semiconductor device.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a semiconductor substrate comprising a base body and a body insulator on the base body, the body insulator extending in a first direction and comprising a channel trench that extends in a second direction;
   a semiconductor junction on the body insulator around the channel trench;
   a channel connected with the semiconductor junction across the channel trench in the first direction;
   a gate structure that is above and below the channel, the gate structure comprising a first portion, comprising a first thickness, on the channel and a second portion, comprising a second thickness thicker than the first thickness, that is in the channel trench; and
   a gate spacer between the first portion of the gate structure and the semiconductor junction such that an upper surface of the first portion of the gate structure is lower than an upper surface of the gate spacer.

2. The semiconductor device of claim 1, wherein the semiconductor substrate comprises a silicon-on-insulator (SOI) substrate comprising:
the base body;
the body insulator; and
a semiconductor layer on the body insulator such that the channel trench extends between the semiconductor layer and the base body.

3. The semiconductor device of claim 2, wherein the channel comprises a single nanowire contacting the semiconductor junction across the channel trench in the first direction such that end portions of the channel are on the body insulator at respective sides of the channel trench.

4. The semiconductor device of claim 3,
wherein the gate spacer comprises one among a pair of gate spacers, and
wherein the semiconductor device further comprises:
an insulating member on the gate structure between the pair of gate spacers such that an upper surface of the insulating member is coplanar with the upper surface of the gate spacer; and
a contact structure contacting the semiconductor junction adjacent the gate spacer,
wherein the gate spacer extends upward from one of the end portions of the channel.

5. The semiconductor device of claim 4, wherein a lower surface of contact structure is lower than a lower surface of the first portion of the gate structure and higher than an upper surface of the second portion of the gate structure.

6. The semiconductor device of claim 4, further comprising an insulation interlayer on the semiconductor junction such that an upper surface of the contact structure, the upper surface of the gate spacer, and the upper surface of the insulating member are coplanar with an upper surface of the insulation interlayer.

7. The semiconductor device of claim 4, wherein the contact structure comprises:
a lower contact comprising a first width in the semiconductor junction; and
an upper contact connected to the lower contact in one body and comprising a second width that is wider than the first width such that the upper contact extends to contact the gate spacer.

8. The semiconductor device of claim 7, wherein the gate structure further comprises:
a third portion that is connected to the second portion of the gate structure and extends in the first direction, so that a third width of the third portion of the gate structure is wider than a fourth width of the second portion of the gate structure.

9. The semiconductor device of claim 2, wherein the channel comprises a plurality of unit channels vertically spaced apart by a same gap distance and contacting the semiconductor junction in the first direction such that opposite end portions of a lowermost one of the plurality of unit channels are on the body insulator, the second portion of the gate structure is between the lowermost one of the plurality of unit channels and the base body, and the first portion of the gate structure is on an uppermost one of the plurality of unit channels.

10. The semiconductor device of claim 9,
wherein the gate spacer comprises one among a pair of gate spacers, and
wherein the semiconductor device further comprises:
a channel spacer between a pair of neighboring ones of the plurality of unit channels and between the gate structure and the semiconductor junction;
an insulating member on the gate structure between the pair of gate spacers such that an upper surface of the insulating member is coplanar with the upper surface of the gate spacer; and
a contact structure that contacts the semiconductor junction adjacent the gate spacer,
wherein the gate spacer extends upward from an end portion of the uppermost one of the plurality of unit channels.

11. The semiconductor device of claim 10, wherein the channel spacer comprises a same width as the gate spacer such that the gate spacer vertically overlaps the channel spacer and a side surface of the channel spacer is vertically aligned with a side surface of the gate spacer.

12. The semiconductor device of claim 10, wherein the contact structure comprises:
a first contact comprising a first width in the semiconductor junction; and
a second contact connected to the first contact in one body and comprising a second width that is wider than the first width such that the second contact extends to contact the gate spacer.

13. The semiconductor device of claim 12, wherein the gate structure further comprises a third portion between the second portion and the base body, the third portion of the gate structure extending in the first direction such that a third width of the third portion of the gate structure is wider than a fourth width of the second portion of the gate structure.

14. The semiconductor device of claim 1, further comprising a contact structure in the semiconductor junction,
wherein the semiconductor junction comprises a source/drain region on a sidewall of the contact structure.

15. The semiconductor device of claim 1,
wherein the gate spacer comprises one among a pair of gate spacers, and
wherein the semiconductor device further comprises:
an insulating member on the upper surface of the first portion of the gate structure, between the pair of gate spacers.

16. The semiconductor device of claim 15, wherein the insulating member is equal in width, in the first direction, to the upper surface of the first portion of the gate structure.

17. A semiconductor device comprising:
a substrate;
a semiconductor region comprising a source region and a drain region on the substrate;
a channel between the source region and the drain region;
a gate structure comprising:
a first portion comprising a first thickness above the channel; and
a second portion comprising a second thickness that is thicker than the first thickness and is below the channel;
a gate spacer between the first portion of the gate structure and the semiconductor region,
wherein an upper surface of the first portion of the gate structure is lower than an upper surface of the gate spacer; and
a contact structure in the semiconductor region, wherein the source region or the drain region is on a sidewall of the contact structure.

18. The semiconductor device of claim 17,
wherein the substrate comprises a base and an insulator on the base, wherein the second portion of the gate structure is in a trench in the insulator, and wherein an upper surface of the contact structure is coplanar with the upper surface of the gate spacer.

19. A semiconductor device comprising:
a substrate comprising a base and an insulator on the base;
a semiconductor region comprising a source region and a drain region on the substrate;
a channel between the source region and the drain region;
a gate structure comprising:
   a first portion comprising a first thickness above the channel; and
   a second portion in a trench in the insulator and comprising a second thickness that is thicker than the first thickness and is below the channel;
a gate spacer between the first portion of the gate structure and the semiconductor region,
wherein an upper surface of the first portion of the gate structure is lower than an upper surface of the gate spacer, and
wherein the gate spacer comprises one among a pair of gate spacers; and
an insulating region on the upper surface of the first portion of the gate structure, between the pair of gate spacers.

20. The semiconductor device of claim 19, wherein the insulating region is equal in width, in a direction in which the source region and the drain region are spaced apart from each other, to the upper surface of the first portion of the gate structure.

* * * * *